United States Patent
Takada et al.

(10) Patent No.: US 10,551,739 B2
(45) Date of Patent: Feb. 4, 2020

(54) RESIST COMPOSITION, AND RESIST FILM, PATTERN FORMING METHOD, AND METHOD FOR MANUFACTURING ELECTRONIC DEVICE, EACH USING RESIST COMPOSITION

(71) Applicant: FUJIFILM Corporation, Tokyo (JP)

(72) Inventors: Akira Takada, Shizuoka (JP); Shuji Hirano, Shizuoka (JP); Naoya Shimoju, Shizuoka (JP); Toshiya Takahashi, Shizuoka (JP); Hidehiro Mochizuki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/925,779

(22) Filed: Mar. 20, 2018

(65) Prior Publication Data

US 2018/0210339 A1 Jul. 26, 2018

Related U.S. Application Data

(63) Continuation of application No. PCT/JP2016/076676, filed on Sep. 9, 2016.

(30) Foreign Application Priority Data

Sep. 30, 2015 (JP) .................... 2015-194447

(51) Int. Cl.
| | |
|---|---|
| G03F 7/075 | (2006.01) |
| G03F 7/038 | (2006.01) |
| G03F 7/039 | (2006.01) |
| G03F 7/16 | (2006.01) |
| G03F 7/20 | (2006.01) |
| G03F 7/32 | (2006.01) |
| G03F 7/38 | (2006.01) |
| G03F 7/40 | (2006.01) |

(52) U.S. Cl.
CPC .......... *G03F 7/0758* (2013.01); *G03F 7/038* (2013.01); *G03F 7/039* (2013.01); *G03F 7/162* (2013.01); *G03F 7/168* (2013.01); *G03F 7/2004* (2013.01); *G03F 7/2037* (2013.01); *G03F 7/322* (2013.01); *G03F 7/325* (2013.01); *G03F 7/38* (2013.01); *G03F 7/40* (2013.01)

(58) Field of Classification Search
CPC ........ G03F 7/0397; G03F 7/38; G03F 7/2004; G03F 7/40; G03F 7/168; G03F 7/2037; G03F 7/325; G03F 7/162; G03F 7/322; G03F 7/039; G03F 7/038; G03F 7/0758
See application file for complete search history.

(56) References Cited

U.S. PATENT DOCUMENTS

| | | |
|---|---|---|
| 2004/0034160 A1 | 2/2004 | Malik et al. |
| 2004/0106064 A1 | 6/2004 | Choi |
| 2004/0137362 A1 | 7/2004 | De et al. |
| 2004/0241574 A1* | 12/2004 | Dai et al. .................. C08F 8/42 430/270.1 |
| 2006/0088787 A1 | 4/2006 | Gonsalves et al. |
| 2006/0210929 A1 | 9/2006 | Yamada |
| 2014/0212819 A1 | 7/2014 | Wuister et al. |
| 2016/0147154 A1 | 5/2016 | Takizawa et al. |

FOREIGN PATENT DOCUMENTS

| | | |
|---|---|---|
| JP | 2001114835 | 4/2001 |
| JP | 2003076023 | 3/2003 |
| JP | 2005527673 | 9/2005 |
| JP | 2006504827 | 2/2006 |
| JP | 2006293326 | 10/2006 |
| JP | 2008209739 | 9/2008 |
| JP | 2014521111 | 8/2014 |
| JP | 2015025879 | 2/2015 |
| JP | 2016069400 | 5/2016 |
| KR | 20040042916 | 5/2004 |
| WO | 2015015974 | 2/2015 |

OTHER PUBLICATIONS

English translation of JP 2003-76023 a, (year 2003)machine generated on May 20, 2019 Obtained From Simple Search on https://www.jplatpat.inpit.go.jp/ May 20, 2019, 44 pages. (Year: 2003).*
English translation of JP 2008209739 a (year 2008) machine generated on May 20, 2019 obtained from espace net website, 48 pages. (Year: 2008).*
English translation of JP 200114835 a (year 2001) machine generated on May 20, 2019 obtained from espace net website, 26 pages. (Year: 2001).*
"International Search Report (Form PCT/ISA/210) of PCT/JP2016/076676," dated Dec. 13, 2016, with English translation thereof, pp. 1-7.
"Written Opinion of the International Searching Authority (Form PCT/ISA/237) of PCT/JP2016/076676," dated Dec. 13, 2016, with English translation thereof, pp. 1-14.
"Office Action of Japan Counterpart Application," dated Jul. 10, 2018, with English translation thereof, p. 1-p. 11.
Office Action of Korea Counterpart Application, with English translation thereof, dated Sep. 19, 2019, pp. 1-12.

* cited by examiner

*Primary Examiner* — Cynthia Hamilton

(74) *Attorney, Agent, or Firm* — JCIPRNET

(57) ABSTRACT

Provided are a resist composition capable of forming a pattern having excellent pattern collapse performance, particularly in the formation of an ultrafine pattern (for example, a pattern with a line width 50 nm or less) using the resist composition containing a resin (A) having a repeating unit (a) having an aromatic ring group and a repeating unit (b) having a silicon atom in a side chain, as well as a resist film, a pattern forming method, and a method for manufacturing an electronic device, each using the resist composition.

10 Claims, No Drawings

RESIST COMPOSITION, AND RESIST FILM, PATTERN FORMING METHOD, AND METHOD FOR MANUFACTURING ELECTRONIC DEVICE, EACH USING RESIST COMPOSITION

CROSS REFERENCE TO RELATED APPLICATIONS

This is a continuation of International Application No. PCT/JP2016/076676 filed on Sep. 9, 2016, and claims priority from Japanese Patent Application No. 2015-194447 filed on Sep. 30, 2015, the entire disclosures of which are incorporated herein by reference.

BACKGROUND OF THE INVENTION

1. Field of the Invention

The present invention relates to a resist composition as well as a resist film, a pattern forming method, and a method for manufacturing an electronic device, each using the resist composition.

More specifically, the present invention relates to a resist composition which is used for a process for manufacturing a semiconductor such as an IC, the manufacture of a circuit board for a liquid crystal, a thermal head, or the like, and other lithographic processes for photofabrication, as well as a resist film, a pattern forming method, and a method for manufacturing an electronic device, each using the resist composition.

2. Description of the Related Art

In processes for manufacturing semiconductor devices such as an integrated circuit (IC) and a large scale integrated circuit (LSI) in the related art, microfabrication by lithography using a photoresist composition has been carried out.

Formation of an ultrafine pattern in a submicron region or quarter-micron region has been demanded in accordance with the realization of high integration for integrated circuits. With such a demand, a trend of wavelength shortening in the exposure wavelength from g-rays to i-rays, further to an excimer laser light (KrF, ArF) is seen. Further, developments in lithography using an electron beam, X-rays, extreme ultraviolet rays (EUV light), or the like other than an excimer laser light has recently been progressing.

For example, as a resist composition which is preferable for ArF or KrF exposure, a positive tone resist composition is known which has a specific structure including a silicon atom in a side chain, and contains a polymer which is insoluble or poorly soluble in an alkali and becomes soluble in an aqueous alkali solution by the action of an acid, and a compound capable of generating an acid upon irradiation with actinic rays or radiation (see JP2003-76023A).

SUMMARY OF THE INVENTION

However, as further high functions for various types of electronic equipment have recently been demanded, it is further required to manufacture finer wires, and correspondingly, it is required to further improve the resolution of a resist pattern or improve etching resistance.

Here, one of factors influencing the resolution in fine patterns is collapse of a pattern, and it becomes important to further improve the resolution by solving this problem.

Therefore, an object of the present invention is to provide a resist composition capable of forming a pattern having excellent pattern collapse performance, particularly in the formation of an ultrafine pattern (for example, a pattern with a line width of 50 nm or less), as well as a resist film, a pattern forming method, and a method for manufacturing an electronic device, each using the resist composition.

The present inventors have conducted extensive studies, and as a result, they have found that the object is accomplished with a resist composition containing a high molecular compound having a specific structure.

That is, the present invention is as follows.

[1] A resist composition comprising:
a resin (A) having a repeating unit (a) having an aromatic ring group and a repeating unit (b) having a silicon atom in a side chain.

[2] The resist composition as described in [1], in which the repeating unit (b) is a repeating unit not having a structure in which a polar group is protected with a leaving group capable of decomposing by the action of an acid to leave.

[3] The resist composition as described in [1] or [2], in which the repeating unit (b) is a repeating unit having a group containing a silsesquioxane structure.

[4] The resist composition as described in any one of [1] to [3], in which the resin (A) has a repeating unit (c) having a structure in which a polar group is protected with a leaving group capable of decomposing by the action of an acid to leave.

[5] The resist composition as described in [4], in which the repeating unit (c) is a repeating unit represented by General Formula (AI) or (AII).

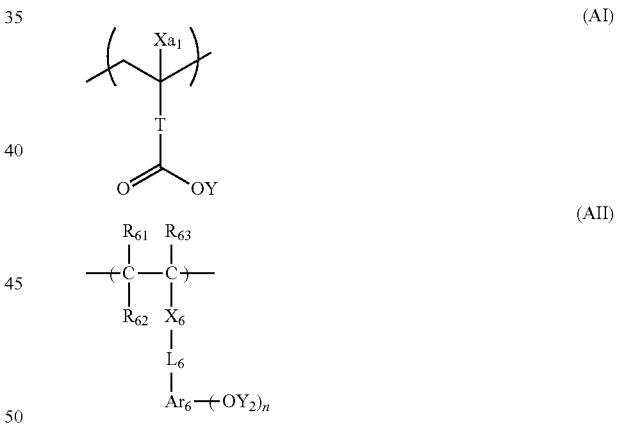

In the formulae, $Xa_1$ represents a hydrogen atom or an alkyl group which may have a substituent.

T represents a single bond or a divalent linking group.

Y represents a group capable of leaving with an acid.

$R_{61}$, $R_{62}$, and $R_{63}$ each independently represent a hydrogen atom, an alkyl group, a cycloalkyl group, a halogen atom, a cyano group, or an alkoxycarbonyl group, provided that $R_{62}$ may be bonded to $Ar_6$ to form a ring, and $R_{62}$ in such a case represents a single bond or an alkylene group.

$X_6$ represents a single bond, —COO—, or —$CONR_{64}$—.

$R_{64}$ represents a hydrogen atom or an alkyl group.

$L_6$ represents a single bond or an alkylene group.

$Ar_6$ represents an (n+1)-valent aromatic ring group, and in a case where $Ar_6$ is bonded with $R_{62}$ to form a ring, it represents an (n+2)-valent aromatic ring group.

In a case of n≥2, $Y_2$'s each independently represent a hydrogen atom or a group capable of leaving by the action of an acid, provided that at least one of $Y_2$'s represents a group capable of leaving by the action of an acid.

n represents an integer of 1 to 4.

The group capable of leaving by the action of an acid as at least one of Y or $Y_2$ represents a group represented by —C($R_{36}$)($R_{37}$)(O$R_{38}$). $R_{36}$ to $R_{38}$ each independently represent a hydrogen atom or a monovalent organic group. $R_{37}$ and $R_{38}$ may be bonded to each other to form a ring.

[6] The resist composition as described in [5], in which the repeating unit (c) is the repeating unit represented by General Formula (AII), and the group capable of leaving by the action of an acid as at least one of $Y_2$'s in General Formula (AII) is a structure represented by General Formula (Y3-1).

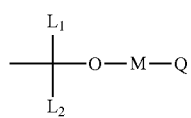

(Y3-1)

$L_1$ represents a hydrogen atom, an alkyl group, a cycloalkyl group, an aryl group, or a group obtained by combining an alkylene group and an aryl group, and $L_2$ represents a tertiary alkyl group.

M represents a single bond or a divalent linking group.

Q represents an alkyl group, a cycloalkyl group which may include a heteroatom, an aryl group which may include a heteroatom, an amino group, an ammonium group, a mercapto group, a cyano group, or an aldehyde group.

[7] The resist composition as described in [5], in which the repeating unit (c) is the repeating unit represented by General Formula (AII), and the group capable of leaving by the action of an acid as at least one of $Y_2$'s in General Formula (AII) is a structure represented by General Formula (Y3-1).

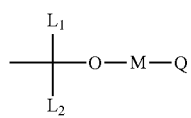

(Y3-1)

$L_1$ represents a hydrogen atom, an alkyl group, a cycloalkyl group, an aryl group, or a group obtained by combining an alkylene group and an aryl group, and $L_2$ represents a secondary alkyl group.

M represents a single bond or a divalent linking group.

Q represents an alkyl group, a cycloalkyl group which may include a heteroatom, an aryl group which may include a heteroatom, an amino group, an ammonium group, a mercapto group, a cyano group, or an aldehyde group.

[8] The resist composition as described in [4], in which the repeating unit (c) is a repeating unit represented by General Formula (AI).

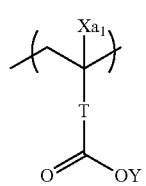

(AI)

In the formula, $Xa_1$ represents a hydrogen atom or an alkyl group which may have a substituent.

T represents a single bond or a divalent linking group.

Y is a group capable of leaving with an acid, and represents a group represented by any one of Formulae (Y1), (Y2), and (Y4).

—C($Rx_1$)($Rx_2$)($Rx_3$)  Formula (Y1):

—C(=O)O($Rx_1$)($Rx_2$)($Rx_3$)  Formula (Y2):

—C(Rn)(H)(Ar)  Formula (Y4):

In Formulae (Y1) and (Y2), $Rx_1$ to $Rx_3$ each independently represent an alkyl group or a cycloalkyl group.

In Formula (Y4), Ar represents an aromatic ring group. Rn represents an alkyl group, a cycloalkyl group, or an aryl group. Rn and Ar may be bonded to each other to form a non-aromatic ring.

[9] The resist composition as described in [4], in which the repeating unit (c) is a repeating unit represented by General Formula (AII).

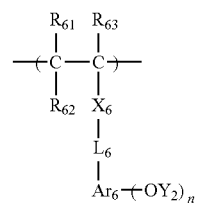

(AII)

In the formula, $R_{61}$, $R_{62}$, and $R_{63}$ each independently represent a hydrogen atom, an alkyl group, a cycloalkyl group, a halogen atom, a cyano group, or an alkoxycarbonyl group, provided that $R_{62}$ may be bonded to $Ar_6$ to form a ring, and $R_{62}$ in such a case represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group, and in a case where $Ar_6$ is bonded with $R_{62}$ to form a ring, it represents an (n+2)-valent aromatic ring group.

n represents an integer of 1 to 4.

In a case of n≥2, $Y_2$'s each independently represent a hydrogen atom or a group capable of leaving by the action of an acid, provided that at least one of $Y_2$'s represents a group capable of leaving by the action of an acid, which is represented by any one of Formulae (Y1), (Y2), and (Y4).

—C($Rx_1$)($Rx_2$)($Rx_3$)  Formula (Y1):

—C(=O)O($Rx_1$)($Rx_2$)($Rx_3$)  Formula (Y2):

—C(Rn)(H)(Ar)  Formula (Y4):

In Formulae (Y1) and (Y2), $Rx_1$ to $Rx_3$ each independently represent an alkyl group or a cycloalkyl group.

In Formula (Y4), Ar represents an aromatic ring group. Rn represents an alkyl group, a cycloalkyl group, or an aryl group. Rn and Ar may be bonded to each other to form a non-aromatic ring.

[10] The resist composition as described in any one of [1] to [9], further comprising a crosslinking agent (C).

[11] A resist film formed by the resist composition as described in any one of [1] to [10].

[12] A pattern forming method comprising:
irradiating the resist film as described in [11] with actinic rays or radiation; and
developing the film irradiated with actinic rays or radiation.

[13] The pattern forming method as described in [12], in which a positive tone pattern is formed.

[14] The pattern forming method as described in [12], in which a negative tone pattern is formed.

[15] The pattern forming method as described in any one of [12] to [14], in which the actinic rays or radiation are electron beams or extreme ultraviolet rays.

[16] A method for manufacturing an electronic device, comprising the pattern forming method as described in any one of [12] to [15].

According to the present invention, it is possible to provide a resist composition capable of forming a pattern having excellent pattern collapse performance, particularly in the formation of an ultrafine pattern (for example, a pattern with a line width of 50 nm or less), as well as a resist film, a pattern forming method, and a method for manufacturing an electronic device, each using the resist composition.

DESCRIPTION OF THE PREFERRED EMBODIMENTS

Hereinafter, one example of embodiments for carrying out the present invention will be described.

In citations for a group (atomic group) in the present specification, a description not referring to substitution or non-substitution encompasses both a group having no substituent and a group having a substituent. For example, an "alkyl group" includes not only an alkyl group having no substituent (an unsubstituted alkyl group) but also an alkyl group having a substituent (a substituted alkyl group).

"Actinic ray" or "radiation" in the present specification means, for example, a bright line spectrum of a mercury lamp, far ultraviolet rays represented by an excimer laser, extreme ultraviolet rays (EUV light), X-rays, electron beams (EB), or the like. In addition, in the present invention, light means actinic ray or radiation.

Furthermore, unless otherwise specified, "exposure" in the present specification includes not only exposure by a mercury lamp, far ultraviolet rays represented by an excimer laser, extreme ultraviolet rays (EUV light), X-rays, or the like, but also lithography by particle rays such as electron beams and ion beams.

In the present specification, the weight-average molecular weight (Mw), the number-average molecular weight (Mn), and the dispersity (Mw/Mn) of a high molecular compound and a resin are each defined as a value in terms of polystyrene by gel permeation chromatography (GPC) measurement (solvent: tetrahydrofuran, flow rate (amount of a sample to be injected): 10 µl, column: TSK gel Multipore HXL-M (×4) manufactured by TOSOH Corporation, column temperature: 40° C., flow rate: 1.0 mL/min, detector: differential refractive index (RI) detector), using a GPC device (HLC-8120GPC manufactured by TOSOH Corporation).

The resist composition of the present invention contains a resin (A) having a repeating unit (a) having an aromatic ring group and a repeating unit (b) having a silicon atom in a side chain.

Thus, a reason why the resist composition can form a pattern having excellent pattern collapse performance, particularly in the formation of an ultrafine pattern (for example, a pattern with a line width of 50 nm or less) is not clear, but is presumed as follows.

First, it is thought that by incorporating the repeating unit (a) having an aromatic ring group into the resin (A), an aggregation effect of the resin due to π-π stacking between the aromatic ring group is exhibited, and thus the hardness of the pattern is enhanced.

Furthermore, the resin (A) has a repeating unit (b) having a silicon atom in a side chain. Here, it is thought that the silicon atom lowers a surface free energy of a pattern thus formed.

Here, particularly in the formation of an ultrafine pattern (for example, a pattern with a line width of 50 nm or less), collapse of the pattern easily occurs by a capillary force due to a developer.

However, as described above, it is thought that in the formation of a pattern using the resist composition of the present invention, the surface free energy of the resist film is lowered, and thus, the capillary force is lowered and the hardness of the pattern itself is also enhanced, and as a result, the pattern collapse performance is highly excellent.

Particularly, as the fineness of the pattern is improved, the aspect ratio of the cross-sectional shape of a pattern thus formed tends to be improved, and thus, collapse of a pattern easily occurs. That is, a resist pattern which is ultrafine and has a cross-sectional shape with a high aspect ratio easily undergoes collapse of a pattern, and is very difficult to exhibit high resolution.

However, in a view that the present invention has highly excellent pattern collapse performance as described above, particularly in the formation of an ultrafine pattern (for example, a pattern with a line width 50 nm or less), which has a cross-sectional shape with a high aspect ratio (for example, a ratio of film thickness/line width of 2 or more), the present invention is highly effective from the viewpoint of improving the resolution.

<Resist Composition>

Next, the resist composition used in the pattern forming method of the present invention will be described.

The resist composition of the present invention is preferably for exposure with electron beams or extreme ultraviolet rays.

The resist composition of the present invention may be either a positive tone resist composition or a negative tone resist composition, and further, it may be either a resist composition for alkali development or a resist composition for organic solvent development.

Furthermore, the resist composition of the present invention is typically a chemically amplified resist composition.

Hereinafter, the respective components of the resist composition of the present invention will be described in detail.

<(A) Resin>

The resist composition contains a resin (A) having a repeating unit (a) having an aromatic ring group and a repeating unit (b) having a silicon atom in a side chain.

[Repeating Unit (a) Having Aromatic Ring Group]

Suitable examples of the repeating unit (a) having an aromatic ring group include a repeating unit having a phenolic hydroxyl group.

In the present specification, the phenolic hydroxyl group is a group formed by substituting a hydrogen atom of an aromatic ring group with a hydroxyl group. The aromatic ring of the aromatic ring group is a monocyclic or polycyclic aromatic ring, and examples thereof include a benzene ring and a naphthalene ring.

In particular, in a case where the resist composition contains a crosslinking agent which will be described later (for example, a case where the resist composition is a negative tone resist composition for alkali development), the resin (A) preferably has a repeating unit having a phenolic hydroxyl group.

Examples of the repeating unit having a phenolic hydroxyl group include a repeating unit represented by General Formula (I) or (I-1).

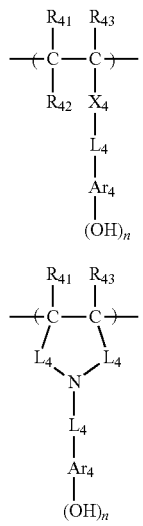

In the formula, $R_{41}$, $R_{42}$, and $R_{43}$ each independently represent a hydrogen atom, an alkyl group, a cycloalkyl group, a halogen atom, a cyano group, or an alkoxycarbonyl group, provided that $R_{42}$ may be bonded to $Ar_4$ to form a ring, and $R_{42}$ in that case represents a single bond or an alkylene group.

$X_4$ represents a single bond, —COO—, or —CONR$_{64}$—, and $R_{64}$ represents a hydrogen atom or an alkyl group.

$L_4$'s each independently represent a single bond or a divalent linking group.

$Ar_4$ represents an (n+1)-valent aromatic ring group, and in a case where $Ar_4$ is bonded to $R_{42}$ to form a ring, it represents an (n+2)-valent aromatic ring group.

n represents an integer of 1 to 5.

For a purpose of increasing the polarity of the repeating unit of General Formula (I) or (I-1), it is also preferable that n is an integer of 2 or more, or $X_4$ is —COO— or —CONR$_{64}$—.

Examples of the alkyl group of $R_{41}$, $R_{42}$, or $R_{43}$ in General Formulae (I) and (I-1) preferably include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, more preferably include an alkyl group having 8 or less carbon atoms, and particularly preferably include an alkyl group having 3 or less carbon atoms, each of which may have a substituent.

The cycloalkyl group of $R_{41}$, $R_{42}$, or $R_{43}$ in General Formulae (I) and (I-1) may be either monocyclic or polycyclic. Preferred examples thereof include a monocyclic cycloalkyl group having 3 to 8 carbon atoms, such as a cyclopropyl group, a cyclopentyl group, and a cyclohexyl group, each of which may have a substituent.

Examples of the halogen atom of $R_{41}$, $R_{42}$, or $R_{43}$ in General Formulae (I) and (I-1) include a fluorine atom, a chlorine atom, a bromine atom, and an iodine atom, with the fluorine atom being particularly preferable.

The alkyl group included in the alkoxycarbonyl group of $R_{41}$, $R_{42}$, or $R_{43}$ in General Formulae (I) and (I-1) is preferably the same as the alkyl group in $R_{41}$, $R_{42}$, or $R_{43}$.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Ar_4$ represents an (n+1)-valent aromatic ring group. A divalent aromatic ring group in a case where n is 1 may have a substituent, and preferred examples thereof include an arylene group having 6 to 18 carbon atoms, such as a phenylene group, a tolylene group, a naphthylene group, and an anthracenylene group, or an aromatic ring group including a heterocycle, such as thiophene, furan, pyrrole, benzothiophene, benzofuran, benzopyrrole, triazine, imidazole, benzimidazole, triazole, thiadiazole, and thiazole.

Specific suitable examples of the (n+1)-valent aromatic ring group in a case where n is an integer of 2 or more include groups formed by obtaining removing arbitrary (n−1) hydrogen atoms from the specific examples of the divalent aromatic ring groups.

The (n+1)-valent aromatic ring group may further have a substituent.

Examples of the substituent which can be contained in the alkyl group, the cycloalkyl group, the alkoxycarbonyl, and the (n+1)-valent aromatic ring group include the alkyl groups mentioned above for $R_{41}$, $R_{42}$, or $R_{43}$ in General Formula (I), and alkoxy groups such as a methoxy group, an ethoxy group, a hydroxyethoxy group, a propoxy group, a hydroxypropoxy group, and a butoxy group; and aryl groups such as a phenyl group.

Preferred examples of the alkyl group of $R_{64}$ in —CONR$_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and more preferred examples of the alkyl group include an alkyl group having 8 or less carbon atoms, each of which may have a substituent.

$X_4$ is preferably a single bond, —COO—, or —CONH—, and more preferably a single bond or —COO—.

The divalent linking group as $L_4$ is preferably an alkylene group, and preferred examples of the alkylene group include an alkylene group having 1 to 8 carbon atoms, such as a methylene group, an ethylene group, a propylene group, a butylene group, a hexylene group, and an octylene group, each of which may have a substituent.

As $Ar_4$, an aromatic ring group having 6 to 18 carbon atoms, which may have a substituent, is more preferable, and a benzene ring group, a naphthalene ring group, or a biphenylene ring group is particularly preferable.

The repeating unit represented by General Formula (I) preferably includes a hydroxystyrene structure. That is, $Ar_4$ is preferably a benzene ring group.

Preferred examples of the repeating unit having a phenolic hydroxyl group contained in the resin (A) include a repeating unit represented by General Formula (p1).

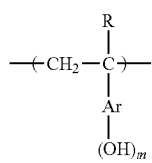
(p1)

R in General Formula (p1) represents a hydrogen atom, a halogen atom, or a linear or branched alkyl group having 1 to 4 carbon atoms. A plurality of R's may be the same as or different from each other. R in General Formula (p1) is particularly preferably a hydrogen atom.

Ar in General Formula (p1) represents an aromatic ring, and examples thereof include an aromatic hydrocarbon ring having 6 to 18 carbon atoms, which may have a substituent, such as a benzene ring, a naphthalene ring, an anthracene ring, a fluorene ring, and a phenanthrene ring, or an aromatic ring heterocycle including a heterocycle, such as for example, thiophene ring, furan ring, pyrrole ring, a benzothiophene ring, a benzofuran ring, a benzopyrrole ring, a triazine ring, imidazole ring, a benzimidazole ring, a triazole ring, a thiadiazole ring, and a thiazole ring. Among those, the benzene ring is most preferable.

m in General Formula (p1) represents an integer of 1 to 5, and is preferably 1.

Specific examples of the repeating unit having a phenolic hydroxyl group contained in the resin (A) are shown below, but the present invention is not limited thereto. In the formula, a represents 1 or 2.

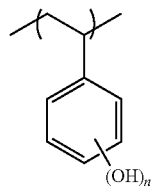
(B-1)

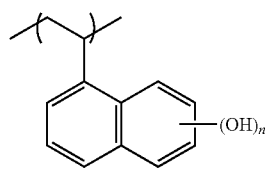
(B-2)

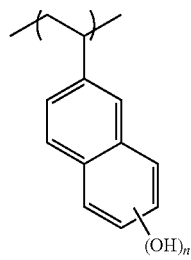
(B-3)

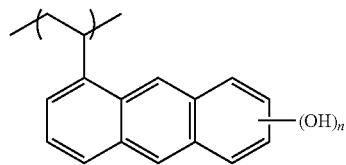
(B-4)

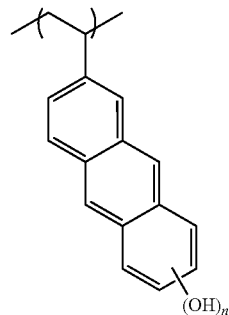
(B-5)

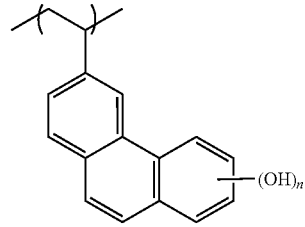
(B-6)

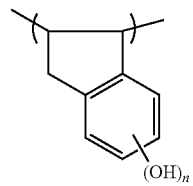
(B-7)

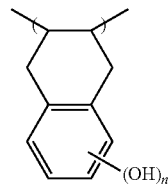
(B-8)

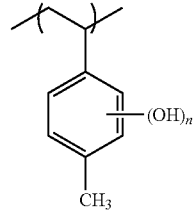
(B-9)

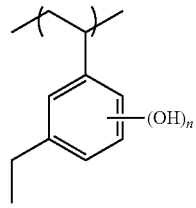
(B-10)

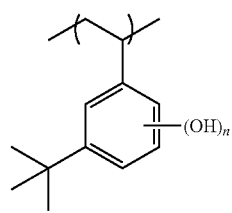
(B-11)

(B-12) 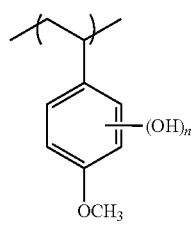
(B-13) 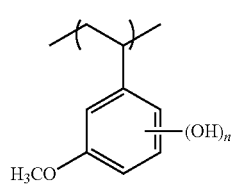
(B-14) 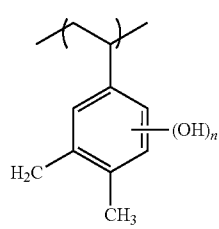
(B-15) 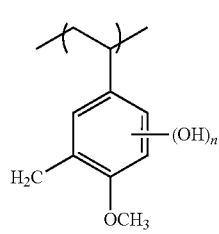
(B-16) 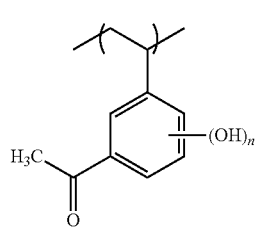
(B-17) 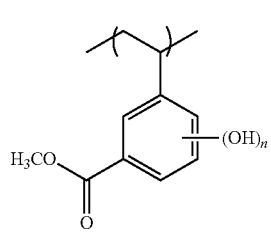
(B-18) 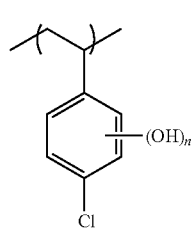
(B-19) 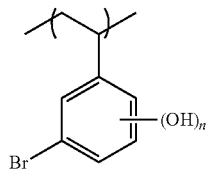
(B-20) 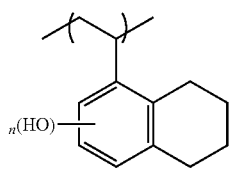
(B-21) 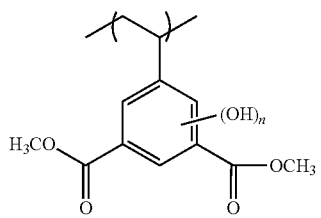
(B-22) 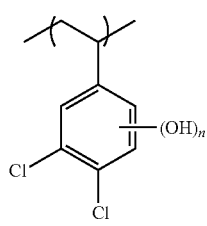
(B-23) 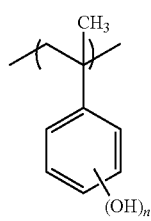
(B-24) 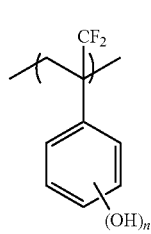
(B-25) 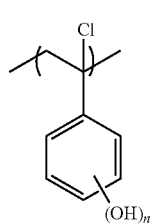

-continued (B-26) 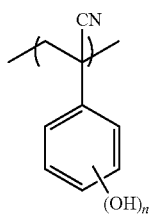

(B-27) 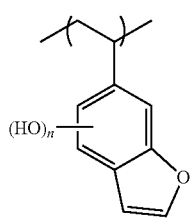

(B-28) 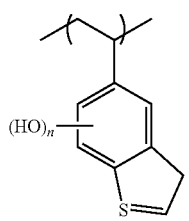

(B-29) 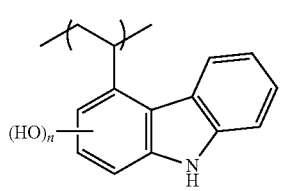

(B-30) 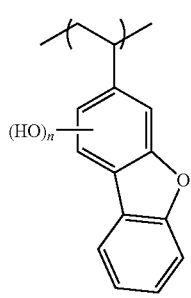

(B-31) 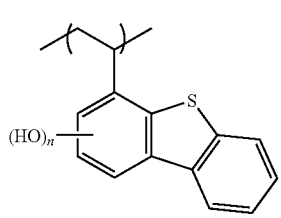

(B-32) 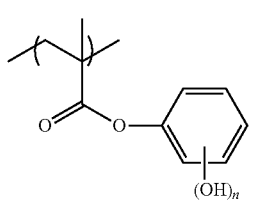

-continued (B-33) 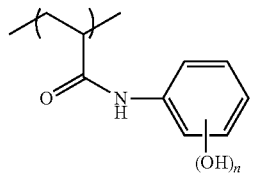

(B-34) 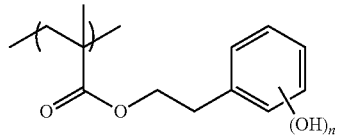

(B-35) 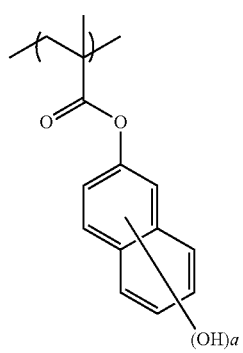

(B-36) 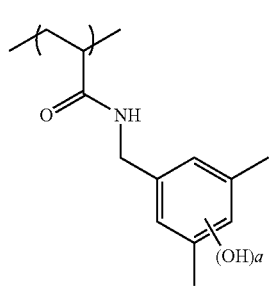

(B-37) 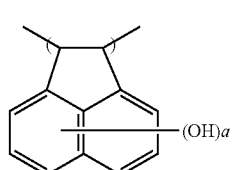

(B-38) 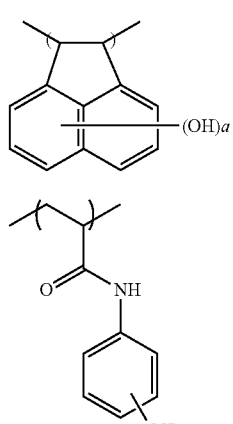

The resin (A) may have one kind or two or more kinds of the repeating unit (a) having a phenolic hydroxyl group.

The content of the repeating unit (a) having a phenolic hydroxyl group is preferably 10% to 95% by mole, more preferably 20% to 90% by mole, and still more preferably 30% to 85% by mole, with respect to all the repeating units of the resin (A).

The repeating unit (a) having an aromatic ring group may also be a repeating unit represented by General Formula (X).

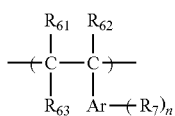

(X)

In General Formula (X), $R_{61}$, $R_{62}$, and $R_{63}$ each independently represent a hydrogen atom, an alkyl group, a cycloalkyl group, a halogen atom, a cyano group, or an alkoxycarbonyl group, provided that $R_{63}$ may be bonded to Ar to form a ring, and $R_{62}$ in such a case represents a single bond or an alkylene group.

Ar represents an (n+1)-valent aromatic ring group, and in a case where Ar is bonded with $R_{62}$ to form a ring, it represents an (n+2)-valent aromatic ring group.

$R_7$'s each independently represent a linear, branched, or cyclic alkyl group, alkoxy group, or acyloxy group having 1 to 10 carbon atoms, a cyano group, a nitro group, an amino group, a halogen atom, an ester group (—OCOR or —COOR: R represents an alkyl group or a fluorinated alkyl group having 1 to 10 carbon atoms (preferably having 1 to 6 carbon atoms)), or a carboxyl group.

n represents an integer of 0 or more.

General Formula (X) is also preferably a repeating unit represented by General Formula (V) or General Formula (VI).

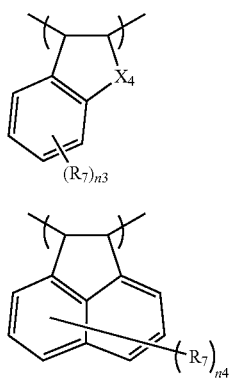

(V)

(VI)

In the formula, $n_3$ represents an integer of 0 to 4. $n_4$ represents an integer of 0 to 6.

$X_4$ is a methylene group, an oxygen atom, or a sulfur atom.

$R_7$ has the same definition as $R_7$ in General Formula (X).

Specific examples of the repeating unit represented by General Formula (X) are shown below, but are not limited thereto.

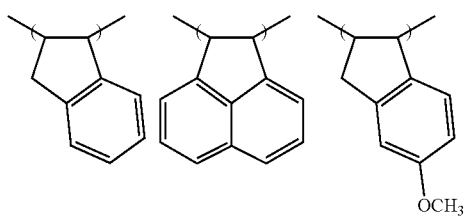

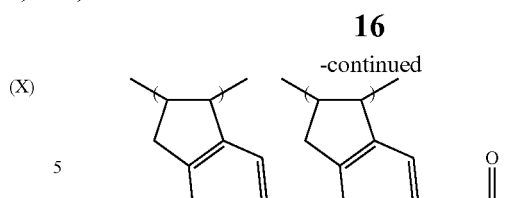

-continued

The resin (A) may have one kind or two or more kinds of the repeating unit (a) represented by General Formula (X).

The content of the repeating unit represented by General Formula (X) is preferably 5% to 50% by mole, more preferably 5% to 40% by mole, and still more preferably 5% to 30% by mole, with respect to all the repeating units of the resin (A).

Furthermore, the repeating unit (a) having an aromatic ring group may have an aromatic ring group in the repeating unit (c) having a structure in which a polar group is protected with a leaving group capable of decomposing by the action of an acid to leave which will be described later.

The resin (A) may have one kind or two or more kinds of the repeating unit (a) having an aromatic ring group.

The content of the repeating unit (a) having an aromatic ring group is preferably 5% to 100% by mole, more preferably 7% to 98% by mole, and still more preferably 8% to 96% by mole, with respect to all the repeating units of the resin (A).

[Repeating Unit (b) Having Silicon Atom in Side Chain]

The repeating unit (b) having a silicon atom in a side chain is not particularly limited as long as it has a silicon atom in a side chain, but examples thereof include a (meth)acrylate-based repeating unit having a silicon atom and a vinyl-based repeating unit having a silicon atom.

The repeating unit (b) having a silicon atom is preferably a repeating unit not having a structure in which a polar group is protected with a leaving group capable of decomposing by the action of an acid to leave (acid-decomposable group).

The repeating unit (b) having a silicon atom in a side chain is typically a repeating unit having a group having a silicon atom in a side chain, and examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, or a cyclic or linear polysiloxane as described below, or a cage type, ladder type, or random type silsesquioxane structure. In the formula, R, and $R^1$ each independently represent a monovalent substituent. * represents a bonding arm.

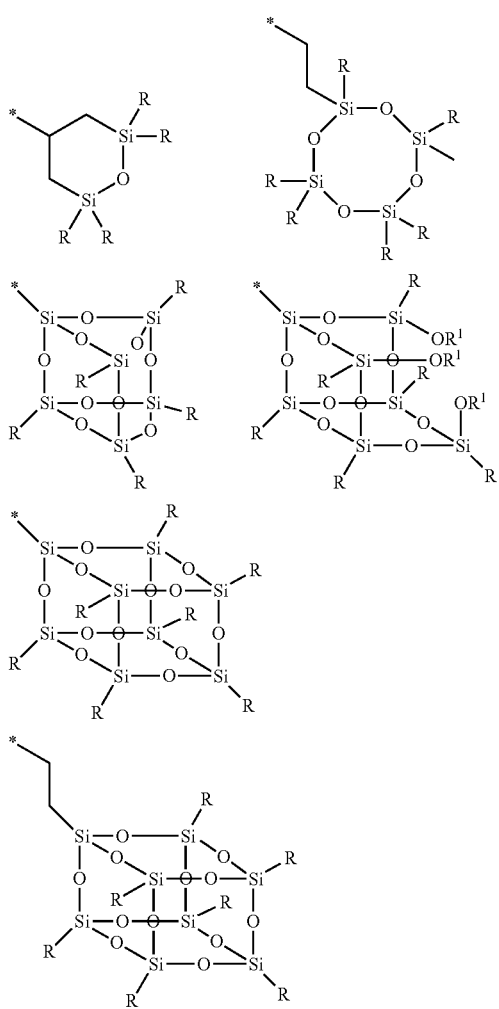

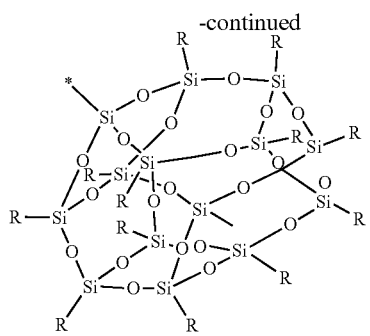

Suitable examples of the repeating unit having the above-mentioned group include a repeating unit derived from an acrylate or methacrylate compound having the above-mentioned group and a repeating unit derived from a compound having the above-mentioned group and a vinyl group.

The repeating unit having a silicon atom is preferably a repeating unit having a silsesquioxane structure, and with such a structure, the repeating unit can exhibit extremely excellent collapse performance in the formation of an ultra-fine pattern (for example, a pattern with a line width of 50 nm or less), which has a cross-section having a high aspect ratio (for example, a ratio of film thickness/line width of 2 or more).

Examples of the silsesquioxane structure include a cage type silsesquioxane structure, a ladder type silsesquioxane structure, and a random type silsesquioxane structure. Among these, the cage type silsesquioxane structure is preferable.

Here, the cage type silsesquioxane structure is a silsesquioxane structure having a cage shape skeleton. The cage type silsesquioxane structure may be either a full cage type silsesquioxane structure or a partial cage type silsesquioxane structure, with the full cage type silsesquioxane structure being preferable.

Furthermore, the ladder type silsesquioxane structure is a silsesquioxane structure having a ladder shape skeleton.

In addition, the random type silsesquioxane structure is a silsesquioxane structure having a random skeleton.

The cage type silsesquioxane structure is preferably a siloxane structure represented by Formula (S).

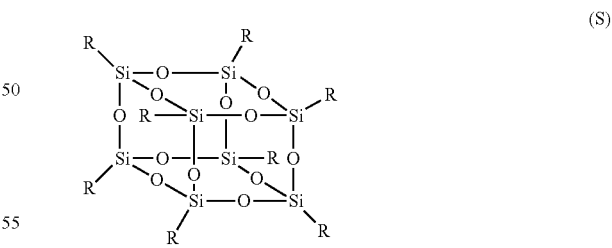

(S)

In Formula (S), R represents a monovalent substituent. R's which are present in plural numbers may be the same as or different from each other.

The monovalent substituent is not particularly limited, but specific examples thereof include a halogen atom, a hydroxyl group, a nitro group, a carboxyl group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the halogen atom include a fluorine atom, a chlorine atom, a bromine atom, and an iodine atom.

Examples of the heteroatom of the hydrocarbon group which may have the heteroatom include an oxygen atom, a nitrogen atom, a sulfur atom, and a phosphorus atom.

Examples of the hydrocarbon group in the hydrocarbon group which may have the heteroatom include an aliphatic hydrocarbon group, an aromatic hydrocarbon group, and a group formed by combination thereof.

The aliphatic hydrocarbon group may be linear, branched, or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include an aromatic hydrocarbon group having 6 to 18 carbon atoms, such as a phenyl group, a tolyl group, a xylyl group, and a naphthyl group.

The repeating unit having a silicon atom is preferably represented by Formula (I).

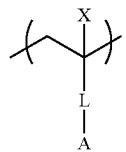

(I)

In Formula (I), L represents a single bond or a divalent linking group.

Examples of the divalent linking group include an alkylene group, a —COO-Rt- group, and an —ORt- group. In the formula, Rt represents an alkylene group or a cycloalkylene group.

L is preferably a single bond or a —COO-Rt- group. Rt is preferably an alkylene group having 1 to 5 carbon atoms, and more preferably a —CH$_2$— group, a —(CH$_2$)$_2$— group, or a —(CH$_2$)$_3$-group.

In Formula (I), X represents a hydrogen atom or an organic group.

Examples of the organic group include an alkyl group which may have a substituent such as a fluorine atom and a hydroxyl group, and the organic group is preferably a hydrogen atom, a methyl group, a trifluoromethyl group, or a hydroxymethyl group.

In Formula (I), A represents a silicon atom-containing group. Among those, a group represented by Formula (a) or (b) is preferable.

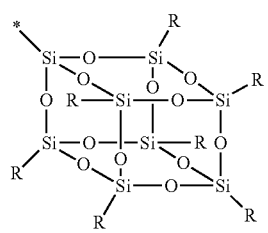

(a)

In Formula (a), R represents a monovalent substituent. R's which are present in plural numbers may be the same as or different from each other. Specific examples and suitable embodiments of R are the same as those of the above-mentioned Formula (S). In addition, in a case where A in Formula (I) is a group represented by Formula (a), Formula (I) is represented by Formula (I-a).

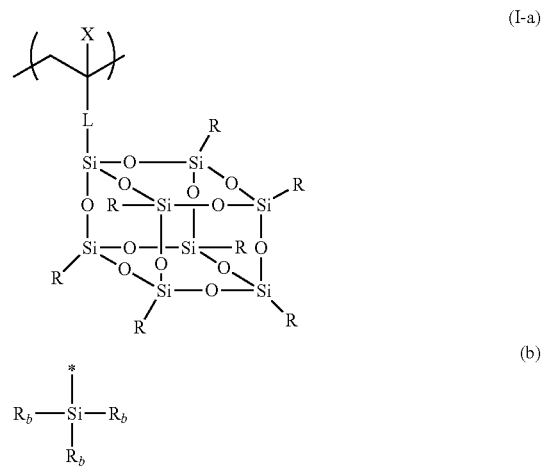

(I-a)

(b)

In Formula (b), Rb represents a hydrocarbon group which may have a heteroatom. Specific examples and suitable embodiments of the hydrocarbon group which may have a heteroatom are the same as those of R in Formula (S) as mentioned above.

The resin (A) may have one kind or two or more kinds of the repeating unit having a silicon atom.

The content of the repeating unit having a silicon atom is preferably 1% to 30% by mole, more preferably 1% to 20% by mole, and still more preferably 1% to 10% by mole, with respect to all the repeating units of the resin (A).

Furthermore, in the present specification, the repeating unit having a silicon atom, and a structure in which a polar group is protected with a leaving group capable of decomposing by the action of an acid to leave (acid-decomposable group) corresponds to both of a repeating unit having a silicon atom and a repeating unit having an acid-decomposable group.

[Repeating Unit (c) Having Structure in which Polar Group is Protected with Leaving Group Capable of Decomposing by Action of Acid to Leave]

In a preferred embodiment, the resin (A) has a repeating unit (c) having a structure in which a polar group is protected with a leaving group capable of decomposing by the action of an acid to leave.

Examples of the polar group in the repeating unit (c) having a structure in which a polar group is protected with a leaving group capable of decomposing by the action of an acid to leave (acid-decomposable group) include a carboxyl group, an alcoholic hydroxyl group, a phenolic hydroxyl group, and a sulfonic acid group. Among these, the polar group is preferably a carboxyl group, an alcoholic hydroxyl group, or a phenolic hydroxyl group, and more preferably a carboxyl group or a phenolic hydroxyl group.

Furthermore, in a case where the resin (A) has a repeating unit having an acid-decomposable group, the solubility in an alkali developer is enhanced by the action of an acid, and thus, the solubility in an organic solvent decreases.

Examples of the leaving group capable of decomposing by the action of an acid to leave include groups represented by Formulae (Y1) to (Y4).

—C(Rx$_1$)(Rx$_2$)(Rx$_3$)  Formula (Y1):

—C(=O)O(Rx$_1$)(Rx$_2$)(Rx$_3$)  Formula (Y2):

—C(R$_{36}$)(R$_{37}$)(OR$_{38}$)  Formula (Y3):

—C(Rn)(H)(Ar)  Formula (Y4):

In Formulae (Y1) and (Y2), Rx$_1$ to Rx$_3$ each independently represent an (linear or branched) alkyl group or a (monocyclic or polycyclic) cycloalkyl group. Here, in a case where all of Rx$_1$ to Rx$_3$ are (linear or branched) alkyl groups, it is preferable that at least two of Rx$_1$, . . . , or Rx$_3$ are methyl groups.

It is more preferable that Rx$_1$ to Rx$_3$ are each independently a repeating unit representing a linear or branched alkyl group, and it is still more preferable that Rx$_1$ to Rx$_3$ are each independently a repeating unit representing a linear alkyl group.

Two of Rx$_1$ to Rx$_3$ may be bonded to each other to form a monocycle or a polycycle.

As the alkyl group of Rx$_1$ to Rx$_3$, an alkyl group having 1 to 4 carbon atoms, such as a methyl group, an ethyl group, an n-propyl group, an isopropyl group, an n-butyl group, an isobutyl group, and a t-butyl group is preferable.

As the cycloalkyl group of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is particularly preferable.

In the cycloalkyl group formed by the bonding of two of Rx$_1$ to Rx$_3$, for example, one of the methylene groups constituting the ring may be substituted with a heteroatom such as an oxygen atom, or with a group having a heteroatom, such as a carbonyl group.

An embodiment of the repeating unit represented by General Formula (Y1) or (Y2), for example, in which Rx$_1$ is a methyl group or an ethyl group, and Rx$_2$ and Rx$_3$ are bonded to each other to form the above-mentioned cycloalkyl group, is preferable.

In Formula (Y3), R$_{36}$ to R$_{38}$ each independently represent a hydrogen atom or a monovalent organic group. R$_{37}$ and R$_{38}$ may be bonded to each other to form a ring. Examples of the monovalent organic group include an alkyl group, a cycloalkyl group, an aryl group, an aralkyl group, and an alkenyl group. R$_{36}$ is preferably a hydrogen atom.

As a preferred Formula (Y3), a structure represented by General Formula (Y3-1) is more preferable.

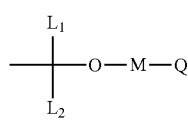

(Y3-1)

Here, L$_1$ and L$_2$ each independently represent a hydrogen atom, an alkyl group, a cycloalkyl group, an aryl group, or a group obtained by combining an alkylene group and an aryl group.

M represents a single bond or a divalent linking group.

Q represents an alkyl group, a cycloalkyl group which may include a heteroatom, an aryl group which may include a heteroatom, an amino group, an ammonium group, a mercapto group, a cyano group, or an aldehyde group.

It is preferable that at least one of L$_1$ or L$_2$ is a hydrogen atom, and at least one of L$_1$ or L$_2$ is an alkyl group, a cycloalkyl group, an aryl group, or a group obtained by combining an alkylene group and an aryl group.

At least two of Q, M, or L$_1$ may be bonded to each other to form a ring (preferably a 5- or 6-membered ring).

For the improvement of pattern collapse performance, L$_2$ is preferably a secondary or tertiary alkyl group, and more preferably a tertiary alkyl group. Examples of the secondary alkyl group include an isopropyl group, a cyclohexyl group, and a norbornyl group, and examples of the tertiary alkyl group include a tert-butyl group and adamantane. In these embodiments, since Tg or activation energy is high, suppression of fogging can be achieved, in addition to secured film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

The repeating unit having a group capable of decomposing by the action of an acid to generate a polar group, which is contained in the resin (A), is preferably a repeating unit represented by General Formula (AI) or (AII).

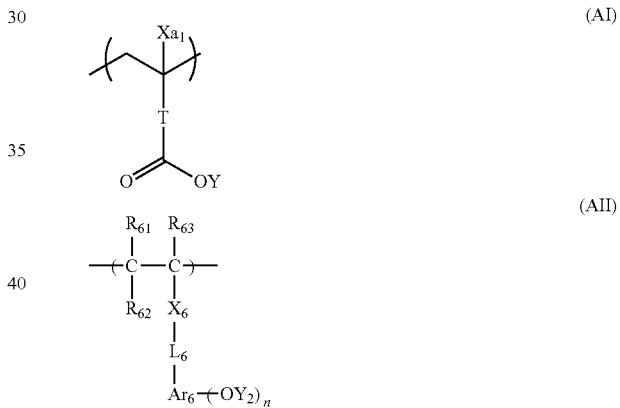

In General Formula (AI),

Xa$_1$ represents a hydrogen atom or an alkyl group which may have a substituent.

T represents a single bond or a divalent linking group.

Y represents a group capable of leaving with an acid. Y is preferably one of Formulae (Y1) to (Y4).

Examples of the alkyl group which may have a substituent, represented by Xa$_1$, include a methyl group or a group represented by —CH$_2$—R$_{11}$. R$_{11}$ represents a halogen atom (a fluorine atom or the like), a hydroxyl group, or a monovalent organic group, and examples thereof include an alkyl group having 5 or less carbon atoms, and an acyl group having 5 or less carbon atoms, preferably an alkyl group having 3 or less carbon atoms, and more preferably a methyl group. In one embodiment, Xa$_1$ is preferably a hydrogen atom, a methyl group, a trifluoromethyl group, a hydroxymethyl group, or the like.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —CH$_2$— group, a —(CH$_2$)$_2$— group, or a —(CH$_2$)$_3$-group.

In General Formula (AII),

R$_{61}$, R$_{62}$, and R$_{63}$ each independently represent a hydrogen atom, an alkyl group, a cycloalkyl group, a halogen atom, a cyano group, or an alkoxycarbonyl group, provided that R$_{62}$ may be bonded to Ar$_6$ to form a ring, and R$_{62}$ in such a case represents a single bond or an alkylene group.

X$_6$ represents a single bond, —COO—, or —CONR$_{64}$—. R$_{64}$ represents a hydrogen atom or an alkyl group.

L$_6$ represents a single bond or an alkylene group.

Ar$_6$ represents an (n+1)-valent aromatic ring group, and in a case where Ar$_6$ is bonded with R$_{62}$ to form a ring, it represents an (n+2)-valent aromatic ring group.

In a case of n≥2, Y$_2$'s each independently represent a hydrogen atom or a group capable of leaving by the action of an acid, provided that at least one of Y$_2$'s represents a group capable of leaving by the action of an acid. The group capable of leaving by the action of an acid as Y2 is preferably one of Formulae (Y1) to (Y4).

n represents an integer of 1 to 4.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with those having 8 or less carbon atoms being preferable.

The repeating unit represented by General Formula (AI) is preferably an acid-decomposable tertiary alkyl (meth)acrylate ester-based repeating unit (a repeating unit in which Xa$_1$ represents a hydrogen atom or a methyl group, and T represents a single bond).

The repeating unit represented by General Formula (AII) is preferably a repeating unit represented by General Formula (AIII).

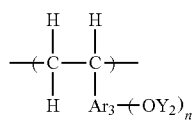

(AIII)

In General Formula (AIII),

Ar$_3$ represents an aromatic ring group.

In a case of n≥2, Y$_2$'s each independently represent a hydrogen atom or a group capable of leaving by the action of an acid, provided that at least one of Y$_2$'s represents a group capable of leaving by the action of an acid. The group capable of leaving by the action of an acid as Y2 is preferably one of Formulae (Y1) to (Y4).

n represents an integer of 1 to 4.

The aromatic ring group represented by Ar$_6$ and Ar$_3$ is preferably a benzene ring group or a naphthalene ring group, and more preferably a benzene ring group.

Specific examples of the repeating unit having an acid-decomposable group are shown below, but the present invention is not limited thereto.

In the specific examples, Rx represents a hydrogen atom, CH$_3$, CF$_3$, or CH$_2$OH. Rxa and Rxb each represent an alkyl group having 1 to 4 carbon atoms. Z represents a substituent containing a polar group, and in a case where Z's are present in plural numbers, they are each independent. p represents 0 or a positive integer. Examples of the substituent containing a polar group, represented by Z, include a linear or branched alkyl group, and a cycloalkyl group, each having a hydroxyl group, a cyano group, an amino group, an alkylamido group, or a sulfonamido group, and preferably an alkyl group having a hydroxyl group. As the branched alkyl group, an isopropyl group is particularly preferable.

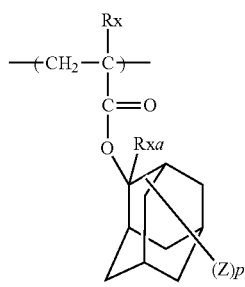

1

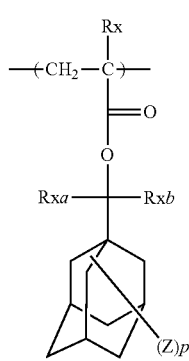

2

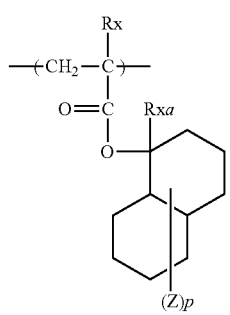

3

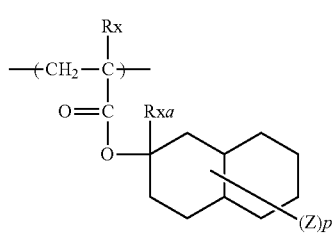

4

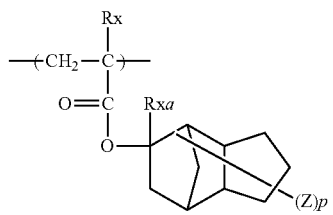

5

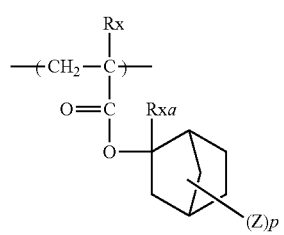
6
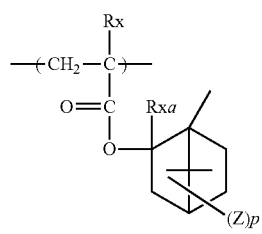
7
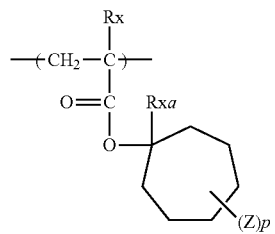
8
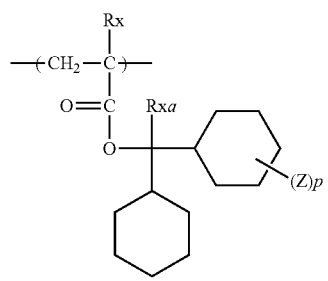
9
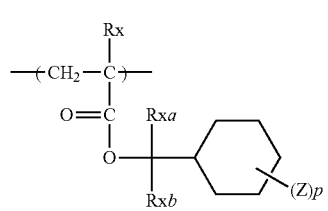
10
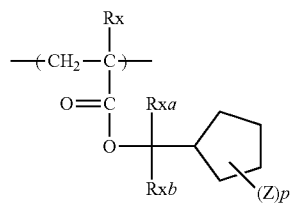
11
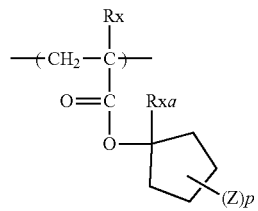
12
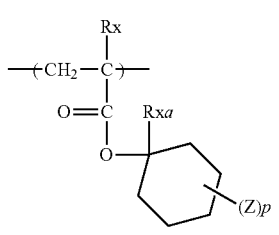
13
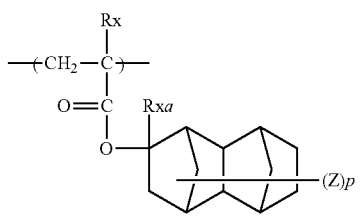
14
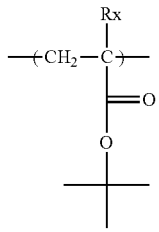
15
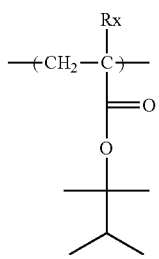
16
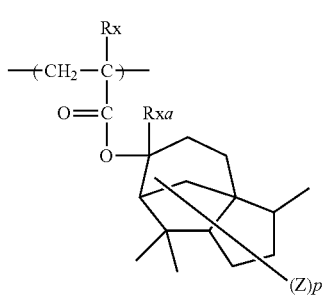
17
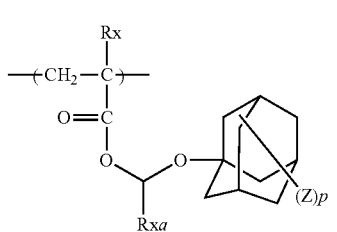
18

19
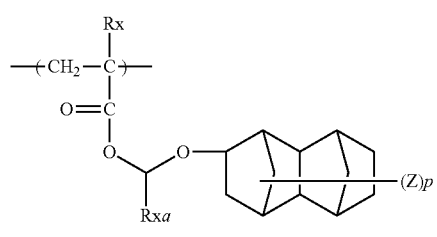
20
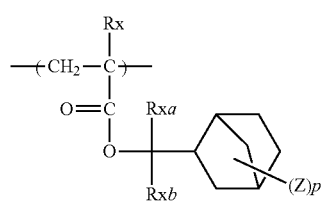
21
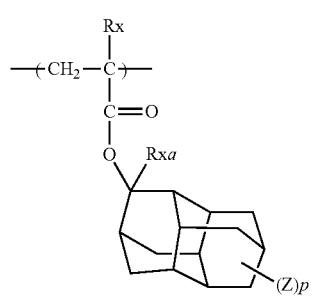
22
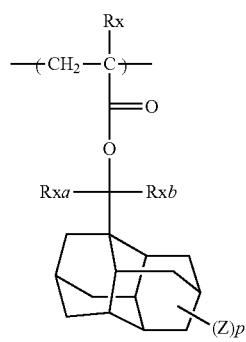
23
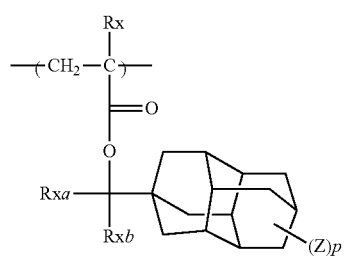
24
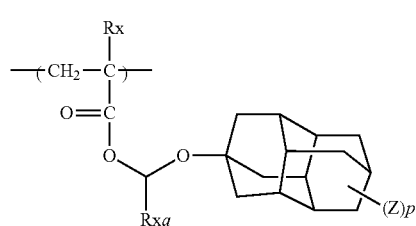
25
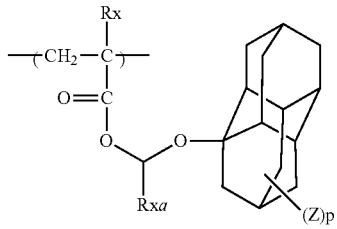
26
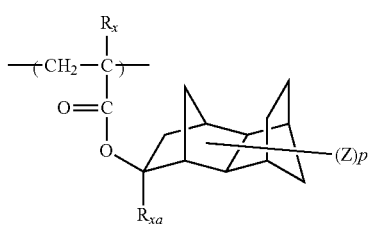
27
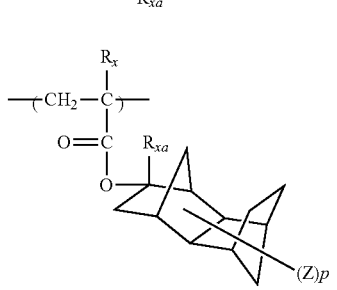
(VI-1)
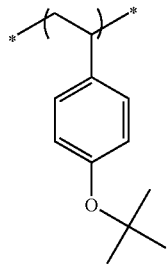
(VI-2)
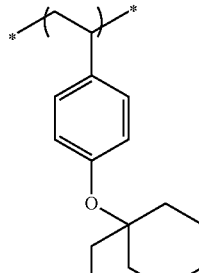
(VI-3)
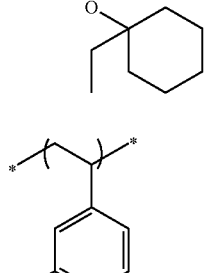
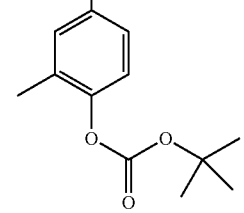

(VI-4)
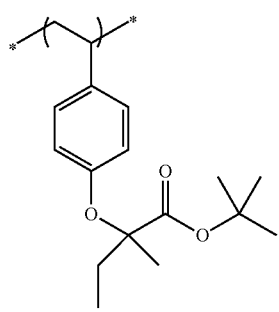
(VI-5)
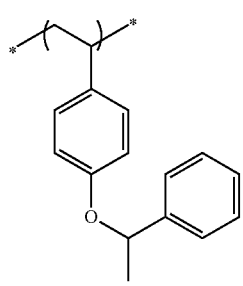
(VI-6)
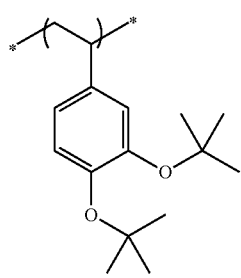
(VI-7)
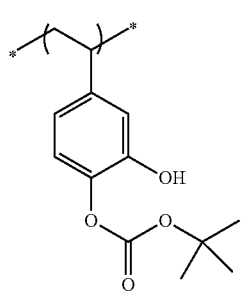
(VI-8)
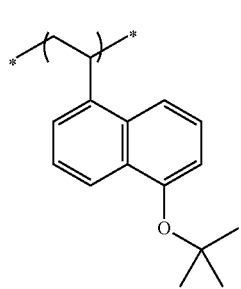
(VI-9)
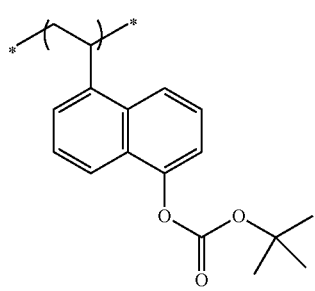
(VI-10)
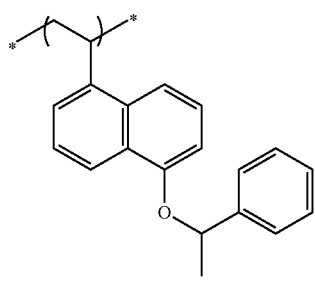
(VI-11)
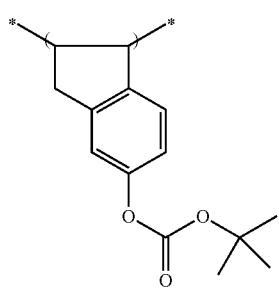
(VI-12)
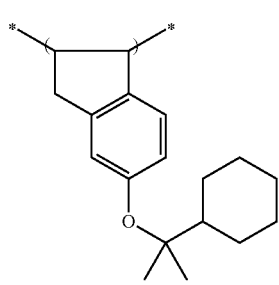
(VI-13)
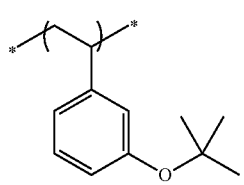
(VI-14)
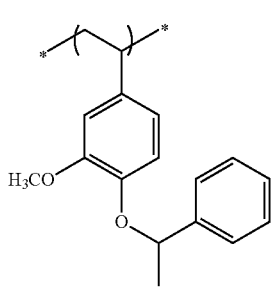

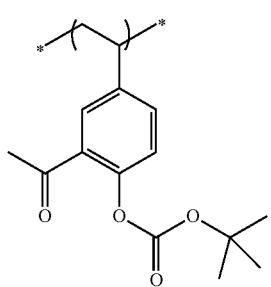 (VI-15)
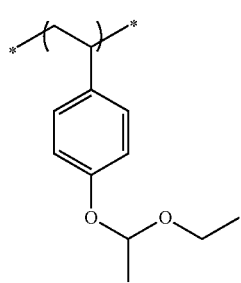 (VI-16)
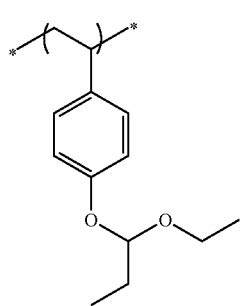 (VI-17)
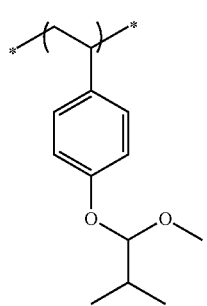 (VI-18)
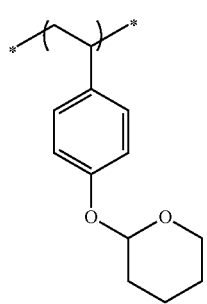 (VI-19)
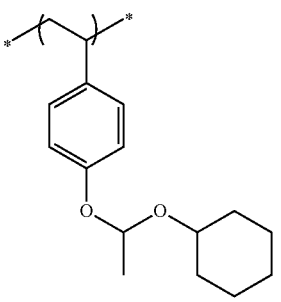 (VI-20)
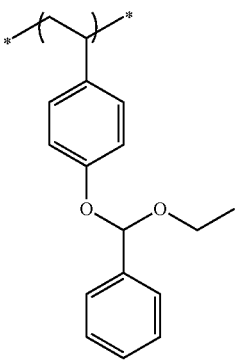 (VI-21)
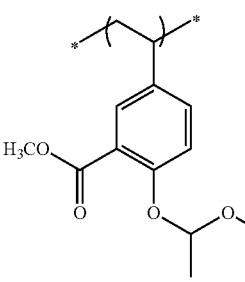 (VI-22)
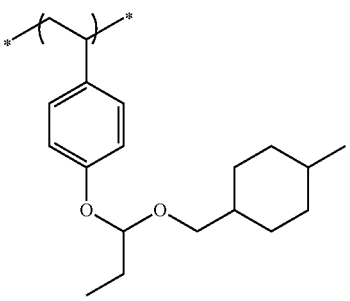 (VI-23)
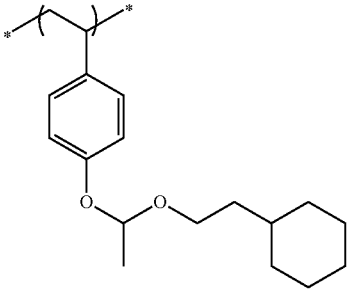 (VI-24)

(VI-25)
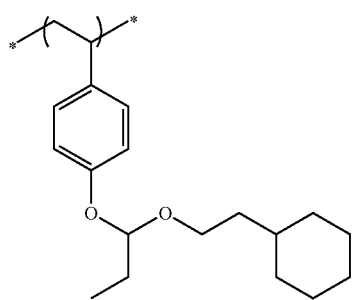
(VI-26)
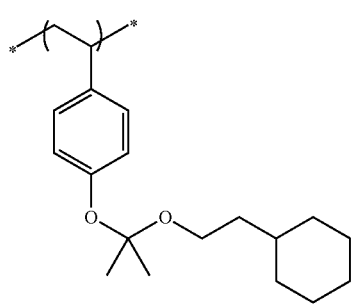
(VI-27)
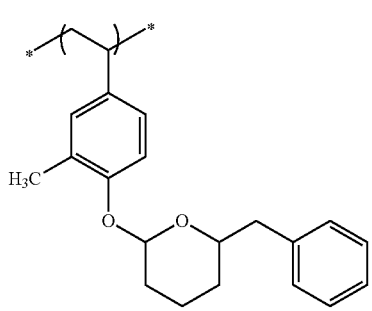
(VI-28)
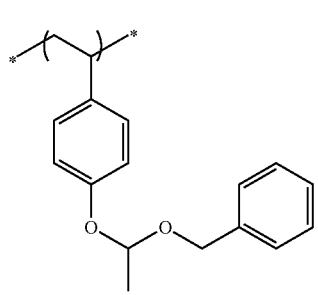
(VI-29)
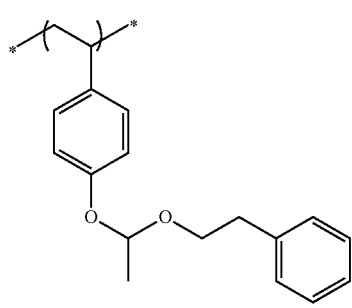
(VI-30)
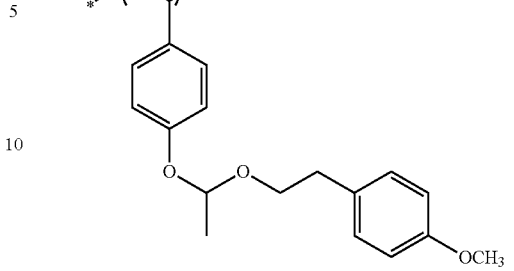
(VI-31)
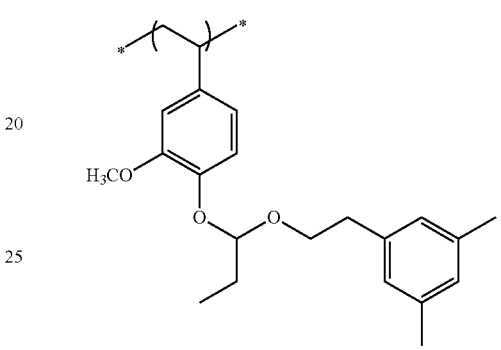
(VI-32)
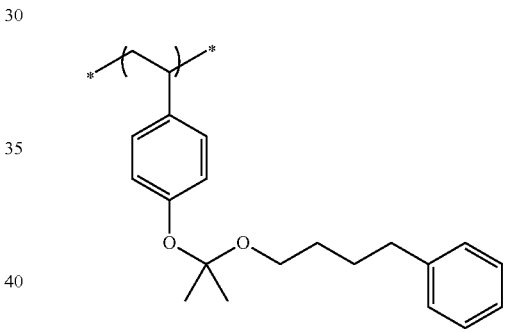
(VI-33)
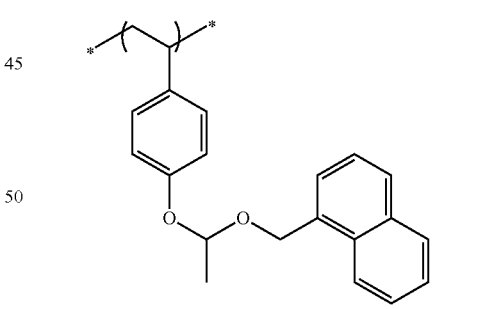
(VI-34)
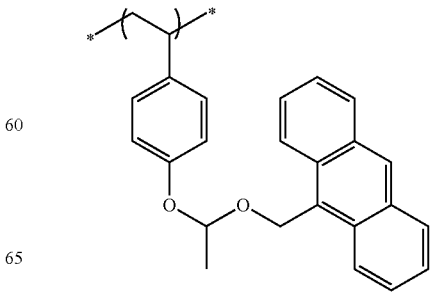

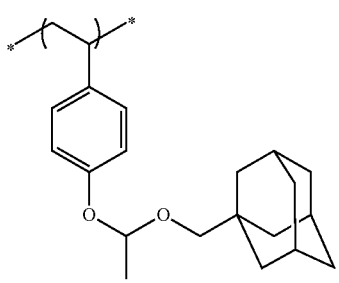
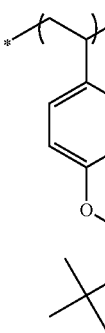
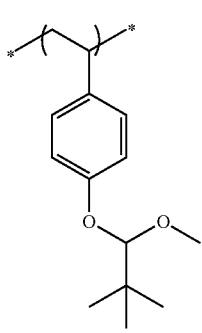
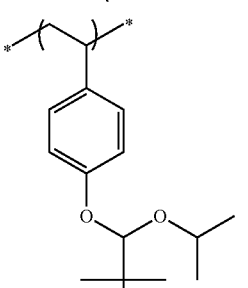
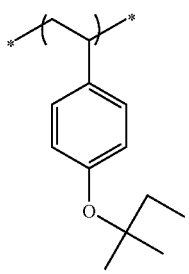
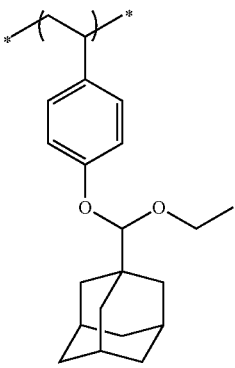
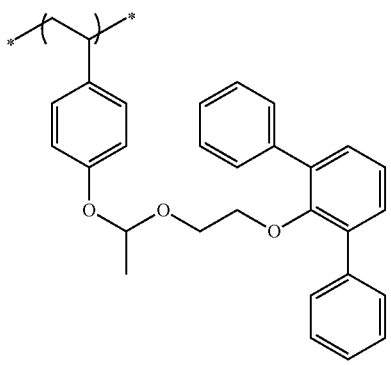
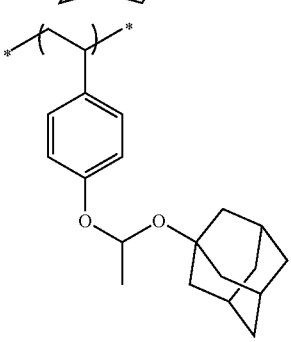
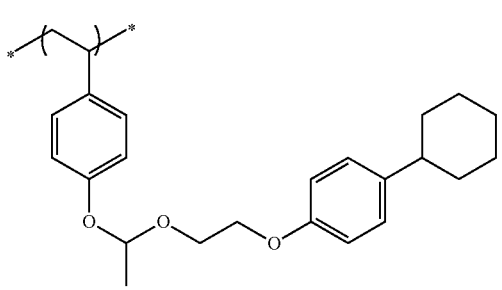
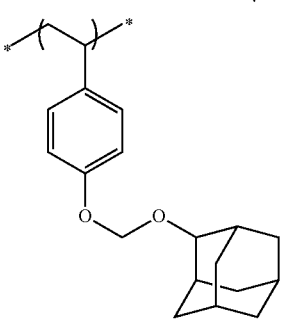

37
-continued
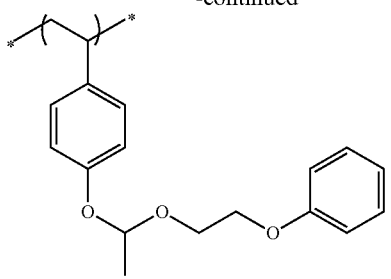
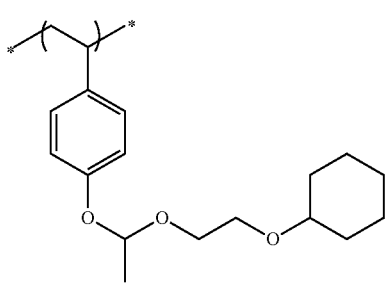
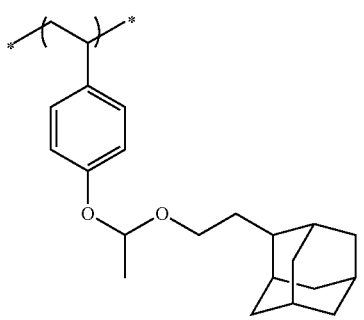
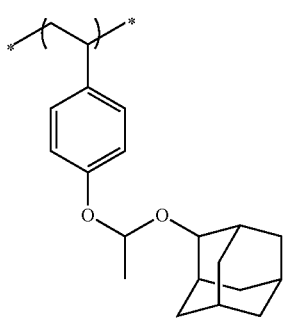
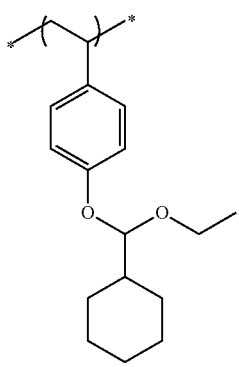
38
-continued
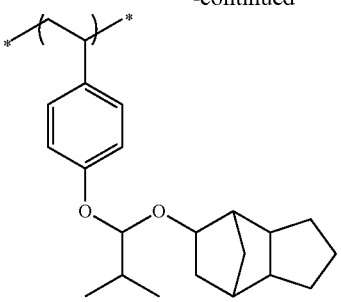
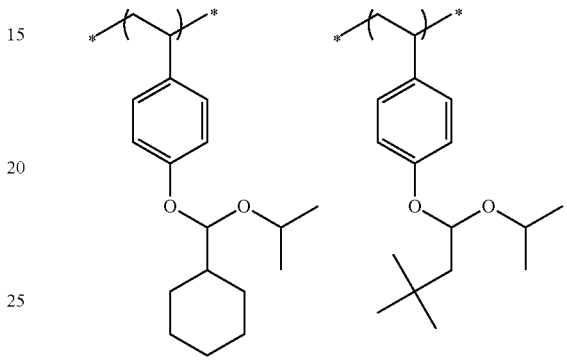
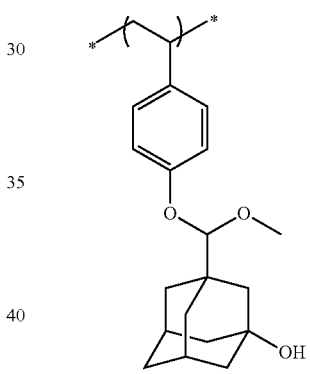
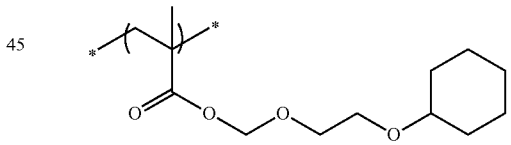
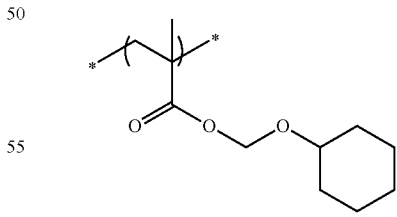
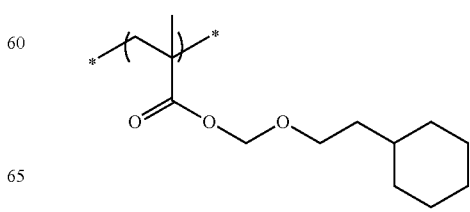

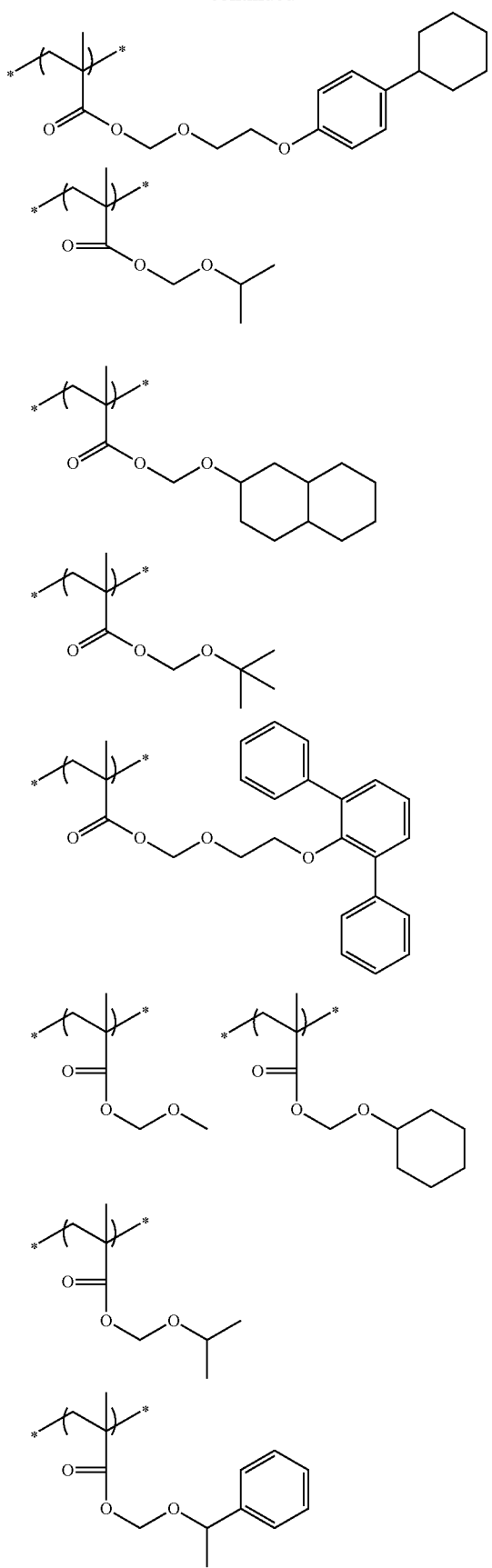
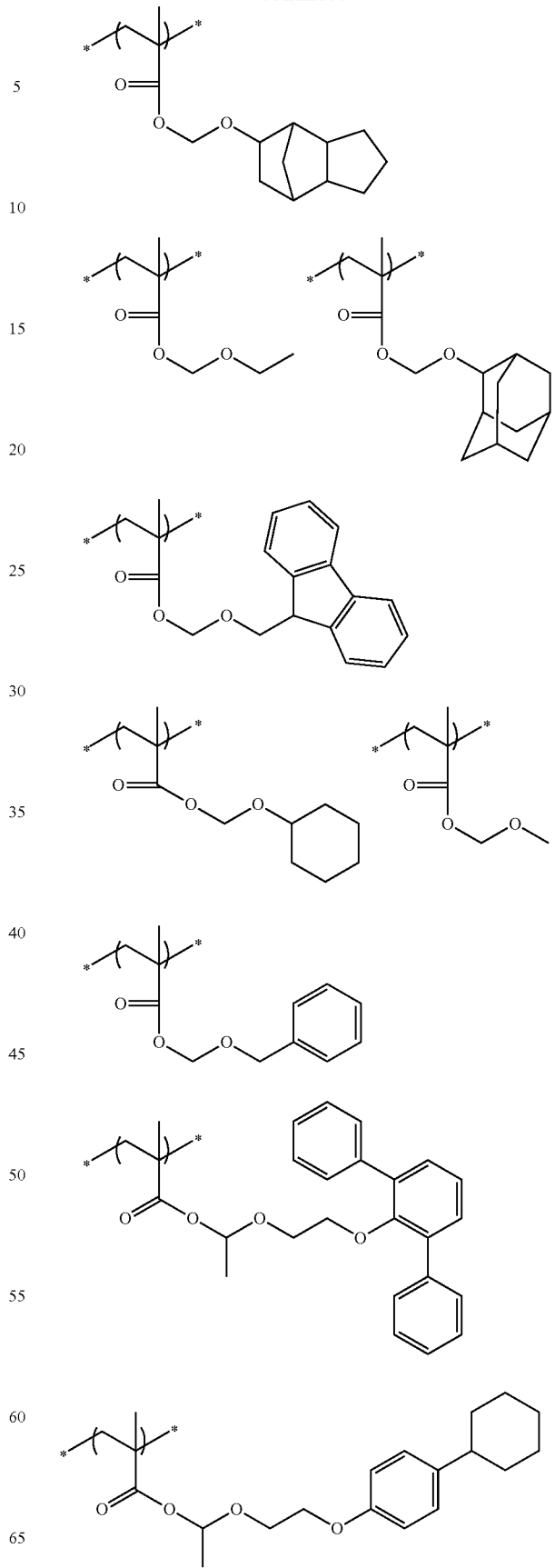

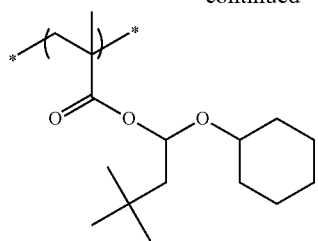
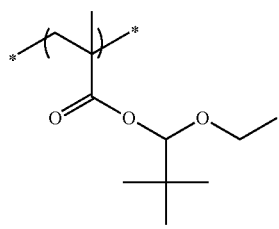
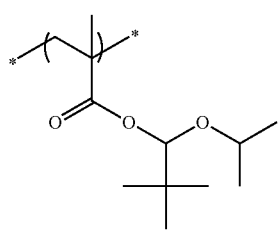
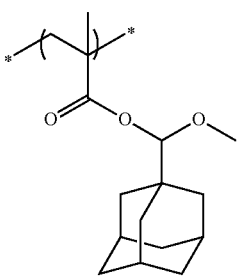
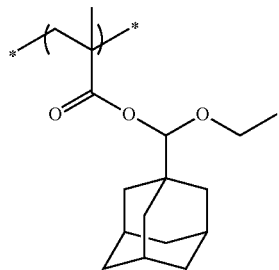
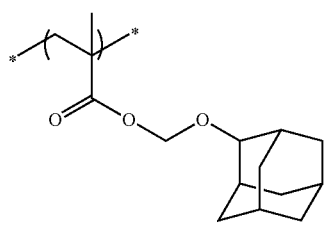
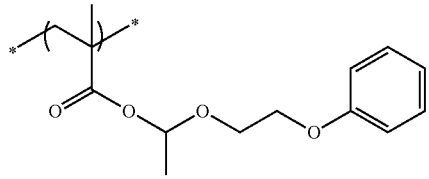
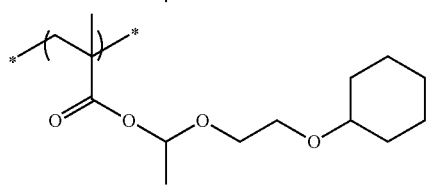
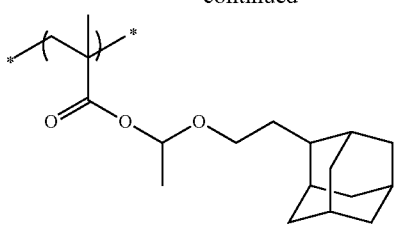
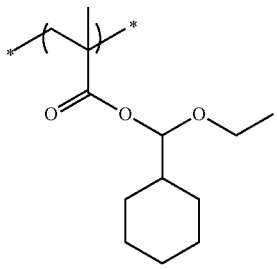
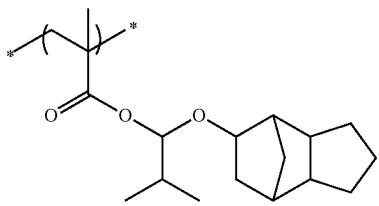
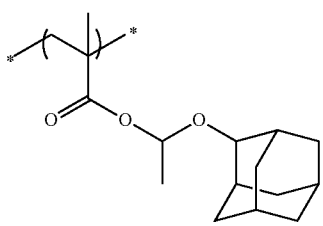
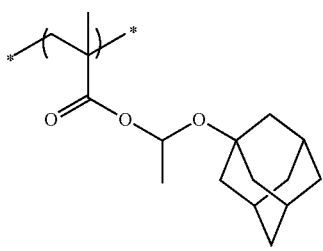
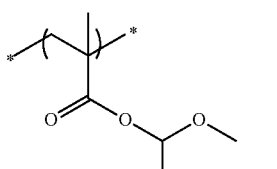
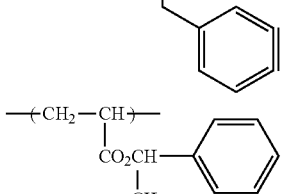
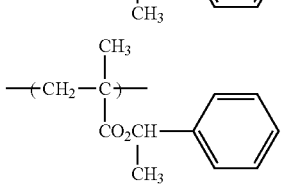

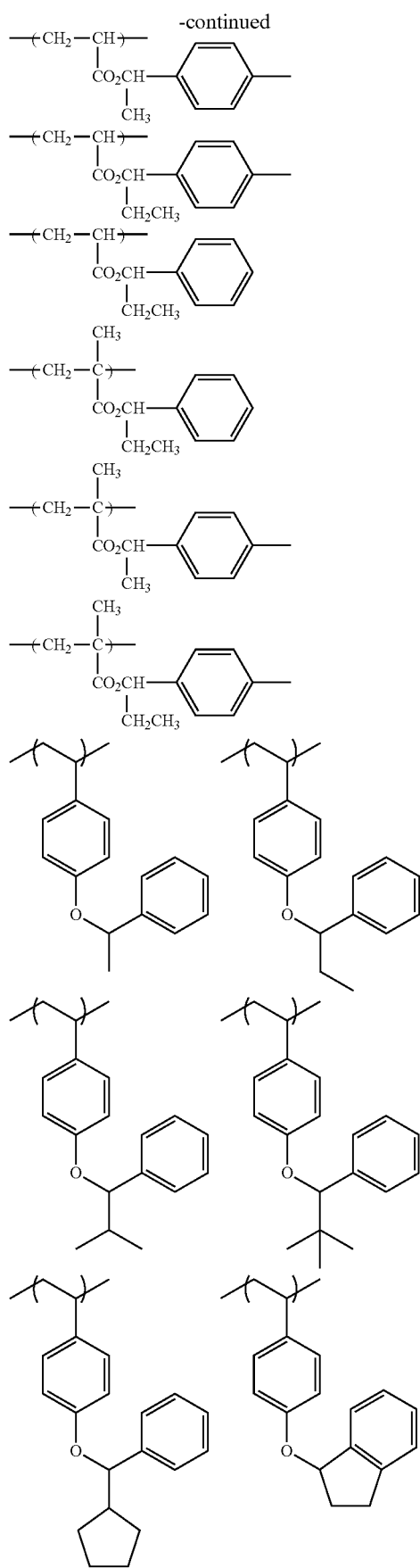

-continued

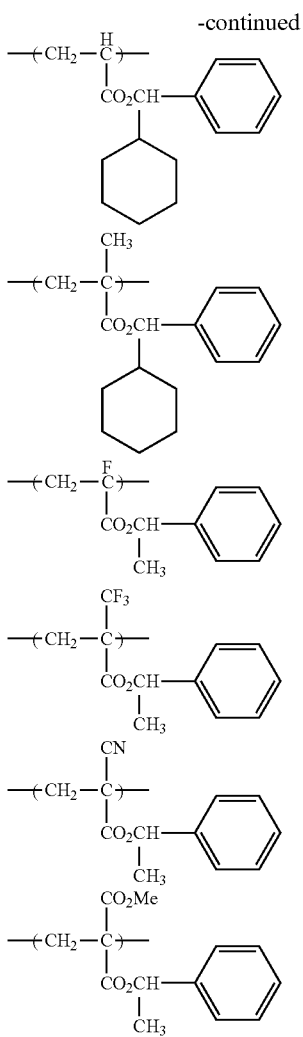

The repeating unit having an acid-decomposable group may be used singly or in combination of two or more kinds thereof.

The content of the repeating unit (a total thereof in a case where a plurality of kinds thereof are contained) having an acid-decomposable group in the resin (A) is preferably from 5% by mole to 80% by mole, more preferably from 5% by mole to 75% by mole, and still more preferably from 10% by mole to 65% by mole, the with respect to all the repeating units in the resin (A).

Moreover, in the present specification, a repeating unit having an acid-decomposable group and an aromatic ring group corresponds to both of a repeating unit having an acid-decomposable group and a repeating unit having an aromatic ring group.

[Repeating Unit Having Lactone Group or Sultone Group]

The resin (A) preferably contains a repeating unit having a lactone group or a sultone (cyclic sulfonic acid ester) group.

As the lactone group or sultone group, any group having a lactone structure or sultone structure can be used, and is preferably a group having a 5- to 7-membered ring lactone structure or sultone structure, with those having a 5- to 7-membered ring lactone structure or sultone structure to which another ring structure is fused so as to form a bicyclo structure or spiro structure being preferable.

The resin (A) still more preferably has a repeating unit having a lactone structure represented by any one of General Formulae (LC1-1) to (LC1-17), or a sultone structure represented by any one of General Formulae (SL1-1) to (SL1-3). Further, the group having a lactone structure or a sultone structure may be directly bonded to a main chain. A preferred lactone structure or sultone structure is a group represented by General Formula (LC1-1), (LC1-4), (LC1-5), (LC1-6), (LC1-13), or (LC1-14).

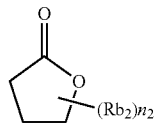
LC1-1

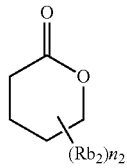
LC1-2

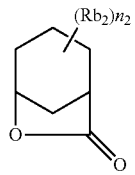
LC1-3

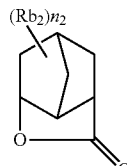
LC1-4

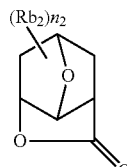
LC1-5

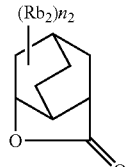
LC1-6

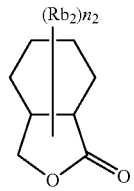
LC1-7

LC1-8
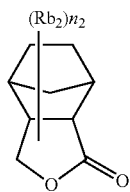

LC1-9
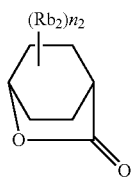

LC1-10
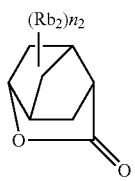

LC1-11
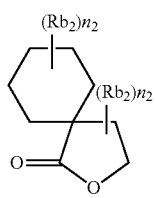

LC1-12
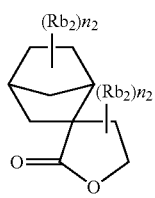

LC1-13
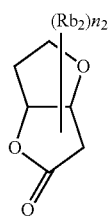

LC1-14
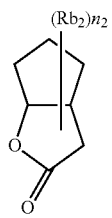

LC1-15
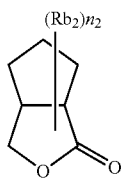

LC1-16
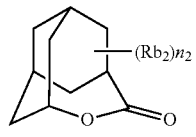

LC1-17
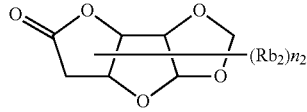

SL1-1
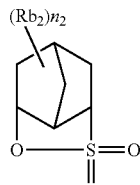

SL1-2
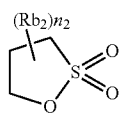

SL1-3
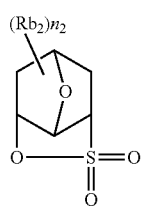

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, $Rb_2$'s which are present in plural numbers may be the same as or different from each other, and further, $Rb_2$'s which are present in plural numbers may be bonded to each other to form a ring.

Examples of the repeating unit having a group having a lactone structure represented by any one of General Formulae (LC1-1) to (LC1-17) or a sultone structure represented by any one of General Formulae (SL1-1) to (SL1-3) include a repeating unit represented by General Formula (AI).

(AI)

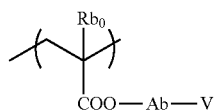

In General Formula (AI), $Rb_0$ represents a hydrogen atom, a halogen atom, or an alkyl group having 1 to 4 carbon atoms.

Preferred examples of the substituent which the alkyl group of $Rb_0$ may have include a hydroxyl group and a halogen atom.

Examples of the halogen atom of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Ab is preferably a single bond or a linking group represented by -$Ab_1$-$CO_2$—. $Ab_1$ is a linear or branched alkylene group or a monocyclic or polycyclic cycloalkylene group, and preferably a methylene group, an ethylene group, a cyclohexylene group, an adamantylene group, or a norbornylene group.

V represents a group represented by any one of General Formulae (LC1-1) to (LC1-17), and (SL1-1) to (SL1-3).

As the repeating unit having a lactone group or a sultone group, an optical isomer thereof is usually present, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

Specific examples of the repeating unit having a lactone group or a sultone group are shown below, but the present invention is not limited thereto.

(in the formula, Rx represents H, $CH_3$, $CH_2OH$, or $CF_3$)

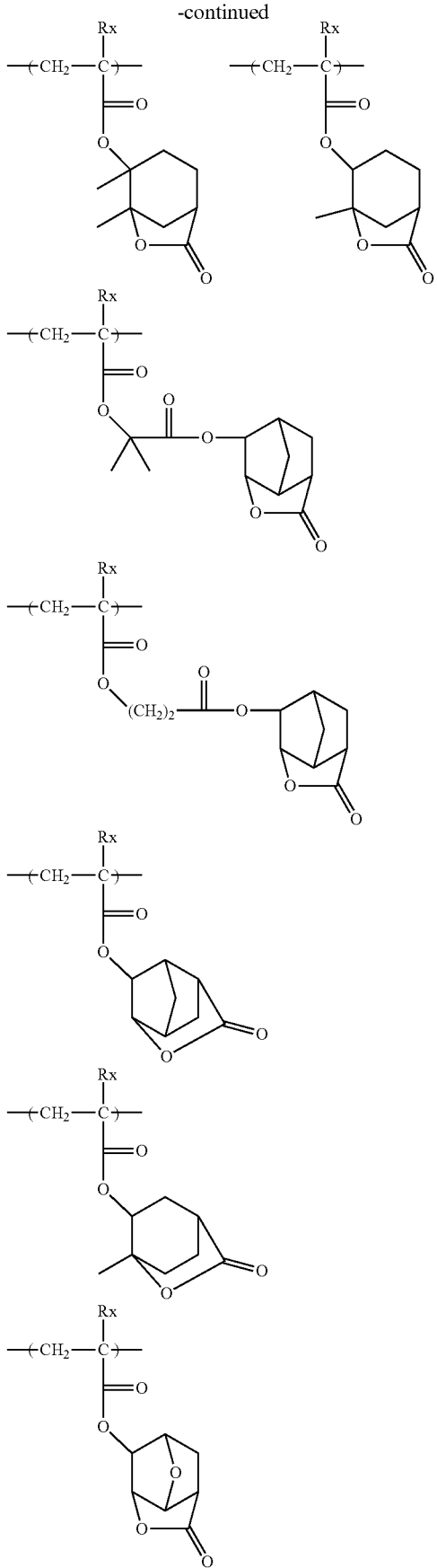

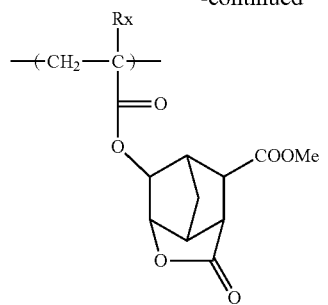
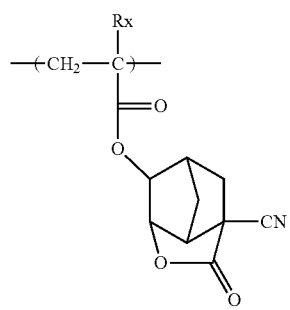
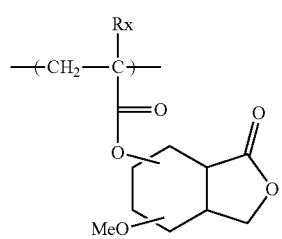
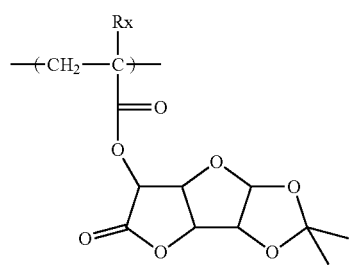
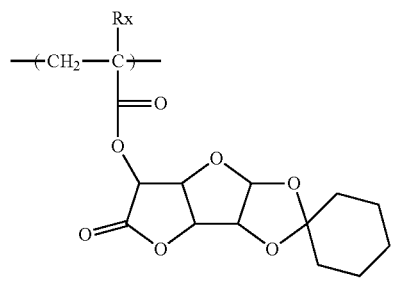
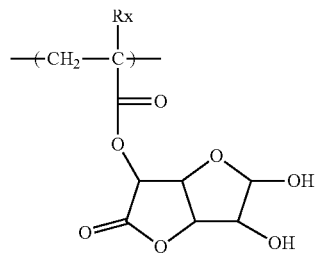

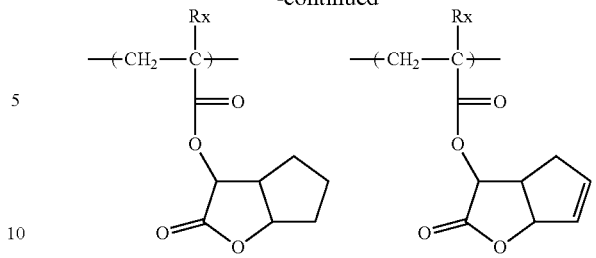
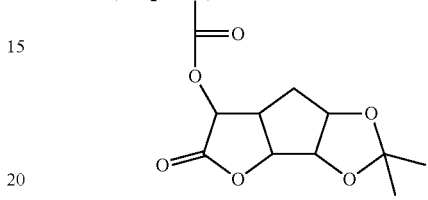
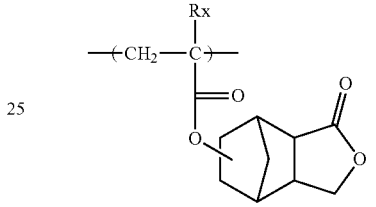
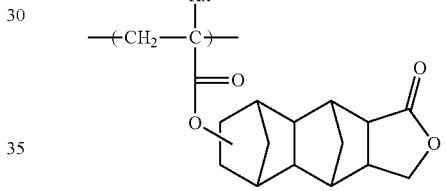
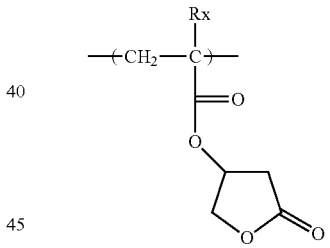

The content of the repeating unit having a lactone group or a sultone group is preferably 1% to 30% by mole, more preferably 5% to 25% by mole, and still more preferably 5% to 20% by mole, with respect to all the repeating units in the resin (A).

[Other Repeating Units]

The resin (A) can further have a repeating unit containing an organic group having a polar group, in particular, a repeating unit having an alicyclic hydrocarbon structure substituted with a polar group.

Thus, substrate adhesiveness and developer affinity are improved. As the alicyclic hydrocarbon structure substituted with a polar group, an adamantyl group, a diadamantyl group, or a norbornane group is preferable. As the polar group, a hydroxyl group or a cyano group is preferable. Specific examples of the repeating unit having a polar group are shown below, but the present invention is not limited thereto.

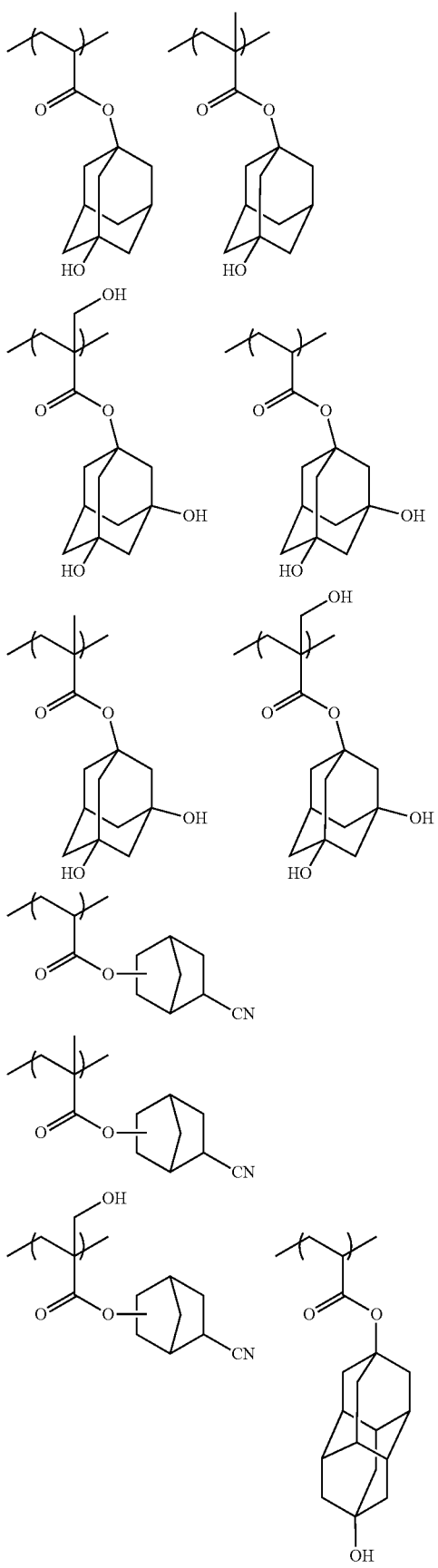
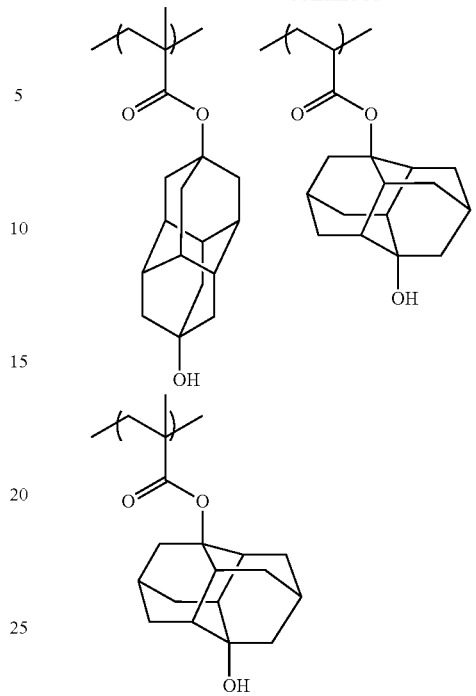

In a case where the resin (A) has a repeating unit containing an organic group having a polar group, the content of the repeating unit containing an organic group having a polar group is preferably 1% to 30% by mole, more preferably 5% to 25% by mole, and still more preferably 5% to 20% by mole, with respect to all the repeating units in the resin (A).

Furthermore, the resin (A) may further include, as other repeating units, a repeating unit having a group capable of generating an acid upon irradiation with actinic rays or radiation (photoacid-generating group). In this case, it can be thought that the repeating unit having a photoacid-generating group corresponds to a compound (B) capable of generating an acid upon irradiation with actinic rays or radiation which will be described later.

Examples of such a repeating unit include a repeating unit represented by General Formula (4).

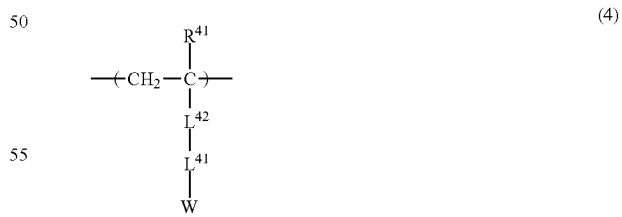

(4)

$R^{41}$ represents a hydrogen atom or a methyl group. $L^{41}$ represents a single bond or a divalent linking group. $L^{42}$ represents a divalent linking group. W represents a structural site capable of decomposing upon irradiation with actinic rays or radiation to generate an acid in a side chain.

Specific examples of the repeating unit represented by General Formula (4) are shown below, but the present invention is not limited thereto.

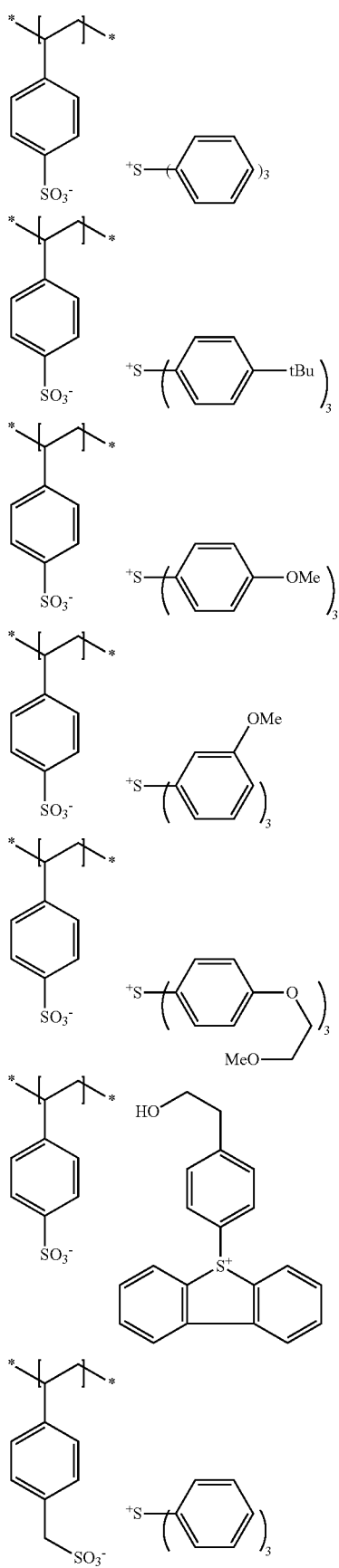
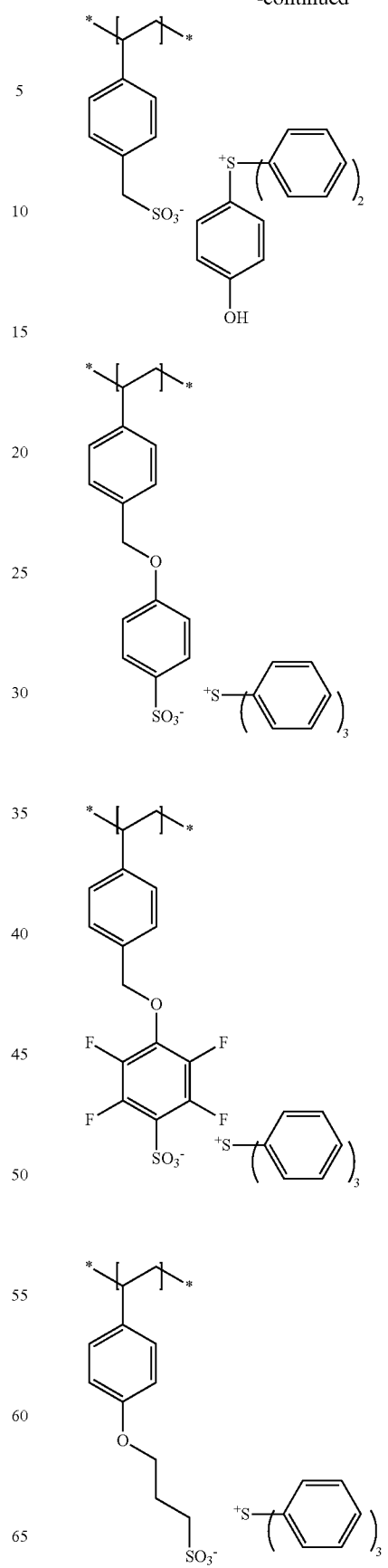

-continued

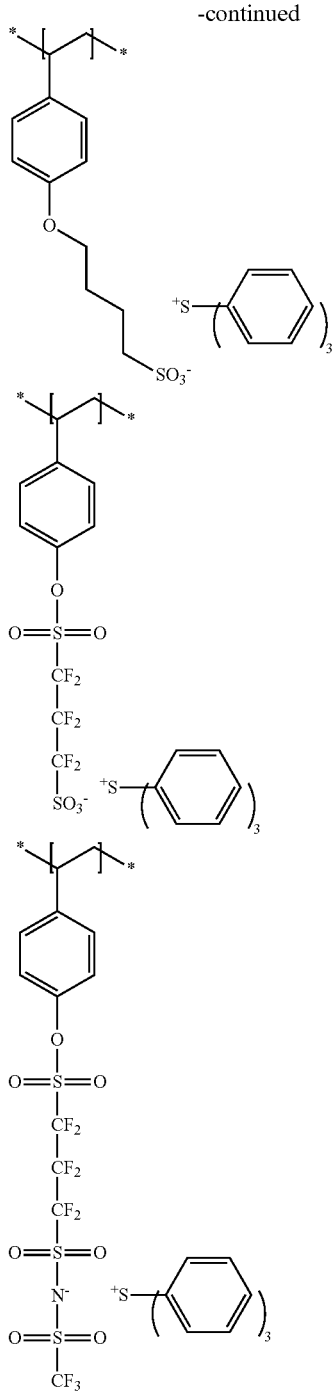

Other examples of the repeating unit represented by General Formula (4) include the repeating units described in paragraphs [0094] to [0105] of JP2014-041327A.

In a case where the resin (A) contains a repeating unit having a photoacid-generating group, the content of the repeating unit having a photoacid-generating group is preferably 1% to 40% by mole, more preferably 5% to 35% by mole, and still more preferably 5% to 30% by mole, with respect to all the repeating units in the resin (A).

The resin (A) can be synthesized in accordance with an ordinary method (for example, radical polymerization). Examples of the general synthesis method include a batch polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable.

Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethyl formamide and dimethyl acetamide; and a solvent in which the resist composition of the present invention is dissolved, such as propylene glycol monomethyl ether acetate, propylene glycol monomethyl ether, and cyclohexanone. It is more preferable to perform polymerization using the same solvent as the solvent used in the resist composition of the present invention. Thus, generation of the particles during storage can be suppressed.

It is preferable that the polymerization reaction is carried out in an inert gas atmosphere such as nitrogen and argon. As the polymerization initiator, commercially available radical initiators (an azo-based initiator, a peroxide, or the like) are used to initiate the polymerization. As the radical initiator, an azo-based initiator is preferable, and the azo-based initiator having an ester group, a cyano group, or a carboxyl group is more preferable. Preferred examples of the initiator include azobisisobutyronitrile, azobisdimethylvaleronitrile, and dimethyl 2,2'-azobis(2-methyl propionate). The initiator is added or added in portionwise, as desired, and after the reaction is completed, a desired polymer is recovered by pouring the reaction mixture into a solvent, and using method such as powder or solid recovery. The reaction concentration is 5% to 50% by mass, and preferably 10% to 45% by mass.

The reaction temperature is usually 10° C. to 150° C., preferably 30° C. to 120° C., and more preferably 60° C. to 100° C.

For purification, ordinary methods can be applied, such as a liquid-liquid extraction method of applying water washing or combining appropriate solvents to remove residual monomer or oligomer components; a purification method in a solution state, such as ultrafiltration of extracting and removing only polymers having a molecular weight not more than a specific value; a re-precipitation method of adding dropwise the resin solution in a poor solvent to solidify the resin in the poor solvent and thereby remove residual monomers and the like; and a purification method in a solid state, such as washing of a resin slurry with a poor solvent after filtration of the slurry.

The weight-average molecular weight of the resin (A) is preferably 1,000 to 200,000, more preferably 3,000 to 20,000, and most preferably 5,000 to 15,000 as a value in terms of polystyrene by means of a GPC method. By setting the weight-average molecular weight to 1,000 to 200,000, it is possible to prevent the deterioration of heat resistance or dry-etching resistance, and also prevent the deterioration of developability or the deterioration of film forming properties due to increased viscosity.

In another particularly preferred embodiment of the weight-average molecular weight of the resin (A), the weight-average molecular weight is 3,000 to 9,500 as a value in terms of polystyrene by means of a GPC method.

A dispersity (molecular weight distribution) in the range of usually 1 to 5, preferably 1 to 3, still more preferably 1.2 to 3.0, and particularly preferably 1.2 to 2.0 is used. As the dispersity is smaller, the resolution and the resist shape are better, the side wall of the resist pattern is smooth, and the roughness is excellent.

In the resist composition, the content of the resin (A) is preferably 50% to 99.9% by mass, and more preferably 60% to 99.0% by mass, with respect to the total solid content.

In addition, in the resist composition, the resin (A) may be used singly or in combination of two or more kinds thereof.

<(B) Compound Capable of Generating Acid with Actinic Rays or Radiation>

The resist composition preferably contains a compound capable of generating an acid with actinic rays or radiation (also referred to as a "photoacid generator «PAG»" or a "compound (B)").

The photoacid generator may be in a form of a low molecular compound or in a form of being introduced into a part of a polymer. Further, a combination of the form of a low molecular compound and the form of being introduced into a part of a polymer may also be used.

In a case where the photoacid generator is in the form of a low molecular compound, the molecular weight thereof is preferably 3,000 or less, more preferably 2,000 or less, and still more preferably 1,000 or less.

In a case where the photoacid generator is in the form of being introduced into a part of a polymer, it may be introduced into a part of the resin (A) or into a resin other than the resin (A).

In the present invention, the photoacid generator is preferably in the form of a low molecular compound.

Although the photoacid generator is not particularly limited as long as it is a known photoacid generator, the photoacid generator is preferably a compound capable of generating an organic acid, for example, at least one of sulfonic acid, bis(alkylsulfonyl)imide, or tris(alkylsulfonyl)methide, upon irradiation with actinic rays or radiation, preferably electron beams or extreme ultraviolet rays.

More preferred examples of the photoacid generator include a compound represented by General Formula (ZI), (ZII), or (ZIII).

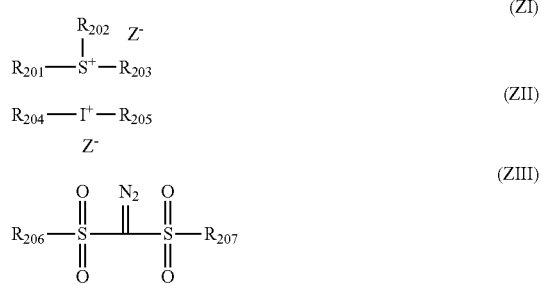

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents a non-nucleophilic anion (anion having an extremely low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and preferred examples thereof include a linear or branched alkyl group having 1 to 30 carbon atoms and a cycloalkyl group having 3 to 30 carbon atoms.

Preferred examples of the aromatic group in the aromatic sulfonate anion and aromatic carboxylate anion include an aryl group having 6 to 14 carbon atoms, such as a phenyl group, a tolyl group, and a naphthyl group.

The alkyl group, the cycloalkyl group, and the aryl group mentioned above may have a substituent. Specific examples of the substituent include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or the ring structure which is contained in each group may further have an alkyl group (preferably having 1 to 15 carbon atoms) as a substituent.

Preferred examples of the aralkyl group in the aralkyl carboxylate anion include an aralkyl group having 7 to 12 carbon atoms, such as a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with the fluorine atom and the fluorine atom-substituted alkyl group being preferable.

In addition, the alkyl groups in the bis(alkylsulfonyl) imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (still more preferably having 4 to 8 carbon atoms) or a fluorine atom-containing benzenesulfonate anion, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of the acid strength, the pKa of the acid generated is preferably −1 or less so as to improve the sensitivity.

Moreover, an anion represented by General Formula (AN1) may also be mentioned as a preferred embodiment of the non-nucleophilic anion.

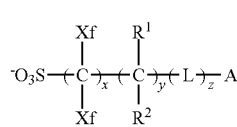

(AN1)

In the formula,

Xf's each independently represent a fluorine atom or an alkyl group substituted with at least one fluorine atom.

$R^1$ and $R^2$ each independently represent a hydrogen atom, a fluorine atom or an alkyl group, and $R^1$'s or $R^2$'s in a case where a plurality of $R^1$'s or $R^2$'s are present may be the same as or different from each other.

L represents a divalent linking group, and L's in a case where a plurality of L's are present may be the same as or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the fluorine atom-substituted alkyl group of Xf is preferably an alkyl group having 1 to 10 carbon atoms, and more preferably an alkyl group having 1 to 4 carbon atoms. Further, the fluorine atom-substituted alkyl group of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom and $CF_3$ are preferable. In particular, it is preferable that both Xf's are fluorine atoms.

The alkyl group of each of $R^1$ and $R^2$ may have a substituent (preferably a fluorine atom) and is preferably an alkyl group having 1 to 4 carbon atoms, and more preferably a perfluoroalkyl group having 1 to 4 carbon atoms. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

$R^1$ and $R^2$ are each preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group of L is not particularly limited and examples thereof include —COO—, —OCO—, —CO—, —O—, —S—, —SO—, —SO₂—, an alkylene group, a cycloalkylene group, an alkenylene group, and a linking group formed by combining a plurality thereof. A linking group having a total carbon number of 12 or less is preferable. Among these, —COO—, —OCO—, —CO—, and —O— are preferable, and —COO— and —OCO— are more preferable.

The cyclic organic group of A is not particularly limited as long as it has a cyclic structure, and examples thereof include an alicyclic group, an aryl group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable from the viewpoint that the diffusibility in the film in a heating step after exposure can be suppressed and MEEF can be improved.

Examples of the aryl group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among these, heterocyclic groups derived from a furan ring, a thiophene ring and a pyridine ring are preferable.

Moreover, other examples of the cyclic organic group include a lactone structure, and specific examples thereof include lactone structures represented by General Formulae (LC1-1) to (LC1-17).

The cyclic organic group may have a substituent, and examples of the substituent include an alkyl group (may be in any one of linear, branched, and cyclic forms; preferably having 1 to 12 carbon atoms), a cycloalkyl group (may be in any one of monocyclic, polycyclic, and spirocyclic forms; preferably having 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

Examples of the organic group of $R_{201}$, $R_{202}$, and $R_{203}$ include an aryl group, an alkyl group, and a cycloalkyl group.

It is preferable that at least one of three members $R_{201}$, $R_{202}$, or $R_{203}$ is an aryl group, and it is more preferable that all of these three members are an aryl group. The aryl group may be a heteroaryl group such as indole residue and pyrrole residue, other than a phenyl group, a naphthyl group and the like. The alkyl group and the cycloalkyl group of $R_{201}$ to $R_{203}$ may be preferably a linear or branched alkyl group having 1 to 10 carbon atoms and a cycloalkyl group having 3 to 10 carbon atoms. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

In General Formulae (ZII) and (ZIII), $R_{204}$ to $R_{207}$ each independently represent an aryl group, an alkyl group, or a cycloalkyl group.

The aryl group, the alkyl group, and the cycloalkyl group of $R_{204}$ to $R_{207}$ are each the same as the groups mentioned as the aryl group, the alkyl group, and the cycloalkyl group of $R_{201}$ to $R_{203}$ in the compound (ZI).

The aryl group, the alkyl group, and the cycloalkyl group of $R_{204}$ to $R_{207}$ may have a substituent. Examples of the substituent include the substituents which may be included in the aryl group, the alkyl group, or the cycloalkyl group of $R_{201}$ to $R_{203}$ in the compound (ZI).

$Z^-$ represents a non-nucleophilic anion, and examples thereof include the same non-nucleophilic anions as those of $Z^-$ in General Formula (ZI).

In the present invention, from the viewpoint of preventing an acid generated by exposure from diffusing to the unexposed area, and thus, improving the resolution, the photoacid generator is preferably a compound capable of generating an acid in a size with a volume of 130 Å$^3$ or more (more preferably a sulfonic acid), more preferably a compound capable of generating an acid in a size with a volume of 190 Å$^3$ or more (more preferably a sulfonic acid), still more preferably a compound capable of generating an acid in a size with a volume of 270 Å$^3$ or more (more preferably sulfonic acid), and particularly preferably a compound capable of generating an acid in a size with a volume of 400 Å$^3$ or more (more preferably sulfonic acid), upon irradiation with electron beams or extreme ultraviolet rays. However, from the viewpoint of the sensitivity or the solubility in the coating solvent, the volume is preferably 2,000 Å$^3$ or less, and more preferably 1,500 Å$^3$ or less. The value of the volume was determined using "WinMOPAC" produced by Fujitsu Limited. That is, first, the chemical structure of the acid in each compound is input, next, using this structure as an initial structure, the most stable steric conformation of each acid is determined by molecular force field calculation according to an MM3 method, and then, molecular orbital calculation using a PM3 method is performed with respect to the most stable steric conformation, whereby the "accessible volume" of each acid can be calculated.

In the present invention, a photoacid generator capable of generating acids exemplified below upon irradiation with actinic rays or radiation is preferable. Further, in some of these examples, the calculated value of volume (unit: Å$^3$) is shown together. Incidentally, the calculated value obtained here is a volume value of an acid where a proton is bonded to the anion moiety.

1 Å is $1 \times 10^{-10}$ m.

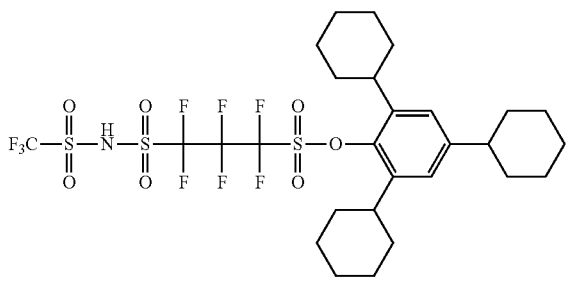

585Å$^3$

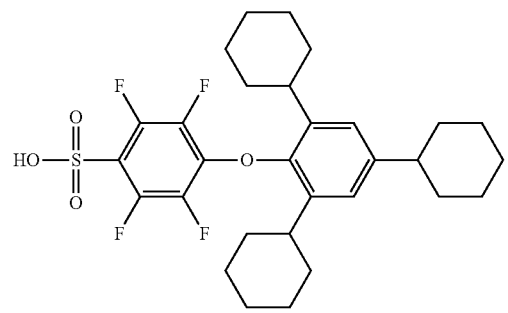

585Å$^3$

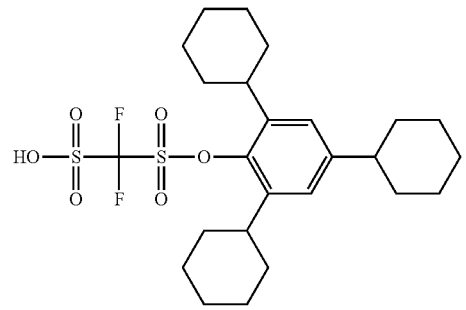

525Å$^3$

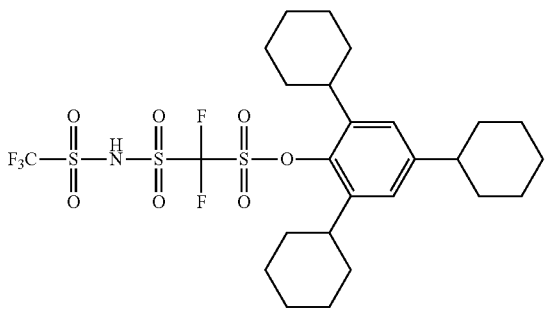

554Å$^3$

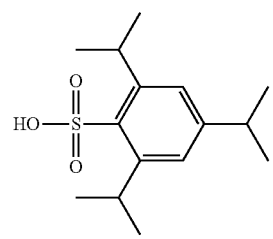

303Å$^3$

65
-continued
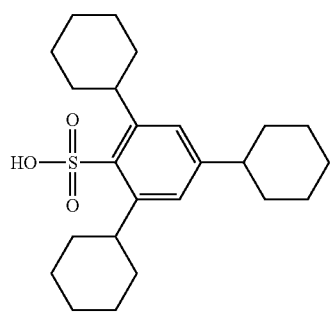
437Å³
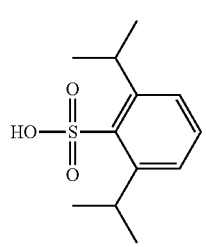
244Å³
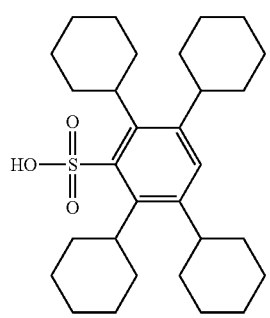
529Å³
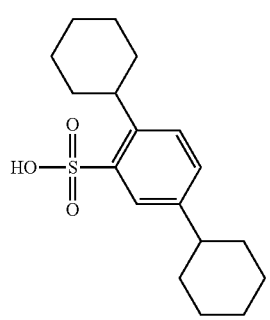
336Å³
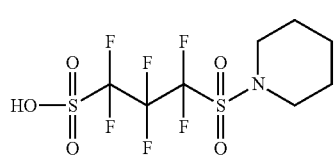
244Å³
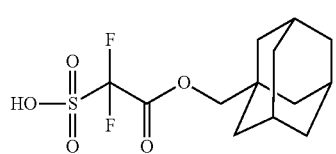
271Å³
66
-continued
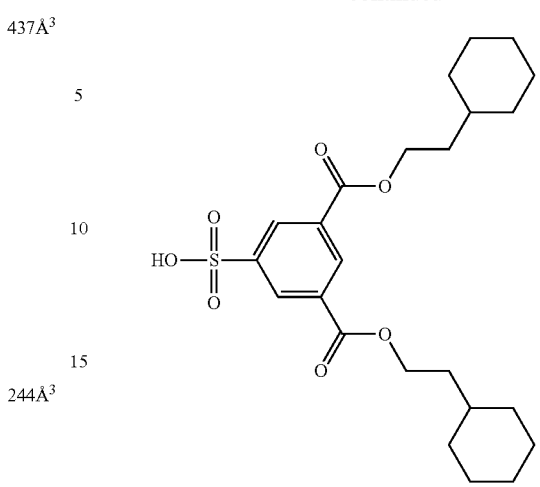
457Å³
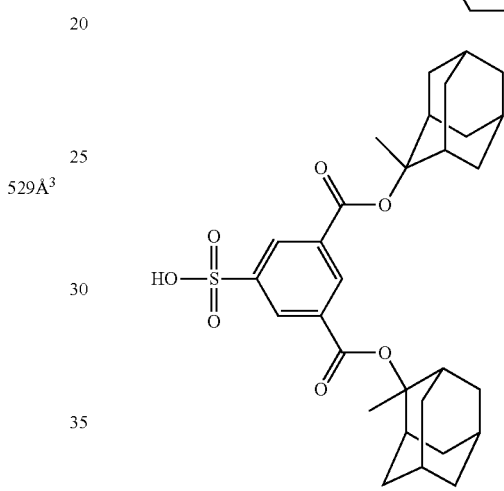
511Å³
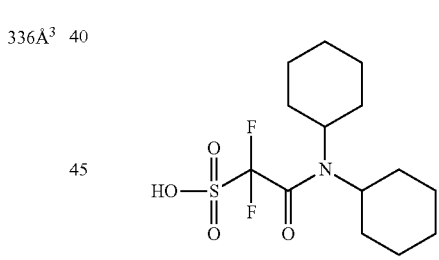
311Å³
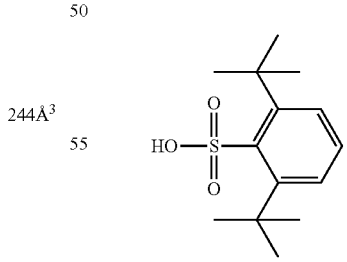
280Å³
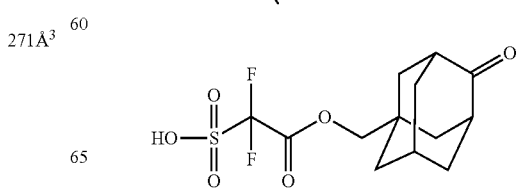
266Å³

| 67 -continued | | 68 -continued | |
|---|---|---|---|
| 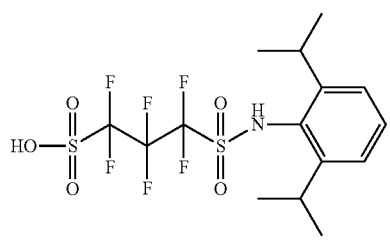 | 339Å³ | 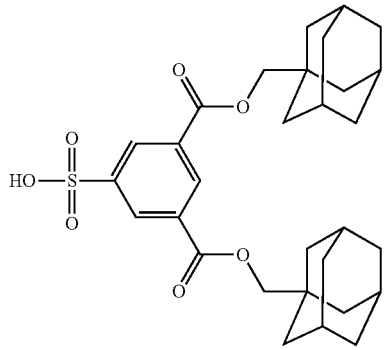 | 519Å³ |
| 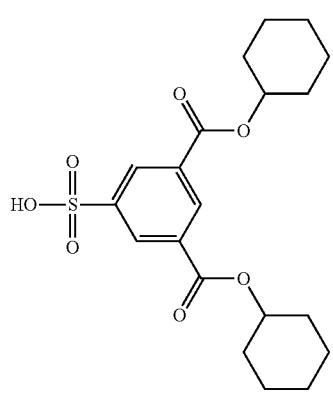 | 380Å³ | 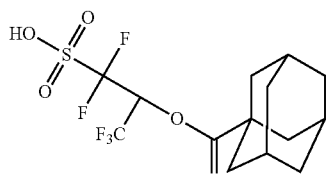 | 291Å³ |
| 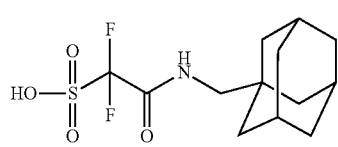 | 277Å³ | 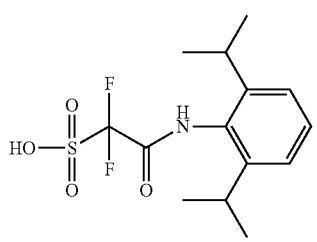 | 297Å³ |
| 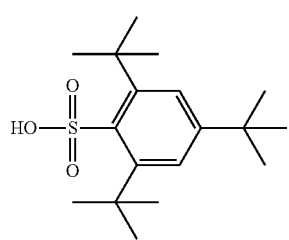 | 357Å³ | 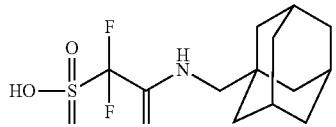 | 277Å³ |
| 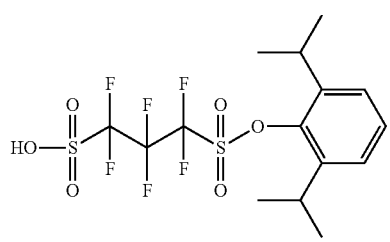 | 347Å³ | 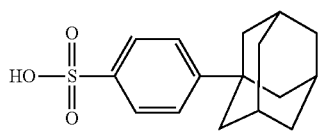 | 281Å³ |
| 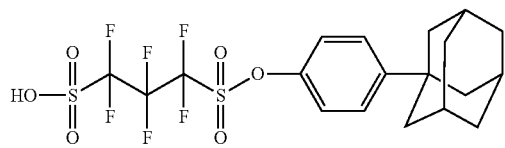 | 380Å³ | 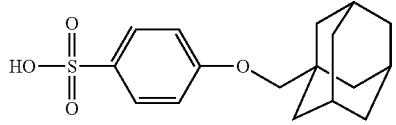 | 310Å³ |
| | | 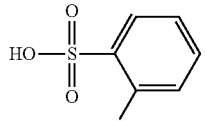 | 309Å³ |

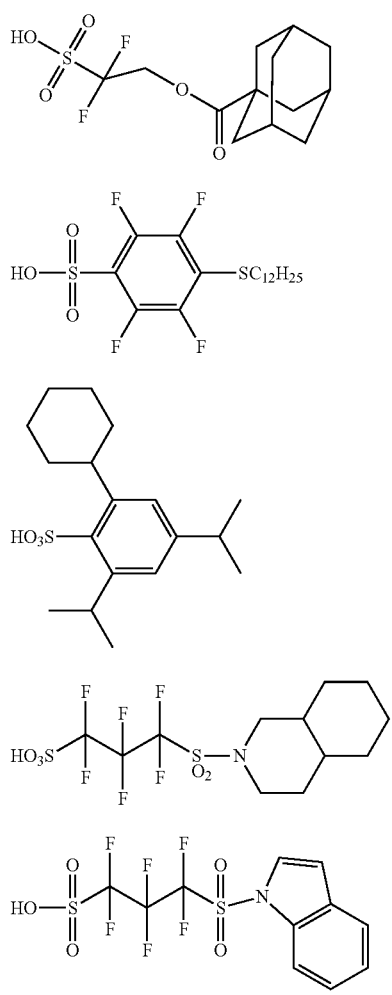
270Å³
393Å³
350Å³
311Å³
250Å³
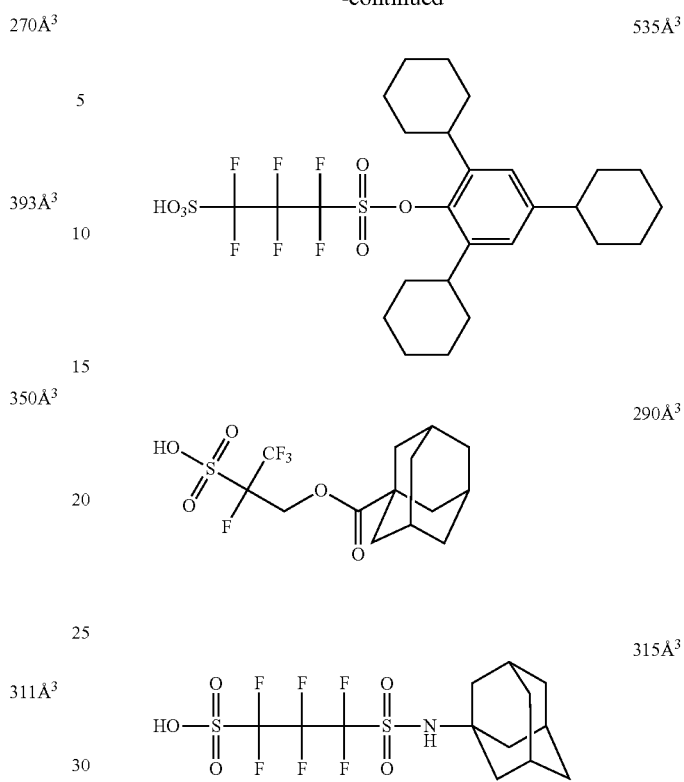
535Å³
290Å³
315Å³
With regard to the photoacid generator, reference can be made to paragraphs [0368] [0377] of JP2014-41328A, and paragraphs [0240] to [0262] of JP2013-228681A ([0339] of the corresponding US2015/004533A), the contents of which are incorporated herein. Further, specific preferred examples thereof include the following compounds, but are not limited thereto.
(z1)
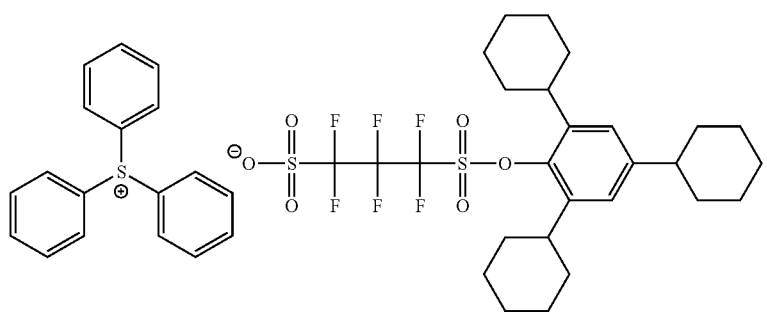
(z2)
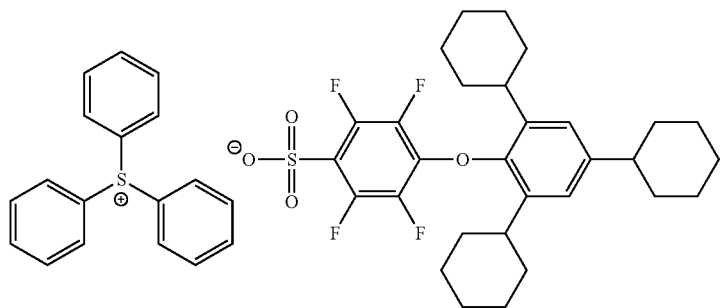

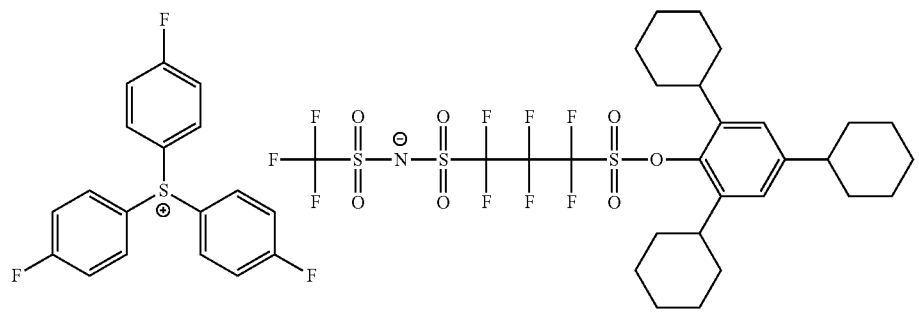
(z3)
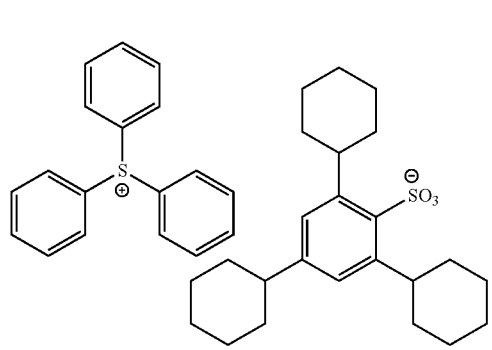
(z4)
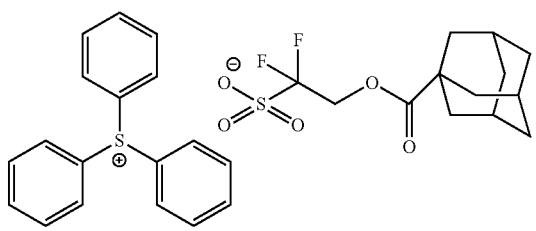
(z5)
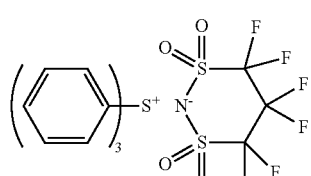
(z6)
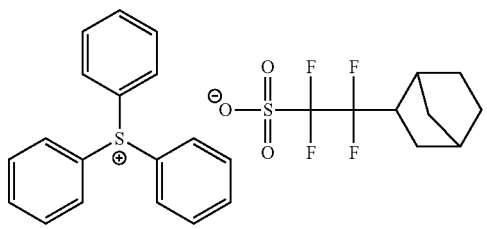
(z7)
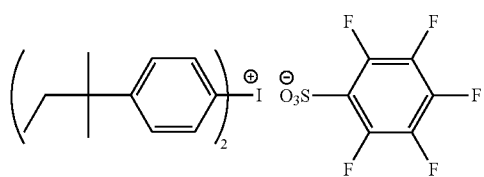
(z8)
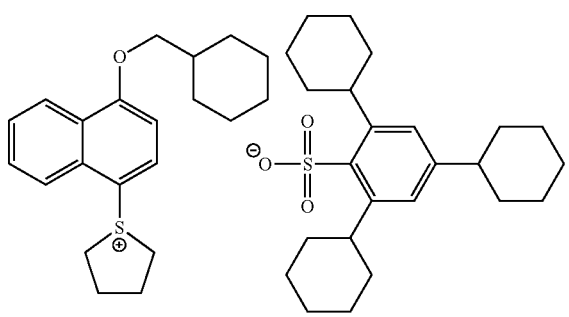
(z9)
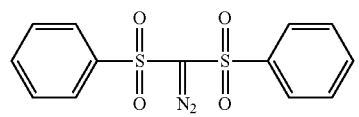
(z10)

-continued
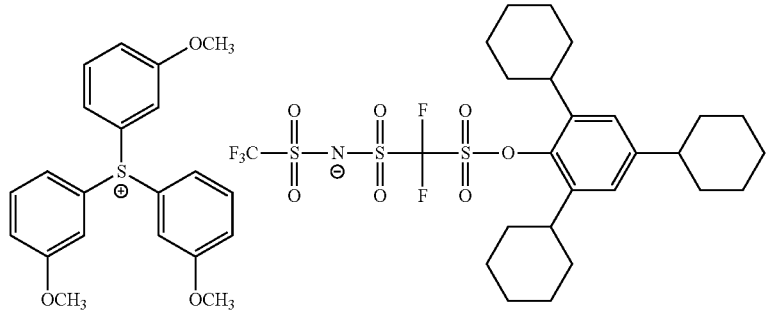
(z11)
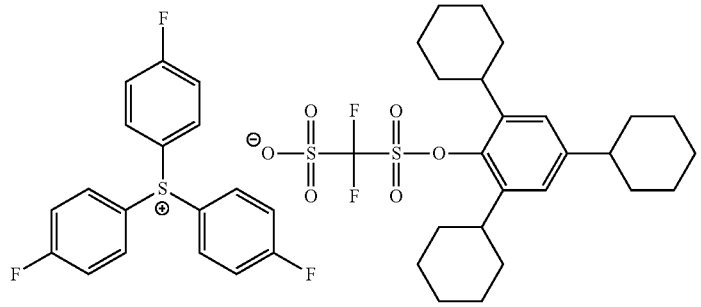
(z12)
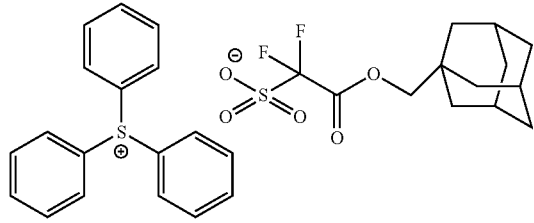
(z13)
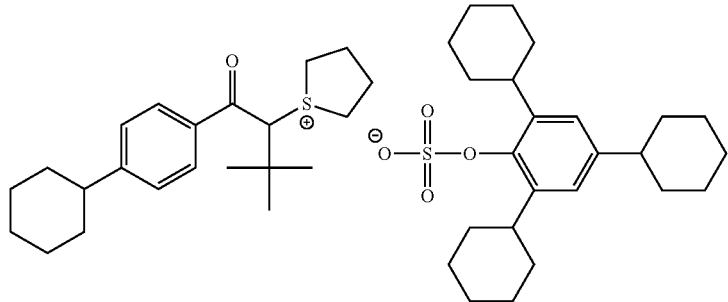
(z14)
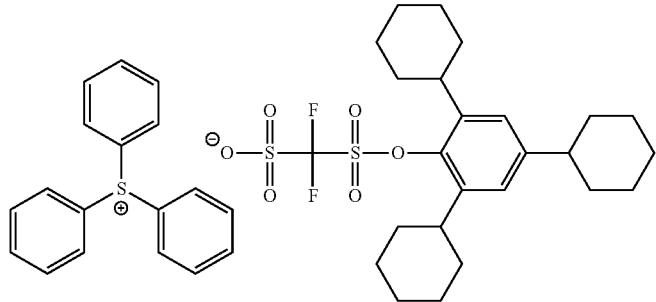
(z15)

-continued
(z16)
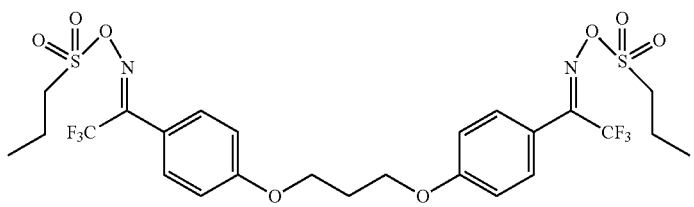
(z17)
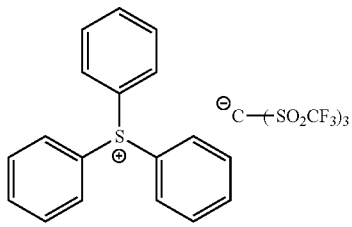
(z18)
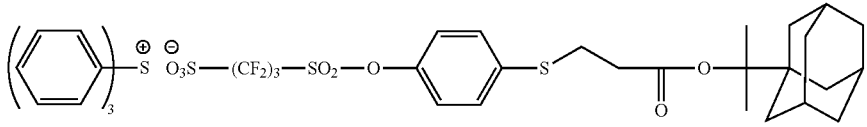
(z19)
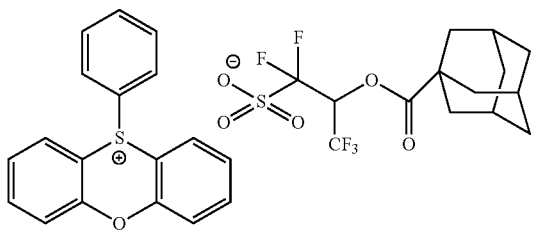
(z20)
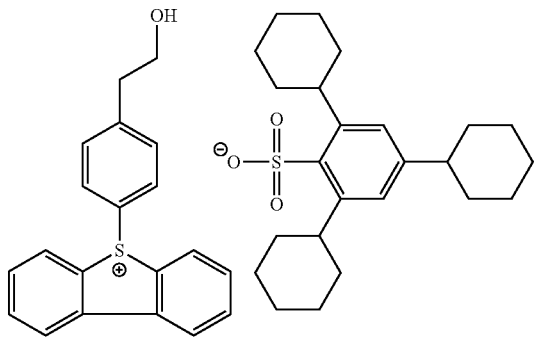
(z21)
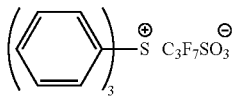
(z22)
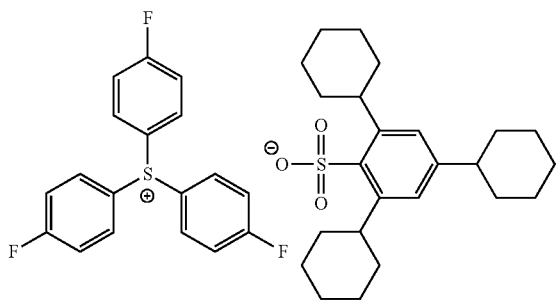
(z23)
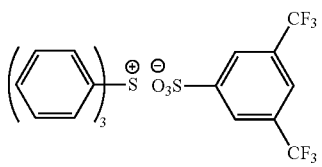
(z24)
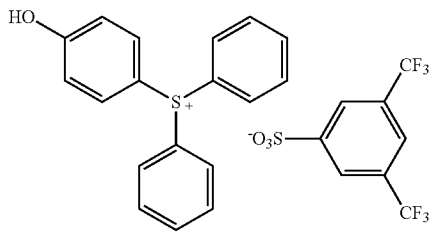
(z25)
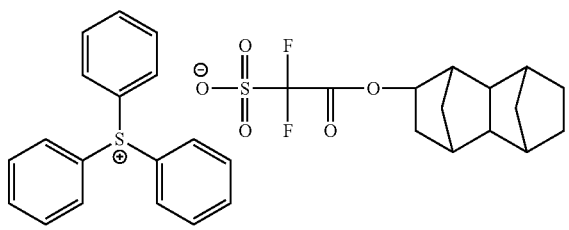

(z26)
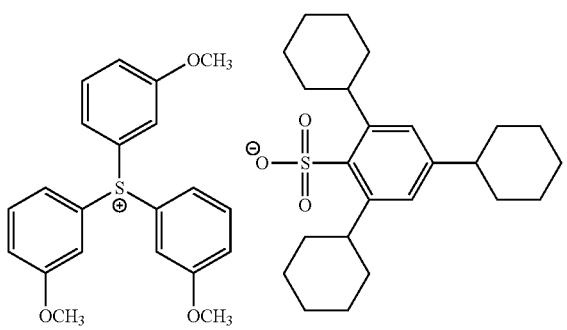
(z27)
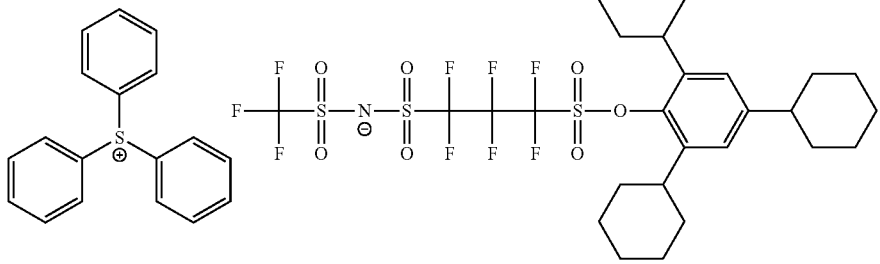
(z28)
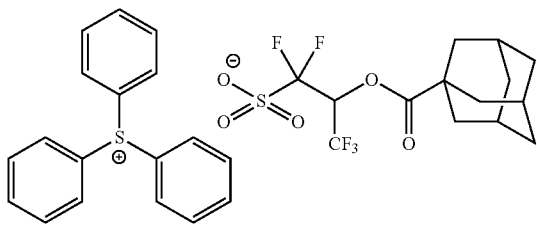
(z29)
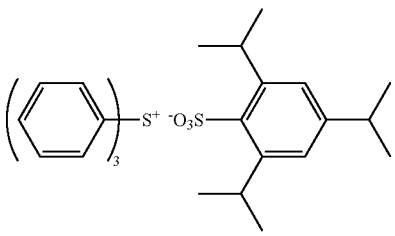
(z30)
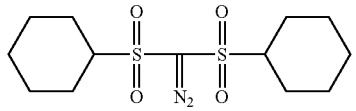
(z31)
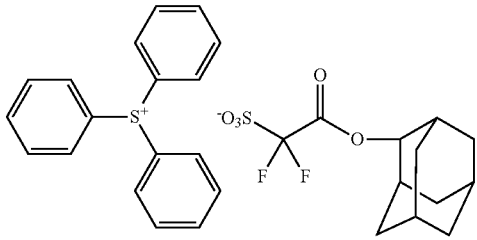
(z32)
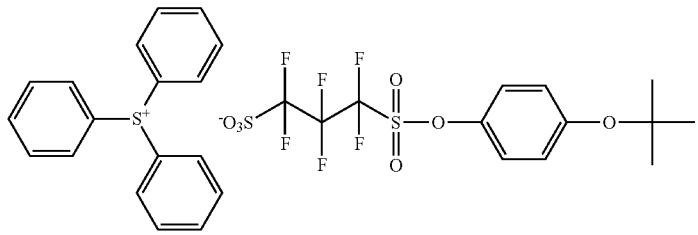

-continued

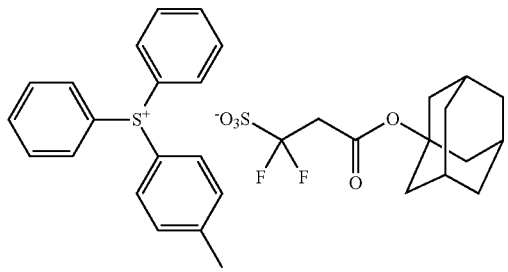 (z33)

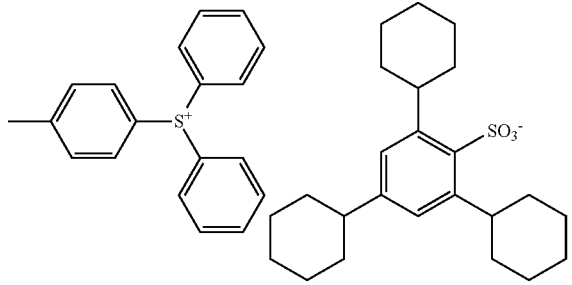 (z34)

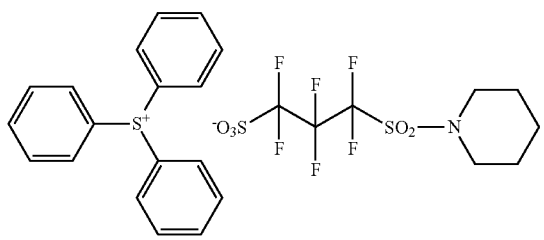 (z35)

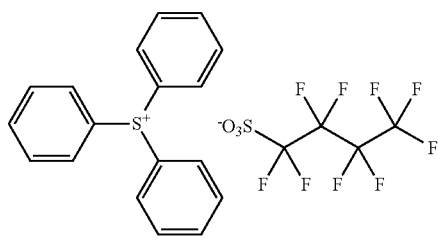 (z36)

The photoacid generators may be used singly or in combination of two or more kinds thereof.

The content of the photoacid generator in the resist composition is preferably 0.1% to 50% by mass, more preferably 5% to 50% by mass, and still more preferably 8% to 40% by mass, with respect to the total solid content of the composition. In particular, in order to satisfy both high sensitivity and high resolution upon exposure using electron beams or extreme ultraviolet rays, the content of the photoacid generator is preferably high, more preferably 10% to 40% by mass, and most preferably 10% to 35% by mass.

<(C) Crosslinking Agent>

The resist composition of the present invention can contain a crosslinking agent (hereinafter also referred to as a "compound (C)").

In this case, the resist composition of the present invention is usually a negative tone resist composition.

The crosslinking agent is typically a compound having an acid-crosslinkable group, which includes two or more hydroxymethyl groups or alkoxymethyl groups in a molecule thereof. Further, from the viewpoint of improving the line edge roughness (LER) performance, it is preferable that the crosslinking agent includes a methylol group.

The compound (C) may be in a form of a low molecular compound or in a form of being introduced into a part of a polymer. Further, a combination of the form of a low molecular compound and the form of being introduced into a part of a polymer may also be used.

In a case where the compound (C) is in the form of a low molecular compound, the molecular weight thereof is preferably 3,000 or less, more preferably 2,000 or less, and still more preferably 1,000 or less.

First, a case where the compound (C) is a low molecular compound (hereinafter also referred to as a "compound (C')") will be described. Preferred examples of the compound (C') include hydroxymethylated or alkoxymethylated phenol compounds, alkoxymethylated melamine-based compounds, alkoxymethyl glycoluril-based compounds, and alkoxymethylated urea-based compounds. Particularly preferred examples of the compound (C') include a phenol derivative which contains 3 to 5 benzene rings per molecule, has a total of two or more hydroxymethyl groups or alkoxymethyl groups, and has a molecular weight of 1,200 or less, and an alkoxymethyl glycoluril derivative.

The alkoxymethyl group is preferably a methoxymethyl group or an ethoxymethyl group.

Among the examples of the compound (C'), the phenol derivative having a hydroxymethyl group can be obtained by reacting a corresponding phenol compound having no hydroxymethyl group with formaldehyde in the presence of a base catalyst. Further, the phenol derivative having an alkoxymethyl group can be obtained by reacting a corresponding phenol derivative having a hydroxymethyl group with an alcohol in the presence of an acid catalyst.

Other preferred examples of the compound (C') include compounds having an N-hydroxymethyl group or an N-alkoxymethyl group, such as alkoxymethylated melamine-based compounds, alkoxymethyl glycoluril-based compounds, and alkoxymethylated urea-based compounds.

Examples of such compounds include hexamethoxymethylmelamine, hexaethoxymethylmelamine, tetramethoxymethyl glycoluril, 1,3-bismethoxymethyl-4,5-bismethoxyethyleneurea, and bismethoxymethylurea, which are disclosed in EP0,133,216A, DE3,634,671B, DE3,711,264B, and EP0,212,482A.

Among the specific examples of the compound (C'), particularly preferred are those shown below.

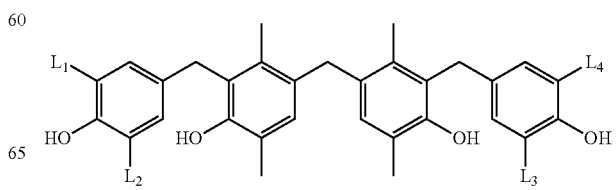

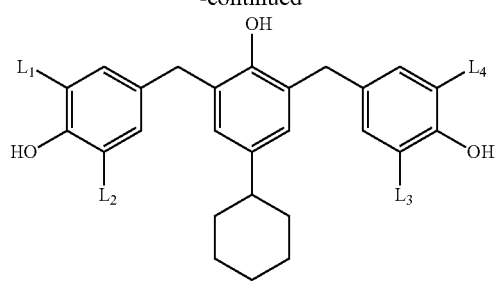
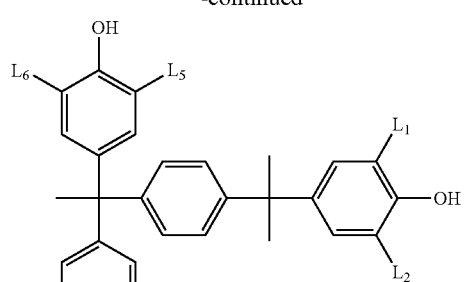
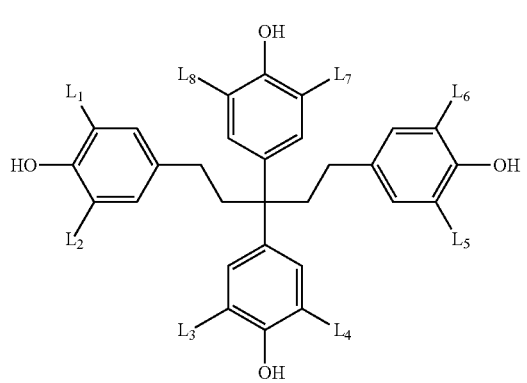
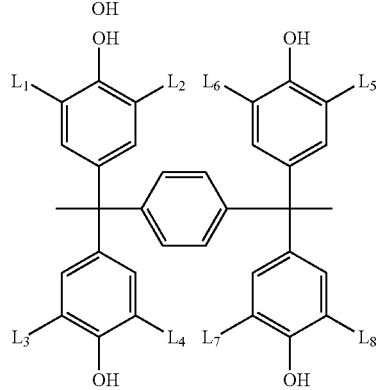
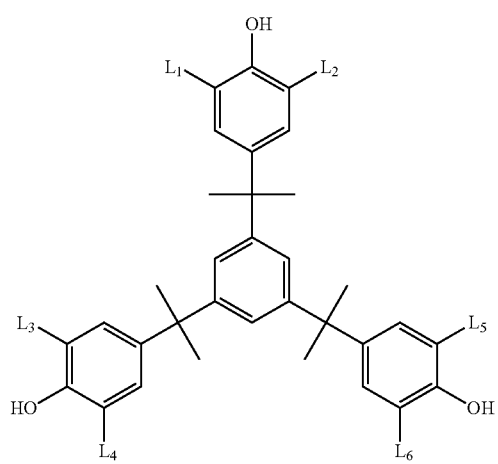
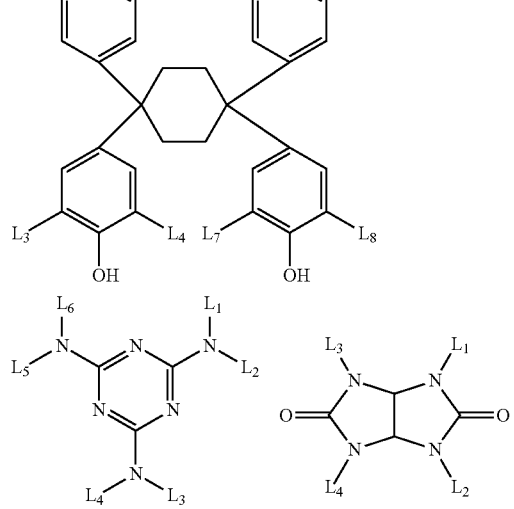
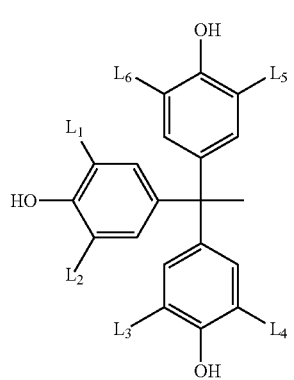
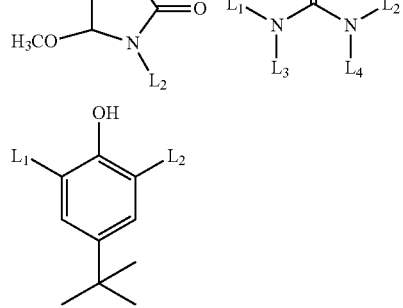

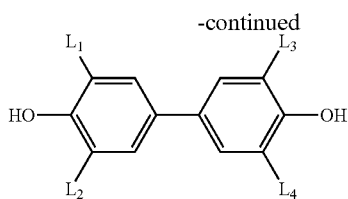

In the formulae, $L_1$ to $L_8$ each independently represent a hydrogen atom, a hydroxymethyl group, a methoxymethyl group, an ethoxymethyl group, or an alkyl group having 1 to 6 carbon atoms.

In one embodiment of the present invention, the compound (C') is preferably a compound represented by General Formula (I).

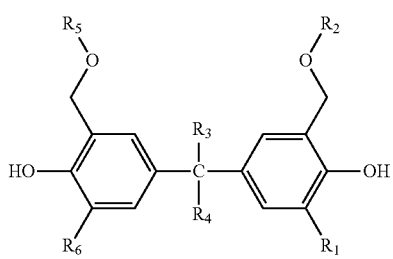

In General Formula (I), $R_1$ and $R_6$ each independently represent a hydrogen atom, or a hydrocarbon group having 5 or less carbon atoms.

$R_2$ and $R_5$ each independently represent an alkyl group, a cycloalkyl group, an aryl group, or an acyl group.

$R_3$ and $R_4$ each independently represent a hydrogen atom, or an organic group having 2 or more carbon atoms. $R_3$ and $R_4$ may be bonded to each other to form a ring.

In one embodiment of the present invention, $R_1$ and $R_6$ are each preferably a hydrocarbon group having 5 or less carbon atoms, more preferably a hydrocarbon group having 4 or less carbon atoms, and particularly preferably a methyl group, an ethyl group, a propyl group, or an isopropyl group.

As the alkyl group represented by $R_2$ and $R_5$, for example, an alkyl group having 1 to 6 carbon atoms is preferable, as the cycloalkyl group, for example, a cycloalkyl group having 3 to 12 carbon atoms is preferable, as the aryl group, for example, an aryl group having 6 to 12 carbon atoms is preferable, and as the acyl group, for example, an acyl group having 1 to 6 carbon atoms at the alkyl site is preferable.

In one embodiment of the present invention, $R_2$ and $R_5$ are each preferably an alkyl group, more preferably an alkyl group having 1 to 6 carbon atoms, and particularly preferably a methyl group.

Examples of the organic group having 2 or more carbon atoms represented by $R_3$ and $R_4$ include an alkyl group having 2 or more carbon atoms, a cycloalkyl group, and an aryl group, and further, $R_3$ and $R_4$ are preferably bonded to each other to form rings described in detail below.

Examples of the rings formed by the mutual bonding of $R_3$ and $R_4$ include an aromatic or non-aromatic hydrocarbon ring, an aromatic or non-aromatic heterocycle, or a polycyclic fused ring formed by combining two or more of these rings.

These rings may have a substituent and examples of such substituent include an alkyl group, a cycloalkyl group, an alkoxy group, a carboxyl group, an aryl group, an alkoxymethyl group, an acyl group, an alkoxycarbonyl group, a nitro group, a halogen, or a hydroxyl group.

Specific examples of a ring formed by the mutual bonding of $R_3$ and $R_4$ are shown below. * in the formulae represents a linking site to a phenol nucleus.

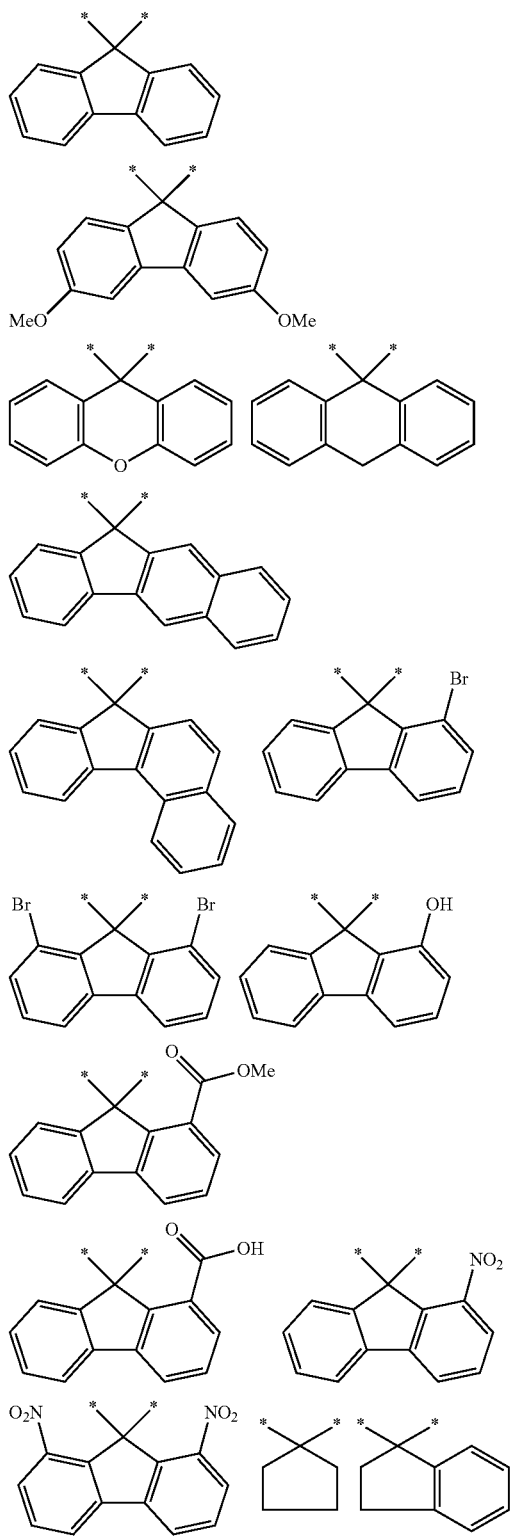

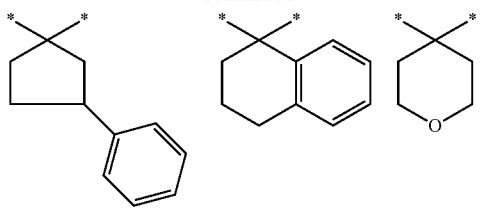

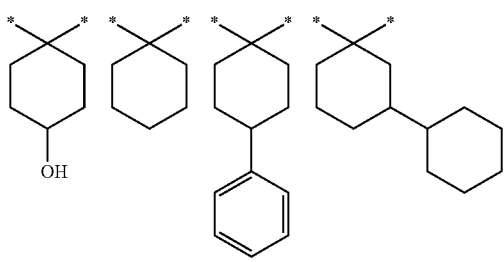

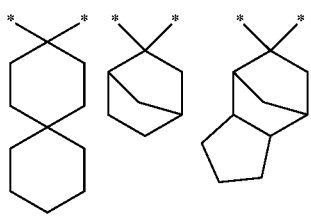

In one embodiment of the present invention, $R_3$ and $R_4$ in General Formula (I) are preferably bonded to each other to form a polycyclic fused ring including a benzene ring, and more preferably bonded to each other to form a fluorene structure.

For the compound (C'), for example, $R_3$ and $R_4$ in General Formula (I) are preferably bonded to each other to form a fluorene structure represented by General Formula (I-a).

(I-a)

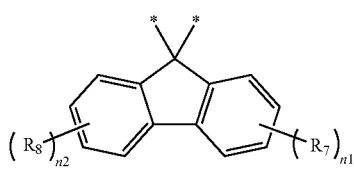

In the formula, $R_7$ and $R_8$ each independently represent a substituent. Examples of the substituent include an alkyl group, a cycloalkyl group, an alkoxy group, an aryl group, an alkoxymethyl group, an acyl group, an alkoxycarbonyl group, a nitro group, a halogen, and a hydroxyl group.

n1 and n2 each independently represent an integer of 0 to 4, and are each preferably 0 or 1.

* represents a linking site to a phenol nucleus.

Furthermore, in one embodiment of the present invention, the compound (C') is preferably represented by General Formula (I-b).

(I-b)

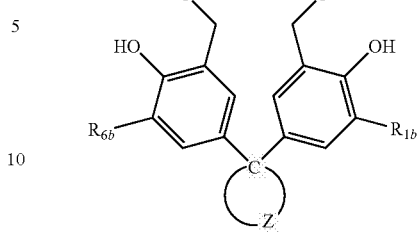

In the formula, $R_{1b}$ and $R_{6b}$ each independently represent an alkyl group having 5 or less carbon atoms.

$R_{2b}$ and $R_{5b}$ each independently represent an alkyl group having 6 or less carbon atoms or a cycloalkyl group having 3 to 12 carbon atoms.

Z represents an atomic group which is necessary to form a ring together with a carbon atom in the formula.

The ring formed by Z together with a carbon atom in the formula is the same as that described for the ring formed by the mutual bonding of $R_3$ and $R_4$ in the above description of General Formula (I).

In one embodiment of the present invention, the compound (C') is preferably a compound having 4 or more aromatic rings in a molecule thereof, and a total of two alkoxymethyl groups and/or hydroxymethyl groups.

Next, a method for producing the compound (C') represented by General Formula (I) will be described.

A bisphenol compound which serves as a mother nucleus of the compound (C') represented by General Formula (I) is generally synthesized by subjecting two molecules of a corresponding phenol compound and one molecule of a corresponding ketone to a dehydration condensation reaction in the presence of an acid catalyst.

The obtained bisphenol product is treated with paraformaldehyde and dimethylamine, and aminomethylated to obtain an intermediate represented by General Formula (I-C). Subsequently, the intermediate is subjected to acetylation, deacetylation, and alkylation to obtain a desired acid crosslinking agent.

(I-c)

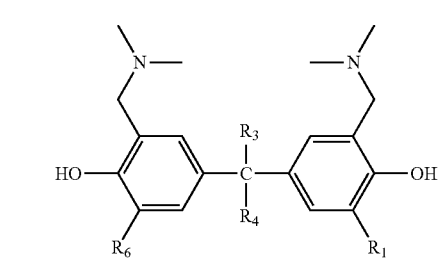

In the formula, $R_1$, $R_3$, $R_4$, and $R_6$ have the same definitions as the respective groups in General Formula (I).

In the present synthesis method, it is difficult to produce oligomers, as compared with the synthesis method involving a hydroxymethyl form in the middle of a process under basic conditions in the related art (for example, JP2008-273844A), there is a particle formation inhibitory effect.

Specific examples of the compound (C') represented by General Formula (I) are shown below.

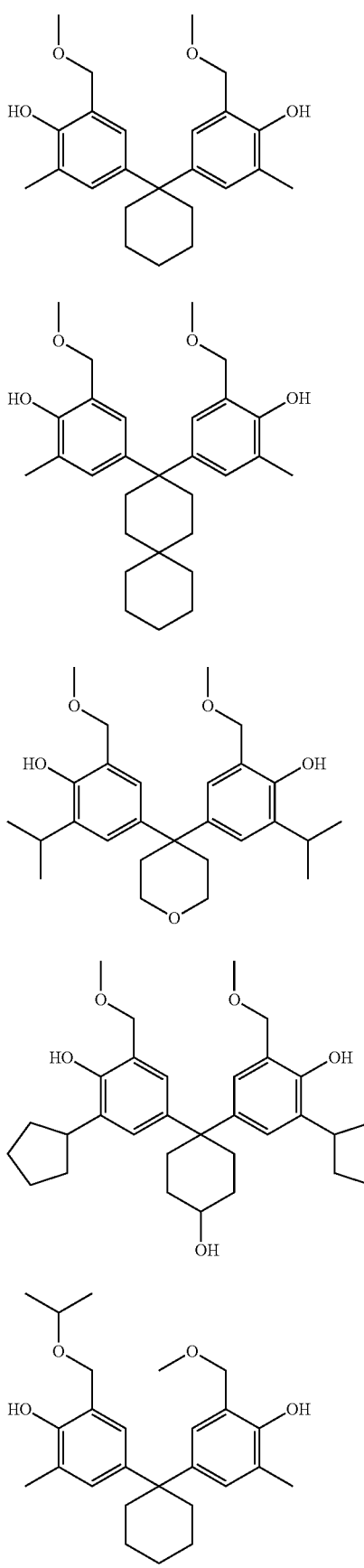

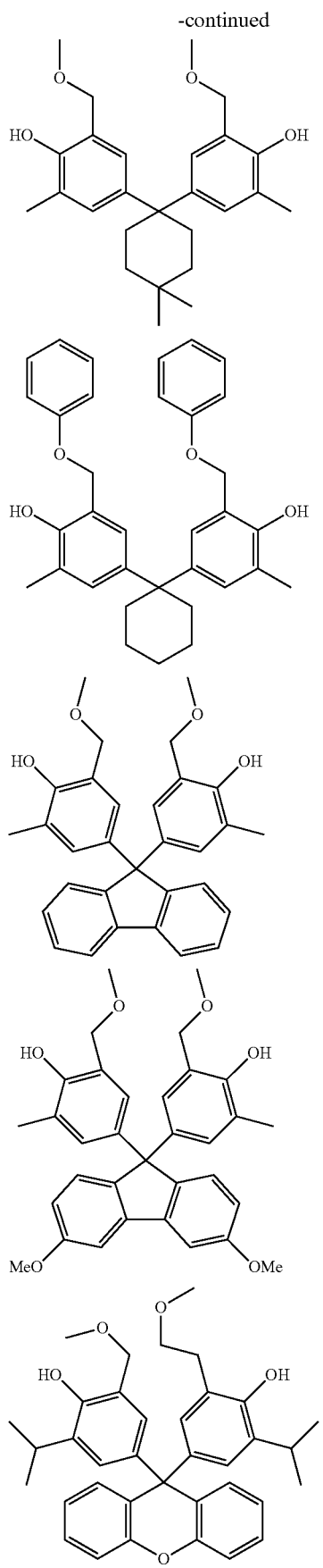
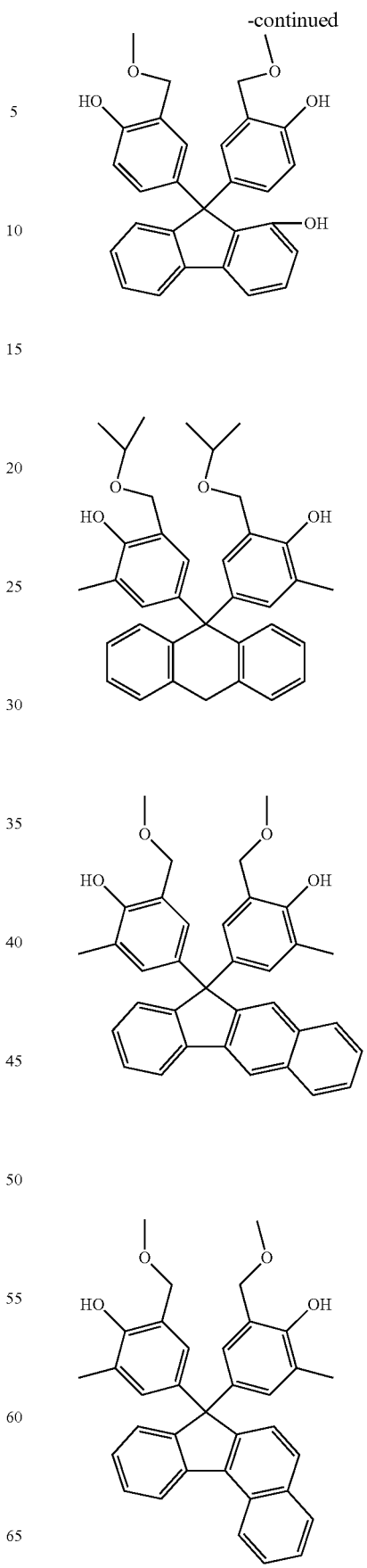

91
-continued
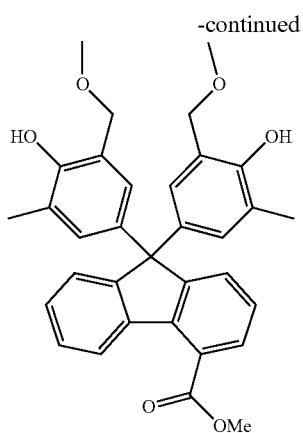
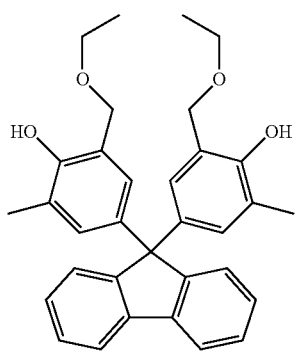
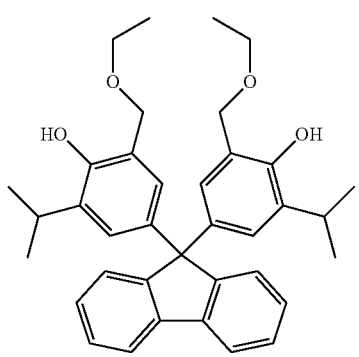
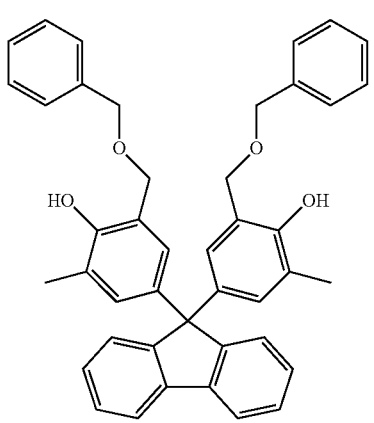
92
-continued
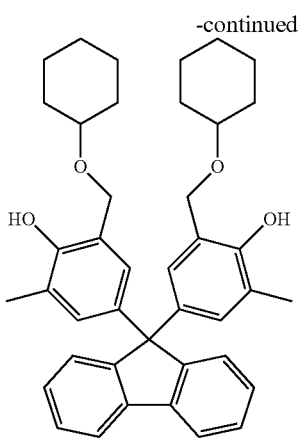
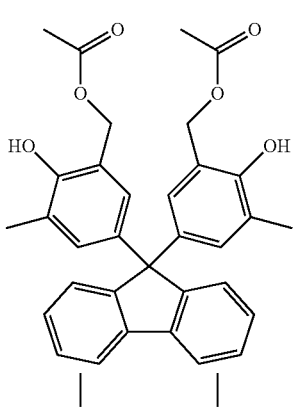
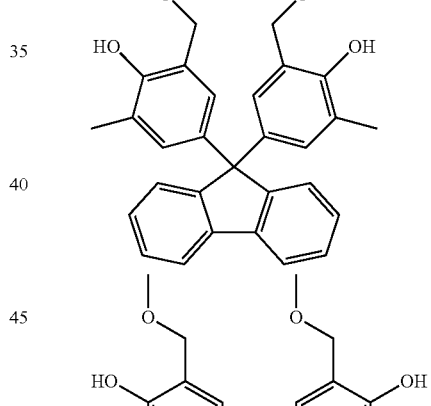
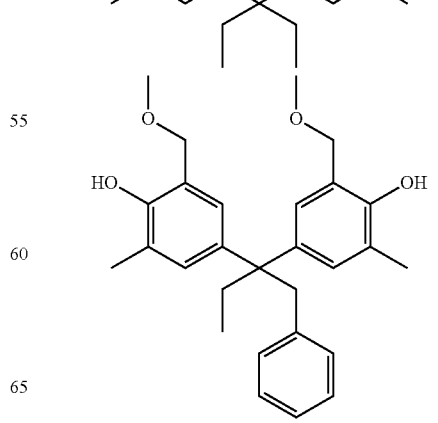

In the present invention, the compound (C') may be used singly or in combination of two or more kinds thereof. From the viewpoint of a good pattern profile, it is preferable to use a combination of two or more kinds.

In a case where the compound (C) is in the form of being introduced into a part of a polymer, it may be introduced into a part of the resin (A) or in a resin other than the resin (A).

The resist composition according to the present invention may not contain the compound (C), but in a case where the resist composition contains the compound (C), the content of the compound (C) is preferably 0.5% to 30% by mass, and more preferably 1% to 15% by mass in the total solid content of the resist composition.

<Solvent>

The resist composition used in the present invention preferably includes a solvent (also referred to as a "resist solvent"). The solvent preferably includes at least one of propylene glycol monoalkyl ether carboxylate (M1), and at least one selected from the group consisting of propylene glycol monoalkyl ether, lactic acid ester, acetic acid ester, alkoxypropionic acid ester, chain ketone, cyclic ketone, lactone, and alkylene carbonate (M2). Further, this solvent may further include components other than the component (M1) and the component (M2).

The present inventors have found that in a case where such a solvent and the above-mentioned resin are used in combination, the coatability of a composition is improved, and a pattern having a small number of development defects can be formed. The reason is not clear, but the present inventors consider that the reason is due to the fact that, since these solvents have an excellent balance among the solubility, the boiling point, and the viscosity of the above-mentioned resin, unevenness in the film thickness of the composition film or the generation of precipitates during the spin coating can be suppressed.

As the component (M1), at least one selected from the group consisting of propylene glycol monomethyl ether acetate, propylene glycol monomethyl ether propionate, and propylene glycol monoethyl ether acetate is preferable, and propylene glycol monomethyl ether acetate is particularly preferable.

The component (M2) is preferably the following one.

The propylene glycol monoalkyl ether is preferably propylene glycol monomethyl ether or propylene glycol monoethyl ether.

The lactic acid ester is preferably ethyl lactate, butyl lactate, or propyl lactate.

The acetic acid ester is preferably methyl acetate, ethyl acetate, butyl acetate, isobutyl acetate, propyl acetate, isoamyl acetate, methyl formate, ethyl formate, butyl formate, propyl formate, or 3-methoxybutyl acetate.

Butyl butyrate is also preferable.

The alkoxypropionic acid ester is preferably methyl 3-methoxypropionate (MMP) or ethyl 3-ethoxypropionate (EEP).

The chain ketone is preferably 1-octanone, 2-octanone, 1-nonanone, 2-nonanone, acetone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone.

The cyclic ketone is preferably methyl cyclohexanone, isophorone, or cyclohexanone.

The lactone is preferably γ-butyrolactone.

The alkylene carbonate is preferably propylene carbonate.

The component (M2) is more preferably propylene glycol monomethyl ether, ethyl lactate, ethyl 3-ethoxypropionate, methyl amyl ketone, cyclohexanone, butyl acetate, pentyl acetate, γ-butyrolactone, or propylene carbonate.

In addition to the components, it is preferable to use an ester-based solvent having 7 or more carbon atoms (preferably 7 to 14 carbon atoms, more preferably 7 to 12 carbon atoms, and still more preferably 7 to 10 carbon atoms), and having 2 or less heteroatoms.

Preferred examples of the ester-based solvent having 7 or more carbon atom and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

As the component (M2), a component having a flash point (hereinafter also referred to as fp) of 37° C. or higher is preferably used. Such component (M2) is preferably propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.). Among these, propylene glycol monoethyl ether, ethyl lactate, pentyl acetate, or cyclohexanone is more preferable, and propylene glycol monoethyl ether or ethyl lactate is particularly preferable. In addition, the "flash point" described here means a value described in the reagent catalog of Tokyo Chemical Industry Co., Ltd. or Sigma-Aldrich Co. LLC.

The solvent preferably includes the component (M1). It is more preferable that the solvent consists of substantially only the component (M1) or is a mixed solvent of the component (M1) and other components. In the latter case, the solvent still more preferably includes both the component (M1) and the component (M2).

The mass ratio of the component (M1) to the component (M2) is preferably within a range of 100:0 to 15:85, more preferably within a range of 100:0 to 40:60, and still more preferably within a range of 100:0 to 60:40. That is, it is preferable that the solvent consists of only the component (M1), or includes both the component (M1) and the component (M2) and the mass ratio thereof is as follows. That is, in the latter case, the mass ratio of the component (M1) to the component (M2) is preferably 15/85 or more, more preferably 40/60 or more, and still more preferably 60/40 or more. In a case where such a configuration is adopted, the number of development defects can further be reduced.

Moreover, in a case where the solvent includes both the component (M1) and the component (M2), the mass ratio of the component (M1) to the component (M2) is, for example, set to 99/1 or less.

As described above, the solvent may further include a component other than the component (M1) and the component (M2). In this case, the content of the component other than the component (M1) and the component (M2) is preferably within a range of 5% by mass to 30% by mass with respect to the total amount of the solvent.

The content of the solvent included in the resist composition is preferably set such that the concentration of the solid contents of all the components reaches 0.5% to 30% by mass, and more preferably set such that the concentration of the solid contents of all the components reaches 1% to 20% by mass. By doing this, the coatability of the resist composition can further be improved.

(<E> Basic Compound>

The resist composition of the present invention preferably contains a basic compound (E) in order to reduce a change in performance over time from exposure to heating.

Preferred examples of the basic compound include compounds having structures represented by Formulae (A) to (E).

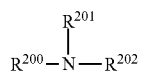
(A)

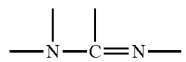
(B)

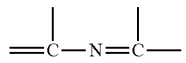
(C)

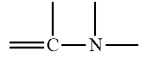
(D)

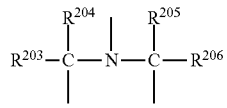
(E)

In General Formulae (A) to (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound further include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. The amine compound is more preferably a tertiary amine compound. In the amine compound, as long as at least one alkyl group (preferably having 1 to 20 carbon atoms) is bonded to a nitrogen atom, a cycloalkyl group (preferably having 3 to 20 carbon atoms) or an aryl group (preferably having 6 to 12 carbon atoms) may be bonded to the nitrogen atom, in addition to the alkyl group.

Incidentally, the amine compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

As the ammonium salt compound, primary, secondary, tertiary, or quaternary ammonium salt compounds can be used, and an ammonium salt compound having at least one alkyl group bonded to a nitrogen atom thereof is preferable. In the ammonium salt compounds, as long as at least one alkyl group (preferably having 1 to 20 carbon atoms) is bonded to a nitrogen atom thereof, a cycloalkyl group (preferably having 3 to 20 carbon atoms) or an aryl group (preferably having 6 to 12 carbon atoms) may be bonded to the nitrogen atom, in addition to the alkyl group.

The ammonium salt compound preferably has an oxygen atom in the alkyl chain to form an oxyalkylene group. The number of oxyalkylene groups in each molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of the anion of the ammonium salt compound include halogen atoms, sulfonate, borate, and phosphate, and among these, halogen atoms and sulfonate are preferable. As the halogen atom, chloride, bromide, or iodide is particularly preferable, and as the sulfonate, an organic sulfonate having 1 to 20 carbon atoms is particularly preferable. Examples of the organic sulfonate include aryl sulfonate and alkyl sulfonate having 1 to 20 carbon atoms. The alkyl group of the alkyl sulfonate may have a substituent. Examples of the substituent include fluorine, chlorine, bromine, an alkoxy group, an acyl group, and an aryl group. Specific examples of the alkyl sulfonates include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group of the aryl sulfonate include a benzene ring, a naphthalene ring, and an anthracene ring. The benzene ring, the naphthalene ring, or the anthracene ring may have a substituent, and as the substituent, a linear or branched alkyl group having 1 to 6 carbon atoms or a cycloalkyl group having 3 to 6 carbon atoms is preferable. Specific examples of the linear or branched alkyl group and the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound having a phenoxy group and the ammonium salt compound having a phenoxy group are those having a phenoxy group at the terminal of the alkyl group of the amine compound or ammonium salt compound opposed to the nitrogen atom. The phenoxy group may have a substituent. Examples of the substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group. The substitution position of the substituent may be any of 2- to 6-positions. The number of substituents is any value within the range of 1 to 5.

It is preferable that at least one oxyalkylene group exist between the phenoxy group and the nitrogen atom. The number of oxyalkylene groups in each molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The amine compound having a phenoxy group can be obtained by heating a primary or secondary amine having a phenoxy group and a haloalkyl ether so as to effect a reaction therebetween, then adding an aqueous solution of a strong base such as sodium hydroxide, potassium hydroxide, and tetraalkylammonium, and thereafter carrying out an extraction with an organic solvent such as ethyl acetate and chloroform. Alternatively, the amine compound having a phenoxy group can be obtained by first heating a primary or secondary amine and a haloalkyl ether having a phenoxy group at its terminal so as to effect a reaction therebetween, subsequently adding an aqueous solution of a strong base such as sodium hydroxide, potassium hydroxide, and a tetraalkylammonium, and thereafter carrying out an extraction with an organic solvent such as ethyl acetate and chloroform.

(Compound (PA) That Has Proton-Accepting Functional Group and Generates Compound Whose Proton Acceptor Properties Are Reduced or Lost, or Which Is Changed from Having Proton Acceptor Properties to Being Acidic, by Decomposing upon Irradiation with Actinic Rays or Radiation)

The composition according to the present invention may further include, as a basic compound, a compound [hereinafter also referred to as a compound (PA)] that has a proton-accepting functional group and generates a compound whose proton acceptor properties are reduced or lost, or which is changed from having proton acceptor properties to being acidic, by decomposing upon irradiation with actinic rays or radiation.

The proton-accepting functional group refers to a functional group having an electron or a group which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following general formula.

wherein "" represents unshared electron pair.

Preferred examples of the partial structure of the proton-accepting functional group include crown ether, azacrown ether, primary to tertiary amines, pyridine, imidazole, and pyrazine structures.

The compound (PA) decomposes upon irradiation with actinic rays or radiation to generate a compound whose proton acceptor properties are reduced or lost, or which is changed from having proton accepting properties to being acidic. Here, the expression, a compound whose proton acceptor properties are reduced or lost, or which is changed from having proton accepting properties to being acidic, means the compound having a change of proton acceptor properties due to the proton being added to the proton-accepting functional group, and specifically a decrease in the equilibrium constant at chemical equilibrium in a case where a proton adduct is generated from the compound (PA) having the proton-accepting functional group and the proton.

Specific examples of the compound (PA) include the following compounds. Further, specific examples of the compound (PA) include those described in paragraphs 0421 to 0428 of JP2014-41328A, and paragraphs 0108 to 0116 of JP2014-134686A, the contents of which are incorporated herein.

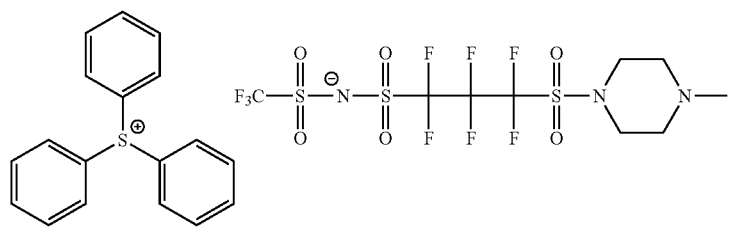

-continued
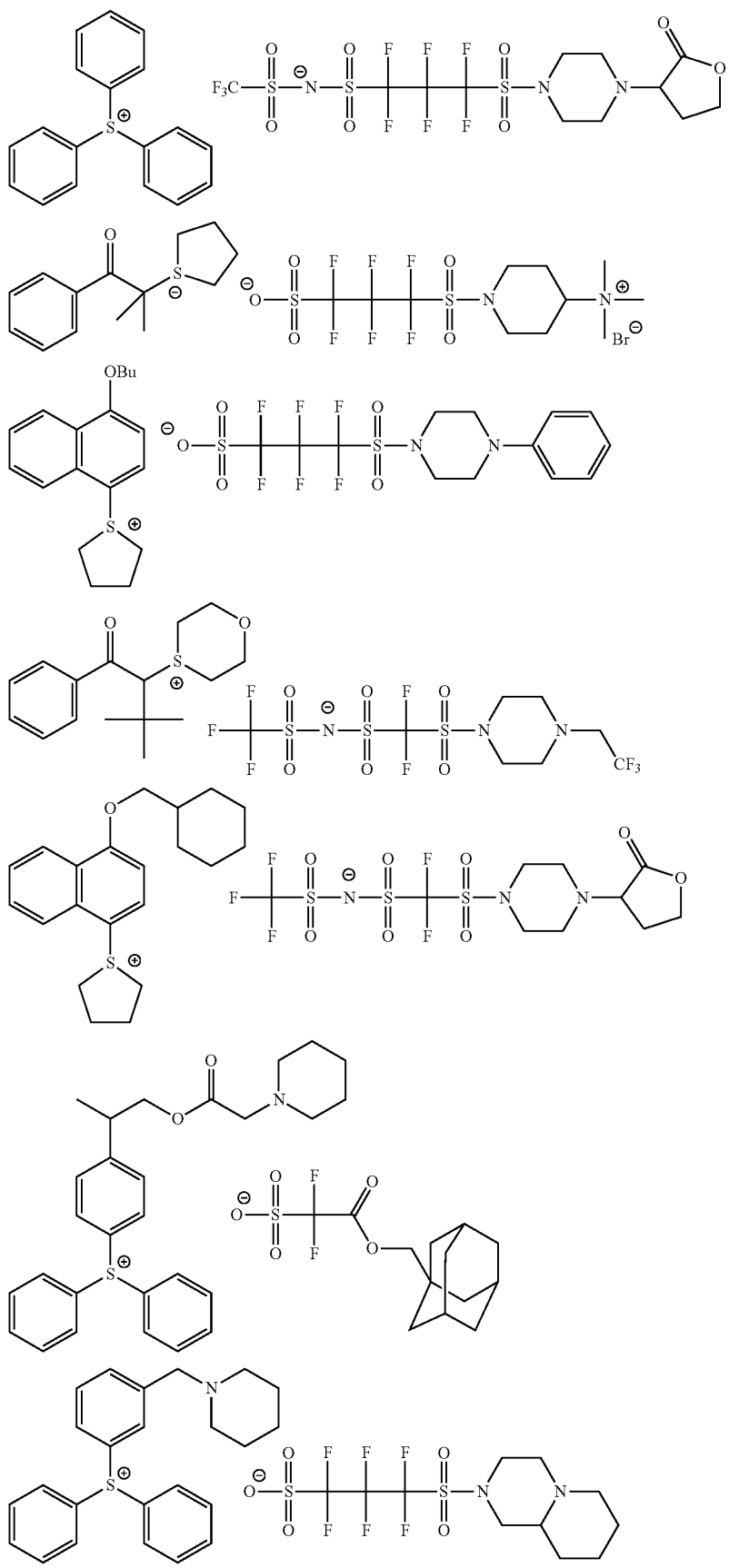

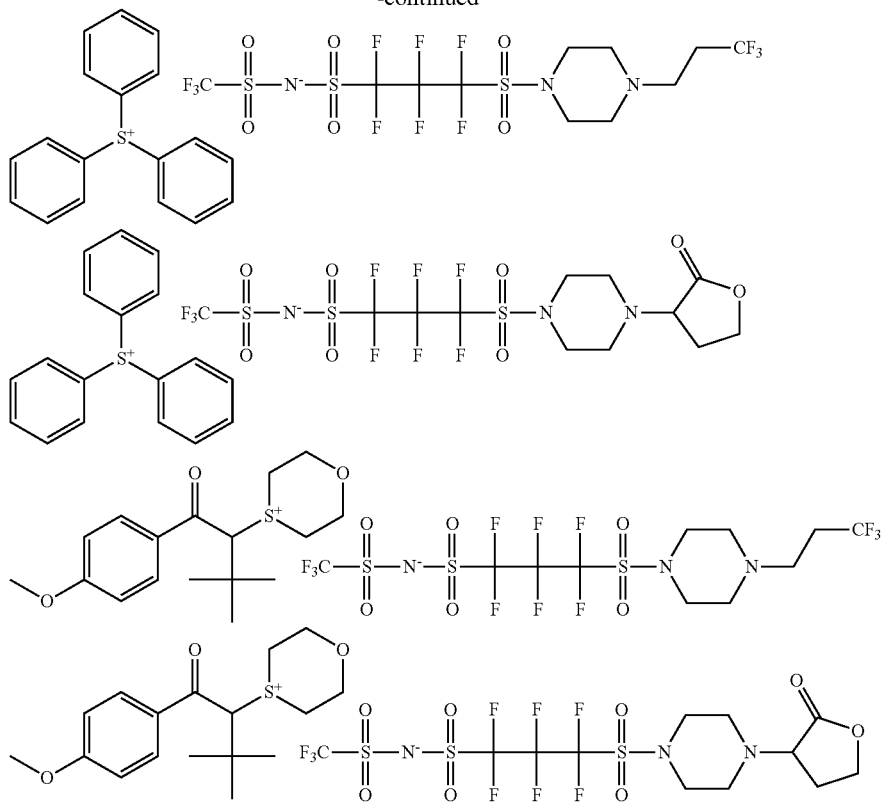

These basic compounds may be used singly or in combination of two or more kinds thereof.

The amount of the basic compound to be used is usually 0.00100 to 10% by mass, and preferably 0.01% to 5% by mass, with respect to the solid content of the resist composition.

The ratio between the acid generator to the basic compound to be used in the composition is preferably the acid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern over time from exposure to the heat treatment. The acid generator/basic compound (molar ratio) is more preferably 5.0 to 200, and still more preferably 7.0 to 150.

As the basic compound, for example, the compounds (amine compounds, amido group-containing compounds, urea compounds, nitrogen-containing heterocyclic compounds, and the like) described in paragraphs 0140 to 0144 of JP2013-11833A can be used.

<(D) Hydrophobic Resin>

The composition of the present invention may contain a hydrophobic resin (hereinafter also referred to as a "hydrophobic resin (D)" or simply a "resin (D)"). Further, the hydrophobic resin (D) is preferably different from the resin (A).

Although the hydrophobic resin (D) is preferably designed to be localized on an interface, it is different from the surfactant, does not necessarily have to have a hydrophilic group in its molecule, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and suppression of out gas.

The hydrophobic resin (D) preferably has at least one of a "fluorine atom", a "silicon atom", or a "$CH_3$ partial structure which is contained in a side chain moiety of a resin" from the viewpoint of localization on the film surface layer, and more preferably has two or more kinds.

In a case where hydrophobic resin (D) includes a fluorine atom and/or a silicon atom, the fluorine atom and/or the silicon atom in the hydrophobic resin (D) may be contained in the main chain or the side chain of the resin.

In a case where the hydrophobic resin (D) includes a fluorine atom, it is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom and the aryl group having a fluorine atom are each a cycloalkyl group in which one hydrogen atom is substituted with a fluorine atom, and an aryl group having a fluorine atom, and they may further have a substituent other than a fluorine atom.

Preferred examples of the alkyl group having a fluorine atom, the cycloalkyl group having a fluorine atom, and the aryl group having a fluorine atom include groups represented by the following General Formulae (F2) to (F4), but the present invention is not limited thereto.

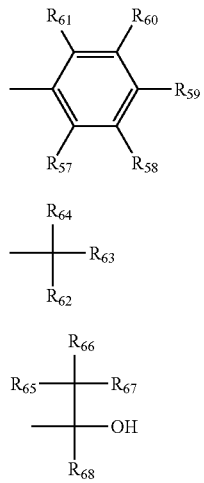

In General Formulae (F2) to (F4), $R_{57}$ to $R_{68}$ each independently represent a hydrogen atom, a fluorine atom, or an (linear or branched) alkyl group, provided that at least one of $R_{57}$, . . . , or $R_{61}$, at least one of $R_{62}$, . . . , or $R_{64}$, and at least one of $R_{65}$, . . . , or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

The hydrophobic resin (D) may contain a silicon atom. It is preferably a resin having an alkylsilyl structure (preferably a trialkylsilyl group) or a cyclic siloxane structure as the partial structure having a silicon atom.

Examples of the repeating unit having a fluorine atom or a silicon atom include those exemplified in [0519] of US2012/0251948A1.

Moreover, it is also preferable that the hydrophobic resin (D) contains a $CH_3$ partial structure in the side chain moiety as described above.

Here, the $CH_3$ partial structure (hereinafter also simply referred to as a "side chain $CH_3$ partial structure") contained in the side chain moiety in the hydrophobic resin (D) includes a $CH_3$ partial structure contained in an ethyl group, a propyl group, and the like.

On the other hand, a methyl group bonded directly to the main chain of the hydrophobic resin (D) (for example, an α-methyl group in the repeating unit having a methacrylic acid structure) makes a small contribution to localization on the surface of the hydrophobic resin (D) due to the effect of the main chain, and it is therefore not included in the $CH_3$ partial structure in the present invention.

More specifically, in a case where the hydrophobic resin (D) contains a repeating unit derived from a monomer having a polymerizable moiety with a carbon-carbon double bond, such as a repeating unit represented by General Formula (M), and in addition, $R_{11}$ to $R_{14}$ are $CH_3$ "themselves", such $CH_3$ is not included in the $CH_3$ partial structure contained in the side chain moiety in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the repeating unit has "one" $CH_3$ partial structure in the present invention.

In General Formula (M), $R_{11}$ to $R_{14}$ each independently represent a side chain moiety.

Examples of $R_{11}$ to $R_{14}$ in a side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and these groups may further have a substituent.

The hydrophobic resin (D) is preferably a resin including a repeating unit having the $CH_3$ partial structure in the side chain moiety thereof. Further, the hydrophobic resin more preferably has, as such a repeating unit, at least one repeating unit (x) selected from a repeating unit represented by General Formula (II) or a repeating unit represented by General Formula (III).

Hereinafter, the repeating unit represented by General Formula (II) will be described in detail.

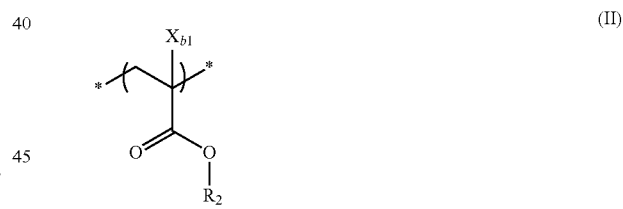

In General Formula (II), $X_{b1}$ represents a hydrogen atom, an alkyl group, a cyano group, or a halogen atom, and $R_2$ represents an organic group which has one or more $CH_3$ partial structures and is stable against an acid, in which it is preferable that the organic group which is stable against an acid is more specifically an organic group having no acid-decomposable group (group capable of decomposing by the action of an acid to generate a polar group such as a carboxyl group).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

R$_2$ is preferably an alkyl group or an alkyl-substituted cycloalkyl group, each of which has one or more CH$_3$ partial structures.

The number of the CH$_3$ partial structures contained in the organic group which has one or more CH$_3$ partial structures and is stable against an acid as R$_2$ is preferably from 2 to 10, and more preferably from 2 to 8.

Specific preferred examples of the repeating unit represented by General Formula (II) are shown below, but the present invention is not limited thereto.

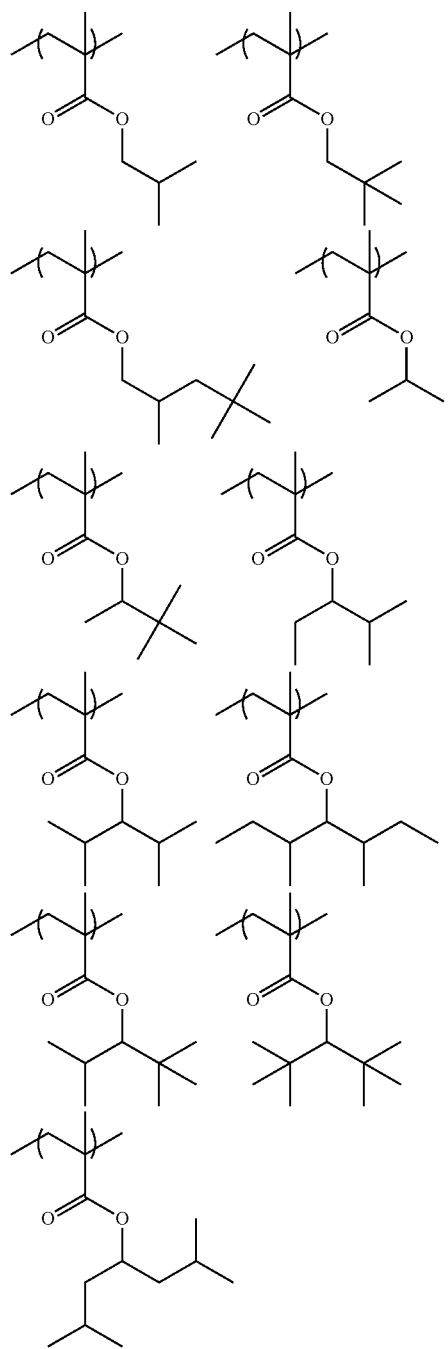

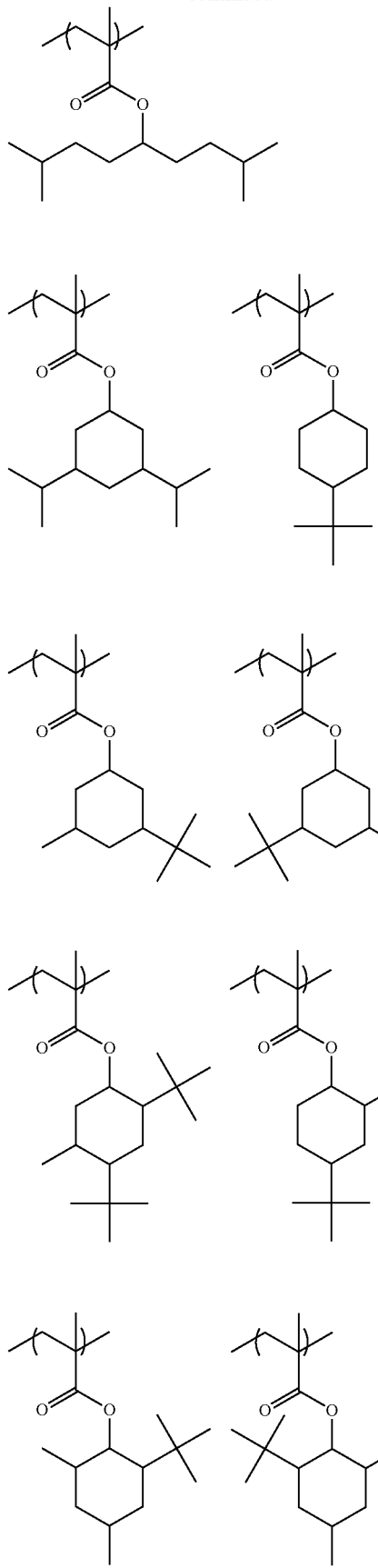

-continued

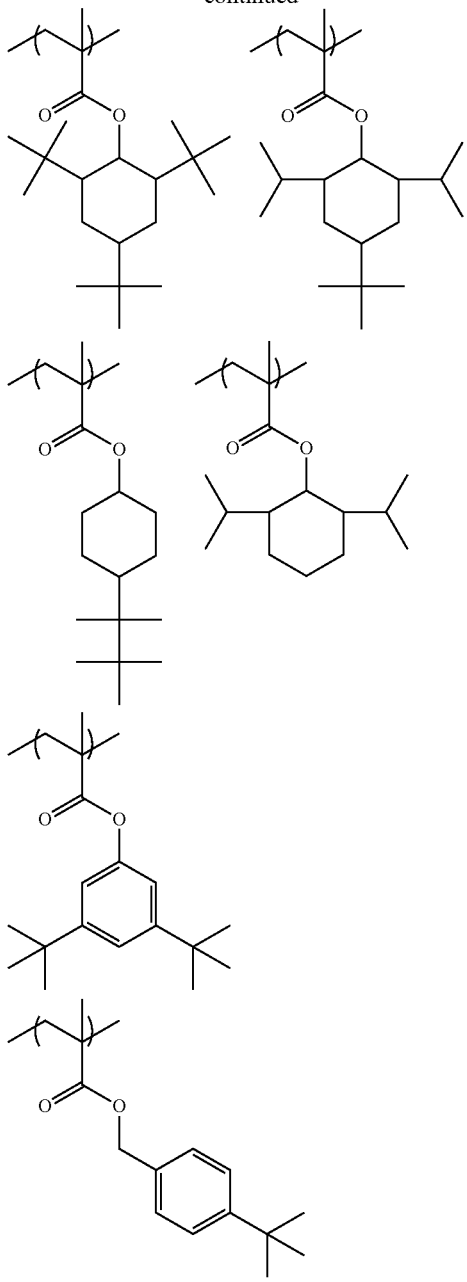

The repeating unit represented by General Formula (II) is preferably a repeating unit in detail.

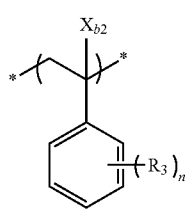
(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, with the hydrogen atom being preferable.

$X_{b2}$ is preferably a hydrogen atom.

Since $R_3$ is an organic group stable against an acid, it is preferable that $R_3$ is more specifically an organic group having no acid-decomposable group.

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

n represents an integer of 1 to 5, more preferably 1 to 3, and still more preferably 1 or 2.

Specific preferred examples of the repeating unit represented by General Formula (III) are shown below. Further, the present invention is not limited thereto.

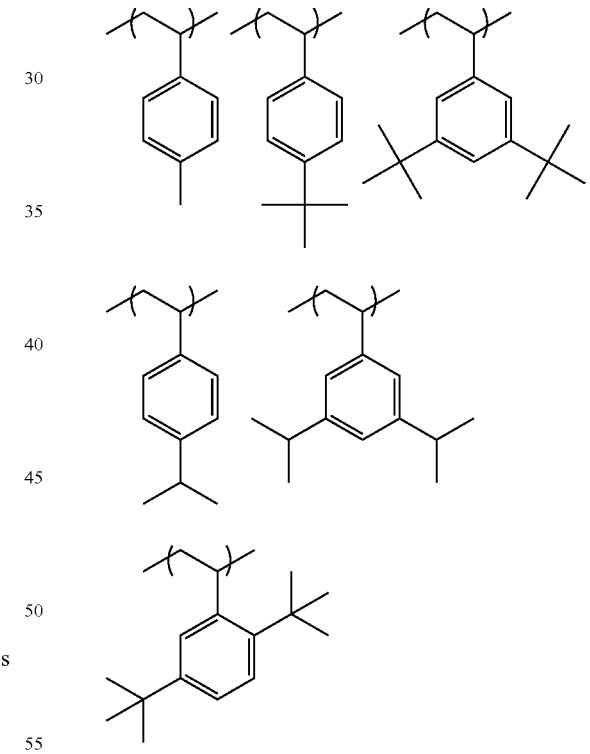

The repeating unit represented by General Formula (III) is preferably a repeating unit which is stable against an acid (acid-indecomposable), and specifically, it is preferably a repeating unit which does not have a group that decomposes by the action of an acid to generate a polar group.

In a case where the hydrophobic resin (D) includes a $CH_3$ partial structure in the side chain moiety thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin (D). Further, the content is usually 100% by mole or less with respect to all the repeating units of the hydrophobic resin (D).

By incorporating at least one repeating unit (x) of the repeating unit represented by General Formula (II) or the repeating unit represented by General Formula (III) in a proportion of 90% by mole or more with respect to all the repeating units of the hydrophobic resin (D) into the hydrophobic resin (D), the surface free energy of the hydrophobic resin is increased. As a result, it is difficult for the hydrophobic resin (D) to be localized on the surface of the resist film and the static/dynamic contact angle of the resist film with respect to water can be securely increased, thereby enhancing the immersion liquid tracking properties.

In addition, in a case where the hydrophobic resin (D) contains (i) a fluorine atom and/or a silicon atom or (ii) a $CH_3$ partial structure in the side chain moiety, it may have at least one group selected from the following groups (x) to (z):

(x) an acid group, (y) a group capable of decomposing by the action of an alkali developer to enhance its solubility in the alkali developer (hereinafter also referred to as a polarity converting group), and (z) a group capable of decomposing by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably hexafluoroisopropanol), sulfonimido group, and a bis(alkylcarbonyl)methylene group.

Examples of the repeating unit having an acid group (x) include a repeating unit in which an acid group is directly bonded to a main chain of a resin, such as a repeating unit of acrylic acid or methacrylic acid, and a repeating unit in which an acid group is bonded to a main chain of a resin via a linking group. Further, a polymerization initiator or a chain transfer agent, having an acid group, may be used and introduced to a terminal of a polymer chain during the polymerization. Any one of these cases is preferable. The repeating unit having the acid group (x) may also have at least one of a fluorine atom or a silicon atom.

The content of the repeating unit having the acid group (x) is preferably 1% to 50% by mole, more preferably 3% to 35% by mole, and still more preferably 5% to 20% by mole, with respect to all the repeating units in the hydrophobic resin (D).

Specific examples of the repeating unit having the acid group (x) are shown below, but the present invention is not limited thereto. In the formulae, Rx represents a hydrogen atom, $CH_3$, $CF_3$, or $CH_2OH$.

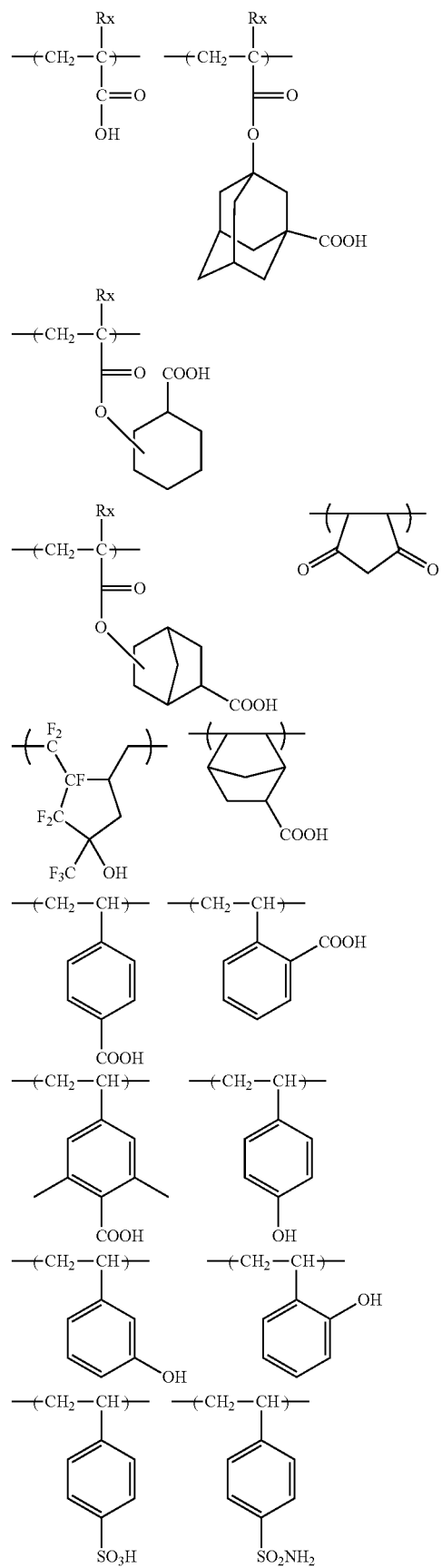

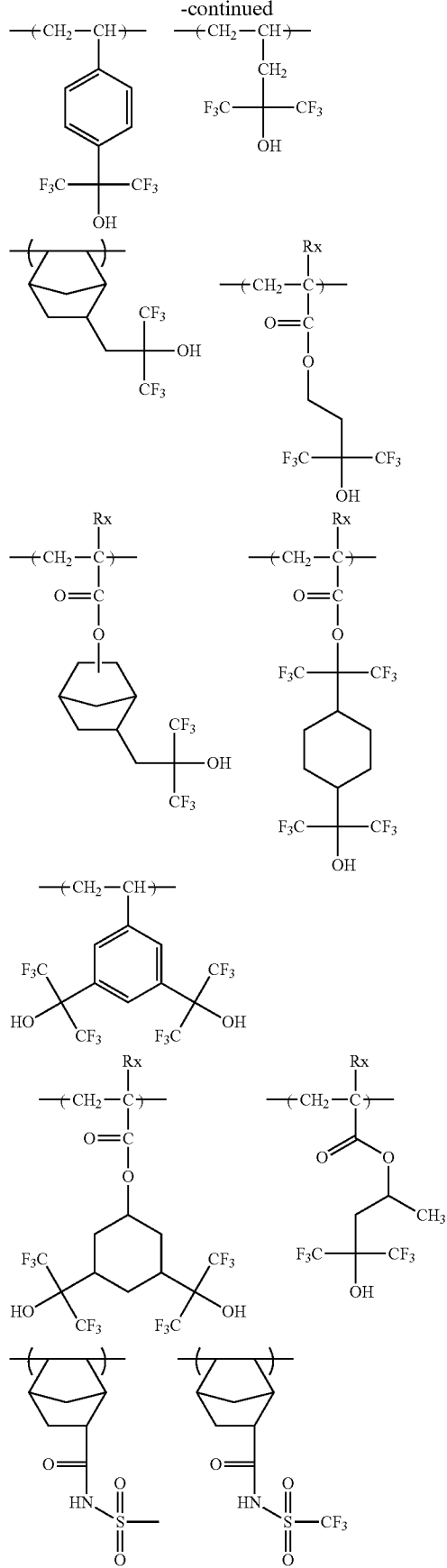
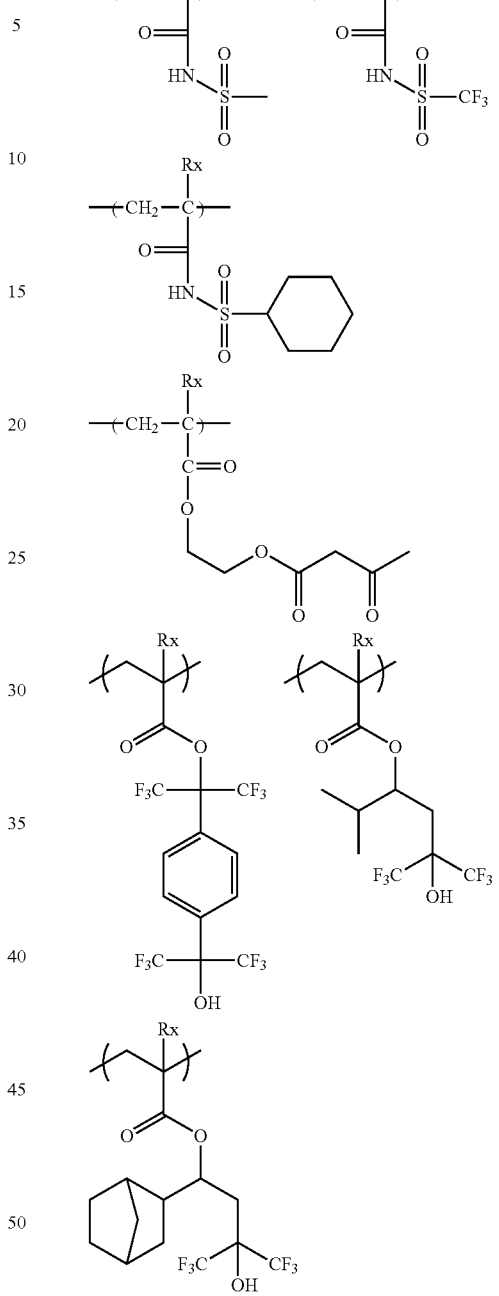

As the group (y) capable of decomposing by the action of an alkali developer to enhance its solubility in the alkali developer, a group having a lactone structure, an acid anhydride group, or an acid imide group is preferable, and a group having a lactone structure is particularly preferable.

As the repeating unit including the group is, for example, a repeating unit in which the group is directly bonded to a main chain of a resin, such as a repeating unit formed of an acrylic acid ester and a methacrylic acid ester. Alternatively, this repeating unit may be a repeating unit in which the group is bonded to the main chain via a linking group. Alternatively, this repeating unit may be the one in which a polymerization initiator or chain transfer agent having the group is used during the polymerization, and introduced into a terminal of a resin.

Examples of the repeating unit having a group having a lactone structure include those that are the same as the repeating units having lactone structures described earlier in the section of the resin P.

The content of the repeating unit having the group (y) capable of decomposing by the action of an alkali developer to enhance its solubility in the alkali developer is preferably 1% to 100% by mole, more preferably 3% to 98% by mole, and still more preferably 5% to 95% by mole, with respect to all the repeating units of the hydrophobic resin (D).

Examples of the repeating unit having a group (z) capable of decomposing by the action of an acid in the hydrophobic resin (D) include those that are the same as the repeating units having an acid decomposable group mentioned above for the resin P. The repeating unit having a group (z) capable of decomposing by the action of an acid may contain at least one of a fluorine atom or a silicon atom. The content of the repeating unit having a group (z) capable of decomposing by the action of an acid in the hydrophobic resin (D) is preferably 1% to 80% by mole, more preferably 10% to 80% by mole, and still more preferably 20% to 60% by mole, with respect to all the repeating units in the resin (D).

The hydrophobic resin (D) may further have repeating units other than the above-mentioned repeating units.

The content of the repeating unit including a fluorine atom is preferably 10% to 100% by mole, and more preferably 30% to 100% by mole, with respect to all the repeating units included in the hydrophobic resin (D). Further, the content of the repeating unit including a silicon atom is preferably 10% to 100% by mole, and more preferably 20% to 100% by mole, with respect to all the repeating units included in the hydrophobic resin (D).

On the other hand, particularly in a case where the hydrophobic resin (D) includes a $CH_3$ partial structure in the side chain moiety thereof, an embodiment in which the hydrophobic resin (D) does not substantially contain any one of a fluorine atom and a silicon atom is also preferable. Further, it is preferable that the hydrophobic resin (D) is substantially composed of only repeating units, which are composed of only atoms selected from a carbon atom, an oxygen atom, a hydrogen atom, a nitrogen atom, and a sulfur atom.

The weight-average molecular weight of the hydrophobic resin (D) in terms of standard polystyrene is preferably 1,000 to 100,000, and more preferably 1,000 to 50,000.

Furthermore, the hydrophobic resins (D) may be used singly or in combination of plural kinds thereof.

The content of the hydrophobic resin (D) in the composition is preferably 0.01% to 10% by mass, and more preferably 0.05% to 8% by mass, with respect to the total solid contents of the composition of the present invention.

In the hydrophobic resin (D), the content of residual monomers or oligomer components is preferably 0.01% to 5% by mass, and more preferably 0.01% to 3% by mass. Further, the molecular weight distribution (Mw/Mn, also referred to as a dispersity) is preferably in the range of 1 to 5, and more preferably in the range of 1 to 3.

As the hydrophobic resin (D), various commercial products may also be used, or the resin may be synthesized by an ordinary method (for example, radical polymerization).

<(F) Surfactant>

The resist composition used in the present invention may further include a surfactant (F). By the incorporation of the surfactant, it becomes possible to form a resist pattern which has less defects in adhesiveness and development with good sensitivity and resolution at the time of using an exposure light source at a wavelength of 250 nm or less, and particularly 220 nm or less.

Fluorine-based and/or silicon-based surfactants are particularly preferably used as the surfactant.

Examples of the fluorine- and/or silicon-based surfactants include the surfactants described in [0276] in US2008/0248425A. Further, EFTOP EF301 or EF303 (manufactured by Shin-Akita Kasei K. K.); FLORAD FC430, 431, or 4430 (manufactured by Sumitomo 3M Inc.); MEGAFAC F171, F173, F176, F189, F113, F110, F177, F120, or R08 (manufactured by DIC Corp.); SURFLON S-382, SC101, 102, 103, 104, 105, or 106 (manufactured by Asahi Glass Co., Ltd.); TROYSOL S-366 (manufactured by Troy Chemical Corp.); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); or FTX-204G, 208G, 218G, 230G, 204D, 208D, 212D, 218D, or 222D (manufactured by NEOS COMPANY LIMITED) may be used. In addition, POLYSILOXANE POLYMER KP-341 (manufactured by Shin-Etsu Chemical Co., Ltd.) can also be used as the silicon-based surfactant.

Furthermore, in addition to those known surfactants as described above, a surfactant may be synthesized using a fluoroaliphatic compound which is produced by a telomerization method (also referred to as a telomer method) or an oligomerization method (also referred to as an oligomer method). Specifically, a polymer including a fluoroaliphatic group derived from the fluoroaliphatic compound may be used as the surfactant. The fluoroaliphatic compound can be synthesized in accordance with, for example, the method described in JP2002-90991A.

In addition, surfactants other than the fluorine-based and/or silicon-based surfactants described in [0280] of US2008/0248425A may be used.

These surfactants may be used singly or in combination of two or more kinds thereof.

In a case where the resist composition used in the present invention includes a surfactant, the content of the surfactant is preferably 0% to 2% by mass, more preferably 0.0001% to 2% by mass, and still more preferably 0.0005% to 1% by mass, with respect to the total solid content of the composition.

<Other Additives>

The resist composition used in the present invention may further include a dissolution inhibiting compound, a dye, a plasticizer, a photosensitizer, a light absorber, and/or a compound (for example, a phenol compound having a molecular weight of 1,000 or less, or an alicyclic or aliphatic compound including a carboxy group) promoting a solubility in a developer.

The resist composition used in the present invention may further include a dissolution inhibiting compound. Here, the "dissolution inhibiting compound" is a compound having a molecular weight of 3,000 or less, which decomposes by the action of an acid to decrease its solubility in an organic developer.

<Resist Film>

The present invention also relates to a resist film formed by the resist composition of the present invention, and such a film is formed by, for example, applying the composition of the present invention onto a support such as substrate. The thickness of the film is preferably 0.02 to 0.1 µm. As for a method for applying the composition onto a substrate, the composition is applied onto the substrate by a suitable application method such as spin coating, roll coating, flow coating, dip coating, spray coating, and doctor coating, with the spin coating being preferable, in which the rotation speed is preferably 1,000 to 3,000 rpm. The coated film is prebaked at 60° C. to 150° C. for 1 to 20 minutes, and preferably at 80° C. to 120° C. for 1 to 10 minutes to form a thin film.

As an example of a material constituting a substrate to be processed and an outermost layer thereof, a silicon wafer can be used in a case of a semiconductor wafer, and examples of the material which serves as the outermost layer include Si, $SiO_2$, SiN, SiON, TiN, WSi, BPSG, SOG, and an organic antireflection film.

An antireflection film may be coated on the substrate in advance before the resist film is formed.

As the antireflection film, either of an inorganic film type such as titanium, titanium dioxide, titanium nitride, chromium oxide, carbon and amorphous silicon, and an organic film type which is formed of a light absorber and a polymer material can be used. In addition, as the organic antireflection film, a commercially available organic antireflection film can be used such as DUV-30 Series and DUV-40 Series manufactured by Brewer Science, Inc., and AR-2, AR-3, and AR-5 manufactured by Shipley Co., Ltd.

<Pattern Forming Method>

The present invention also relates to a pattern forming method including irradiating (exposing) the resist film with actinic rays or radiation, and developing the film irradiated with actinic rays or radiation. In the present invention, the exposure is preferably performed using electron beams or extreme-ultraviolet rays.

In the production or the like of a precision integrated circuit device, the exposure on resist film (pattern forming step) is preferably performed by patternwise irradiating the resist film of the present invention with an electron beam or an extreme-ultraviolet ray (EUV). The exposure is performed with an exposure dose of, in a case of an electron beam, approximately 0.1 to 20 µC/cm$^2$, and preferably approximately 3 to 10 µC/cm$^2$, and in a case of an extreme-ultraviolet ray, approximately 0.1 to 20 mJ/cm$^2$, and preferably approximately 3 to 15 mJ/cm$^2$. Thereafter, heating after exposure (post-exposure baking) is performed on a hot plate at 60° C. to 150° C. for 1 to 20 minutes, and preferably at 80° C. to 120° C. for 1 to 10 minutes, and subsequently, the resist film is developed, rinsed and dried to form a pattern. The developer is appropriately selected, but an alkali developer (typically an aqueous alkali solution) or a developer containing an organic solvent (also referred to an organic developer) is preferably used. In a case where the developer is an aqueous alkali solution, the development is performed by an ordinary method such as a dip method, a puddle method, and a spray method for 0.1 to 3 minutes, preferably 0.5 to 2 minutes, by an aqueous alkali solution in a concentration of 0.1% to 5% by mass, and preferably 2% to 3% by mass, of tetramethylammonium hydroxide (TMAH), tetrabutylammonium hydroxide (TBAH), or the like. To the alkali developer may be added an appropriate amount of alcohols and/or surfactant. In the formation of a negative tone pattern, a film in the unexposed areas are dissolved in the developer and the exposed portions are hardly dissolved in the developer, whereas in the formation of a positive tone pattern, a film in the exposed areas are dissolved and the exposed portions are hardly dissolved, whereby a desired pattern is formed on the substrate.

In a case where the pattern forming method of the present invention has a step of performing development using an alkali developer, as the alkali developer, for example, aqueous alkali solutions of inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, trimethylphenylammonium hydroxide, trimethylbenzylammonium hydroxide, triethylbenzylammonium hydroxide, and dimethyl bis(2-hydroxyethyl)ammonium hydroxide, cyclic amines such as pyrrole and piperidine, or the like can be used.

Furthermore, alcohols and a surfactant can also be added to the aqueous alkali solution in an appropriate amount before use.

The alkali concentration of the alkali developer is usually 0.1% to 20% by mass.

The pH of the alkali developer is usually 10.0 to 15.0.

In particular, a 2.38%-by-mass aqueous solution of tetramethylammonium hydroxide is preferable.

As the rinsing liquid in the rinsing treatment carried out after the alkali development, pure water is used, and can also be used after adding an appropriate amount of a surfactant thereto.

In addition, after the development treatment or the rinsing treatment, a treatment of removing the developer or rinsing liquid adhering on the pattern by a supercritical fluid can be carried out.

In a case where the pattern forming method of the present invention has a step of performing development using a developer containing an organic solvent, as the developer (hereinafter also referred to as an organic developer) in the step, a polar solvent such as a ketone-based solvent, an ester-based solvent, an alcohol-based solvent, an amide-based solvent, and an ether-based solvent, or a hydrocarbon-based solvent can be used.

In the present invention, the ester-based solvent refers to a solvent having an ester group in the molecule, the ketone-based solvent refers to a solvent having a ketone group in the molecule, the alcohol-based solvent refers to a solvent having an alcoholic hydroxyl group in the molecule, the amide-based solvent refers to a solvent having an amido group in the molecule, and the ether-based solvent refers to a solvent having an ether bond in the molecule. Among these, a solvent having a plurality of functional groups described above in one molecule may also be present, but in this case, it is assumed that the solvent also corresponds to any solvent type including the functional group which is contained in the solvent. For example, it is assumed that diethylene glycol monomethyl ether also corresponds to any of the alcohol-based solvent, or the ether-based solvent, in the above classification. In addition, the hydrocarbon-based solvent is a hydrocarbon-based solvent having no substituent.

In particular, a developer containing at least one solvent selected from a ketone-based solvent, an ester-based solvent, an alcohol-based solvent, and an ether-based solvent is preferable.

The developer preferably uses an ester-based solvent having 7 or more carbon atoms (preferably 7 to 14 carbon atoms, more preferably 7 to 12 carbon atoms, and still more preferably 7 to 10 carbon atoms) and 2 or less heteroatoms in view that swelling of the resist film can be suppressed.

The heteroatom of the ester-based solvent is an atom other than a carbon atom and a hydrogen atom, and examples thereof include an oxygen atom, a nitrogen atom, and a sulfur atom. The number of heteroatoms is preferably 2 or less.

Preferred Examples of the ester-based solvent having 7 or more carbon atoms and 2 or less heteroatoms include amyl acetate, isoamyl acetate, 2-methylbutyl acetate, 1-methylbutyl acetate, hexyl acetate, pentyl propionate, hexyl propionate, heptyl propionate, butyl butanoate, and isobutyl isobutanoate, and isoamyl acetate or isobutyl isobutanoate is particularly preferably used.

The developer may use a mixed solvent of the ester-based solvent and the hydrocarbon-based solvent, or a mixed solvent of the ketone-based solvent and the hydrocarbon-based solvent, instead of the above-mentioned ester-based solvent having 7 or more carbon atoms and 2 or less heteroatoms. Also, this case is effective for suppression of the swelling of the resist film.

In a case of using the ester-based solvent and the hydrocarbon-based solvent in combination, isoamyl acetate is preferably used as the ester-based solvent. Further, from the viewpoint of adjusting the solubility of the resist film, a saturated hydrocarbon-based solvent (for example, octane, nonane, decane, dodecane, undecane, and hexadecane) is preferably used as the hydrocarbon-based solvent.

Examples of the ketone-based solvent include 1-octanone, 2-octanone, 1-nonanone, 2-nonanone, acetone, 2-heptanone (methyl amyl ketone), 4-heptanone 1-hexanone, 2-hexanone, diisobutyl ketone, 2,5-dimethyl-4-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate, and diisobutyl ketone or 2,5-dimethyl-4-hexanone is particularly preferably used.

Examples of the ester-based solvent include methyl acetate, butyl acetate, ethyl acetate, isopropyl acetate, pentyl acetate, isoamyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, and methyl 2-hydroxyisobutyrate.

Examples of the alcohol-based solvent include alcohols such as methyl alcohol, ethyl alcohol, n-propyl alcohol, isopropyl alcohol, n-butyl alcohol, sec-butyl alcohol, 4-methyl-2-pentanol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol, and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents, anisole, dioxane, and tetrahydrofuran.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, decane, and undecane.

Furthermore, the aliphatic hydrocarbon-based solvent as the hydrocarbon-based solvent may be a mixture of compounds having the same carbon atoms and different structures. For example, in a case where decane is used as the aliphatic hydrocarbon-based solvent, 2-methylnonane, 2,2-dimethyloctane, 4-ethyloctane, isooctane, and the like, which are compounds having the same carbon atoms and different structures, may be included in the aliphatic hydrocarbon-based solvent.

Incidentally, one kind of the compound having the same carbon atoms and different structures may be included, or a plurality of kinds of the compound as described above may be included.

A plurality of these solvents may be mixed, or the solvent may be used by mixing it with a solvent other than those described above or with water. However, in order to sufficiently bring out the effects of the present invention, the percentage water content in the entire developer is preferably less than 10% by mass, and it is more preferred to contain substantially no water.

That is, the amount of the organic solvent used in the organic developer is preferably from 90% to 100% by mass, more preferably from 95% to 100% by mass, based on the total amount of the developer.

In particular, the organic developer is preferably a developer containing at least one kind of an organic solvent selected from the group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone, and methyl isobutyl ketone, ester-based solvents such as butyl acetate, pentyl acetate, isoamyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate, alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, and methoxymethylbutanol, ether-based solvents such as tetrahydrofuran, amide-based solvents such as N-methyl-2-pyrrolidone, N,N-dimethylacetamide, and N,N-dimethylformamide, aromatic hydrocarbon-based solvents such as toluene and xylene, and aliphatic hydrocarbon-based solvents such as octane and decane.

Specific examples of the solvent having a vapor pressure of 2 kPa or less, which is in a particularly preferred range include ketone-based solvents such as 1-octanone, 2-octanone, 1-nonanone, 2-nonanone, 2-heptanone, 4-heptanone, 2-hexanone, diisobutyl ketone, cyclohexanone, methylcyclohexanone, and phenylacetone, ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate, alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monomethyl ether, and methoxymethylbutanol, amide-based solvents such as N-methyl-2-pyrrolidone, N,N-dimethylacetamide, and N,N-dimethylformamide, aromatic hydrocarbon-based solvents such as xylene, and aliphatic hydrocarbon-based solvents such as octane, decane, and undecane.

The organic developer may include a basic compound. Specific examples and preferred examples of the basic compound which can be included in the developer for use in the present invention are the same as those described above for the basic compound which can be included in the resist composition.

An appropriate amount of a surfactant can be added to the organic developer, as desired.

The surfactant is not particularly limited, but it is possible to use, for example, ionic or non-ionic fluorine- and/or silicon-based surfactants, or the like. Examples of the fluorine-based and/or silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. Nos. 5,405,720A, 5,360,692A, 5,529,881A, 5,296,330A, 5,436,098A, 5,576,143A, 5,294,511A, and 5,824,451A, and non-ionic surfactants are preferable. The non-ionic surfactant is not particularly limited, but it is more preferable to use a fluorine-based surfactant or a silicon-based surfactant.

The amount of the surfactant to be used is preferably 0% to 2% by mass, more preferably 0.0001% to 2% by mass, and particularly preferably 0.0005% to 1% by mass, with respect to the total amount of the developer.

Examples of the developing method include a method in which a substrate is immersed in a tank filled with a developer for a certain period of time (a dip method), a method in which development is performed by heaping a developer up onto the surface of a substrate by surface tension, and then stopping it for a certain period of time (a puddle method), a method in which a developer is sprayed on the surface of a substrate (a spray method), and a method in which a developer is continuously discharged onto a substrate spun at a constant rate while scanning a developer discharging nozzle at a constant rate (a dynamic dispense method).

In a case where the various developing methods include a step of discharging a developer toward a resist film from a development nozzle of a developing device, the discharge pressure of the developer discharged (the flow rate per unit area of the developer discharged) is preferably 2 mL/sec/mm$^2$ or less, more preferably 1.5 mL/sec/mm$^2$ or less, and still more preferably 1 mL/sec/mm$^2$ or less. The flow rate has no particular lower limit, but is preferably 0.2 mL/sec/mm$^2$ or more in consideration of throughput.

By setting the discharge pressure of the discharged developer to the above-mentioned range, pattern defects resulting from the resist scum after development can be significantly reduced.

Details on the mechanism are not clear, but it is thought that it is due to the pressure imposed on the resist film by the developer being decreased by setting the discharge pressure to the above-described range so that the resist film and/or the resist pattern is suppressed from being inadvertently cut or collapsing.

In addition, the discharge pressure (mL/sec/mm$^2$) of the developer is the value at the outlet of the development nozzle in the developing device.

Examples of the method for adjusting the discharge pressure of the developer include a method of adjusting the discharge pressure by a pump, or the like, and a method of supplying a developer from a pressurized tank and adjusting the pressure to change the discharge pressure.

In addition, after the step of performing development using a developer including an organic solvent, a step of stopping the development while replacing the solvent with another solvent may be carried out.

After the step of performing development using a developer including an organic solvent, a step of performing washing using a rinsing liquid may be included, but from the viewpoints of a throughput (productivity), an amount of a rinsing liquid to used, or the like, the step of performing washing using a rinsing liquid may not be included.

The rinsing liquid used in the rinsing step after the step of performing development using a developer including an organic solvent is not particularly limited as long as the rinsing liquid does not dissolve the resist pattern, and a solution including an ordinary organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

After the step of performing development using a developer including an organic solvent, it is more preferable to carry out a step of performing washing using a rinsing liquid containing at least one organic solvent selected from the group consisting of an ester-based solvent, an alcohol-based solvent, and a hydrocarbon-based solvent, and it is still more preferable to carry out a step of performing washing using a rinsing liquid containing an alcohol-based solvent or a hydrocarbon-based solvent.

As the organic solvent included in the rinsing liquid, among the organic solvents, a hydrocarbon-based solvent is also preferably used, and an aliphatic hydrocarbon-based solvent is more preferably used. The aliphatic hydrocarbon-based solvent used in the rinsing liquid is preferably an aliphatic hydrocarbon-based solvent having 5 or more carbon atoms (for example, pentane, hexane, octane, decane, undecane, dodecane, and hexadecane) from the viewpoint that the effect is further improved, more preferably an aliphatic hydrocarbon-based solvent having 8 or more carbon atoms, and still more preferably an aliphatic hydrocarbon-based solvent having 10 or more carbon atoms.

Moreover, the upper limit value in the number of carbon atoms of the aliphatic hydrocarbon-based solvent is not particularly limited, and examples thereof include values of 16 or less, preferably values of 14 or less, and more preferably values of 12 or less.

Among the aliphatic hydrocarbon-based solvents, decane, undecane, or dodecane is particularly preferable, and undecane is most preferable.

By using the hydrocarbon-based solvent (particularly an aliphatic hydrocarbon-based solvent) as the organic solvent included in the rinsing liquid as above, an effect in which the developer that has been slightly soaked into the resist film after the development is washed away, the swelling is further suppressed, and the pattern collapse is inhibited is further exhibited.

The respective components in plural numbers may be mixed, or the components may be mixed with an organic solvent other than the above solvents, and used.

The water content of the rinsing liquid is preferably 10% by mass or less, more preferably 5% by mass or less, and particularly preferably 3% by mass or less. By setting the water content to 10% by mass or less, good development characteristics can be obtained.

The vapor pressure at 20° C. of the rinsing liquid which is used after the step of carrying out development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a range from 0.05 kPa to 5 kPa, the temperature uniformity in a wafer plane is improved, and further, the dimensional uniformity in a wafer plane is enhanced by suppression of swelling due to the permeation of the rinsing liquid.

The rinsing liquid can also be used after adding an appropriate amount of a surfactant thereto.

In the rinsing step, the wafer for which development has been carried out using a developer including an organic solvent is subjected to a washing treatment using a rinsing liquid including the solvent. A method for the washing treatment is not particularly limited, and examples thereof include a method in which a rinsing liquid is continuously discharged on a substrate spun at a constant rate (a spin coating method), a method in which a substrate is immersed in a tank filled with a rinsing liquid for a certain period of time (a dip method), and a method in which a rinsing liquid is sprayed on a substrate surface (a spray method). Among these, a method in which a washing treatment is carried out using a spin coating method, and a substrate is rotated at a rotation speed of 2,000 rpm to 4,000 rpm after washing, thereby removing the rinsing liquid from the substrate, is preferable. Furthermore, it is preferable that a heating step (postbaking) is carried out after the rinsing step. The residual developer and the rinsing liquid between and inside the patterns are removed by the baking. The heating step after the rinsing step is carried out at usually 40° C. to 160° C., and preferably at 70° C. to 95° C., and usually for 10 seconds to 3 minutes, and preferably for 30 seconds to 90 seconds.

Moreover, the pattern forming method of the present invention may have a developing step using an organic developer and a developing step using an alkali developer. An area with a low exposure intensity is removed by development using an organic developer, and an area with a high exposure intensity is also removed by performing development using an alkali developer. By virtue of a multiple development process in which development is carried out in a plurality of times in such a manner, a pattern can be formed by keeping only a region with an intermediate exposure intensity from not being dissolved, so that a finer pattern than usual can be formed (the same mechanism as in paragraph [0077] of JP2008-292975A).

It is preferable that various materials (for example, a resist solvent, a developer, a rinsing liquid, and a composition for forming an antireflection film) used in the resist composition of the present invention and the pattern forming method of the present invention include no impurities such as metals, metal salts including halogen, acids, alkalis, and components including a sulfur atom or a phosphorus atom.

The content of the impurities included in these materials is preferably 1 ppm or less, more preferably 1 ppb or less, still more preferably 100 ppt or less, and particularly preferably 10 ppt or less, and most preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining this material with an ion exchange medium. As the filter, a filter which had been washed with an organic solvent in advance may be used. In the step of filtration using a filter, plural kinds of filters may be connected in series or in parallel, and used. In a case of using plural kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method involving selecting raw materials having a small content of metals as raw materials constituting various materials, a method involving subjecting raw materials constituting various materials to filtration using a filter, and a method involving performing distillation under the condition with contamination being suppressed as much as possible by, for example, lining the inside of a device with TEFLON (registered trademark). The preferred conditions for filtration using a filter, which is carried out for raw materials constituting various materials, are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

Moreover, examples of the method for reducing the impurities such as metals included in an organic treatment liquid of the present invention include a method involving selecting raw materials having a small content of metals as raw materials constituting various materials, a method involving subjecting raw materials constituting various materials to filtration using a filter, and a method involving performing distillation under the condition with contamination being suppressed as much as possible by, for example, lining the inside of a device with TEFLON (registered trademark). The preferred conditions for filtration using a filter, which is carried out for raw materials constituting various materials, are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

<Housing Container>

As the organic solvent (hereinafter also referred to as an "organic treatment liquid") which can be used in the developer and the rinsing liquid, an organic solvent preserved in a housing container of an organic treatment liquid for the patterning of a resist film which is chemically amplified or not chemically amplified, having a housing section is preferably used. The housing container is preferably, for example, a housing container of an organic treatment liquid for the patterning of a resist film, in which the inner wall in contact with an organic treatment liquid of the housing section is formed of a resin different from any of the polyethylene resin, the polypropylene resin, and the polyethylene-polypropylene resin, or a metal which has been subjected to a rust-preventing/metal elution-preventing treatment. An organic solvent that is supposed to be used as an organic treatment liquid for the patterning of a resist film can be contained in the housing section of the housing container, and then discharged from the housing section upon the patterning of the resist film.

In a case where the housing container further has a sealing section for sealing the housing section, the sealing section is preferably formed of a resin different from one or more kinds of resins selected from the group consisting of the polyethylene resin, the polypropylene resin, and the polyethylene-polypropylene resin, or a metal which has been subjected to rust rust-preventing/metal elution-preventing treatments.

Here, the sealing section means a member capable of shielding the housing section from an outside air, and suitable examples thereof include a packing and an O-ring.

The resin different from one or more kinds of resins selected from the group consisting of a polyethylene resin, a polypropylene resin, and a polyethylene-polypropylene resin is preferably a perfluoro resin.

Examples of the perfluoro resin include a polytetrafluoroethylene resin (PTFE), a tetrafluoroethylene-perfluoroalkylvinyl ether copolymer resin (PFA), a tetrafluoroethylene-hexafluoropropylene copolymer resin (FEP), a tetrafluoroethylene-ethylene copolymer resin (ETFE), a chlorotrifluoroethylene-ethylene copolymer resin (ECTFE), a polyvinylidene fluoride resin (PVDF), a polychlorotrifluoroethylene copolymer resin (PCTFE), and a polyvinyl fluoride resin (PVF).

Particularly preferred examples of the perfluoro resin include a tetrafluoroethylene resin, a tetrafluoroethylene-perfluoroalkylvinyl ether copolymer resin, and a tetrafluoroethylene-hexafluoropropylene copolymer resin.

Examples of the metal in the metal which has been subjected to the rust-preventing/metal elution-preventing treatments include carbon steel, alloy steel, nickel-chrome steel, nickel chrome molybdenum steel, chrome steel, chrome molybdenum steel, and manganese steel.

As the rust-preventing/metal elution-preventing treatment, a coating film technique is preferably applied.

The coating technique is largely divided into three kinds of coatings such as metal coating (various platings), inorganic coating (various chemical conversion treatments, glass, concrete, ceramics, and the like) and organic coating (rust preventive oil, paint, rubber, and plastics).

Preferred examples of the coating technique include a surface treatment using a rust-preventing oil, a rust inhibitor, a corrosion inhibitor, a chelate compound, a peelable plastic, or a lining agent.

Among those, various corrosion inhibitors such as chromate, nitrite, silicate, phosphate, carboxylic acids such as oleic acid, dimer acid, and naphthalenic acid, a carboxylic acid metallic soap, sulfonate, an amine salt, esters (a glycerin ester or a phosphate ester of a higher fatty acid), chelate compounds such as ethylenediaminetetraacetic acid, gluconic acid, nitrilotriacetic acid, hydroxyethylethylenediaminetriacetic acid, and diethylenetriaminepentaacetic acid, and a fluorine resin lining are preferable. The phosphate treatment and the fluorine resin lining are particularly preferable.

Furthermore, a "pre-treatment" which is at a pre-stage for the rust-preventing treatment is also preferably employed as a treatment method which leads to extension of an anti-rust period through a coating treatment although not directly preventing rust, as compared with a direct coating treatment.

Specific suitable examples of such a pre-treatment include a treatment for removing various corrosive factors, such as chloride and sulfate, present on a metal surface through washing or polishing.

Specific examples of the housing container include the following ones.

FluoroPurePFA complex drum manufactured by Entegris Inc. (liquid contact inner surface; PFA resin lining)

Steel-made drum can manufactured by JFE (liquid contact inner surface; zinc phosphate film)

Moreover, examples of the housing container which can be used in the present invention include the containers described in [0013] to [0030] of JP1999-021393A (JP-H11-021393A), and [0012] to [0024] of JP1998-45961A (JP-H10-45961A).

An electrically conductive compound may be added to the organic treatment liquid in the present invention in order to prevent the failure of chemical liquid pipes or various parts (filters, O-rings, tubes, and the like) associated with electrostatic charge and subsequently occurring electrostatic discharge. The electrically conductive compound is not particularly limited, but examples thereof include methanol. The addition amount thereof is not particularly limited, but is preferably 10% by mass or less, and more preferably 5% by mass or less, from the viewpoint of maintaining preferred development characteristics. For the members of the chemical liquid pipes, various pipes coated with stainless steel (SUS), or with polyethylene, polypropylene, or fluorine resins (polytetrafluoroethylene, a perfluoroalkoxy resin, and the like) which has been subjected to an antistatic treatment can be used. Similarly, with respect to the filters and the O-rings, polyethylene, polypropylene, or fluorine resins (polytetrafluoroethylene, a perfluoroalkoxy resin, and the like) which has been subjected to an antistatic treatment can be used.

Furthermore, generally, the developer and the rinsing liquid after use are stored in a waste liquid tank though a pipe. Here, in a case where a hydrocarbon-based solvent is used as the rinsing liquid, there is a method in which in order to prevent a resist dissolved in a developer from being precipitated and adhered onto the back surface of a wafer, the side surface of a pipe, or the like, a solvent in which a resist is dissolved is again passed through the pipe. Examples of a method for passing the solvent though the pipe include a method in which after washing with a rinsing liquid, the back surface or side surface of a substrate, or the like is washed with a solvent in which a resist is dissolved and the solvent is allowed to flow out, and a method in which a solvent in which a resist is dissolved is allowed to flow out by passing through a pipe while being not brought into contact with the resist.

The solvent which passes through the pipe is not particularly limited as long as it is capable of dissolving a resist, examples thereof include the above-mentioned organic solvents, and thus, propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lacctate, 1-propanol, acetone, or the like can be used. Among those, PGMEA, PGME, or cyclohexanone can be preferably used.

By using a pattern obtained by the pattern forming method of the present invention as a mask, and appropriately carrying out an etching treatment, ion injection, or the like, a semiconductor fine circuit, a mold structure for imprints, a photomask, or the like can be produced.

The pattern formed by the method can also be used for a guide pattern formation in a directed self-assembly (DSA) (see, for example, ACS Nano Vol. 4 No. 8 Pages 4815-4823). In addition, a pattern formed by the method can be used as, for example, a core material (core) of the spacer process disclosed in JP1991-270227A (JP-H03-270227A) and JP2013-164509A.

In addition, a process of a case where a mold for imprints is manufactured using the composition of the present invention is described in, for example, JP4109085B, JP2008-162101A, and "Fundamentals of Nanoimprint and Technical Development/Application Deployment-Substrate Technique of Nanoimprint and Latest Application Deployment", edited by Yoshihiko Hirai (Frontier Publishing).

A photomask produced using the pattern forming method of the present invention may be a light transmissive type mask used in ArF excimer laser or a light reflective type mask used in reflection system lithography using EUV light as a light source.

Furthermore, the present invention also relates to a method for manufacturing an electronic device, including the pattern forming method of the present invention as described above.

An electronic device produced by the method for manufacturing an electronic device of the present invention is suitably mounted on electric or electronic equipment (home electronics, office automation (OA)-related equipment, media-related equipment, optical equipment, telecommunication equipment, and the like).

EXAMPLES

Hereinbelow, the present invention will be described in more detail with reference to Examples. However, the present invention is not intended to be limited to Examples shown below while not departing from the spirit of the present invention. Further, "parts" and "%" are given on the basis of mass unless otherwise specifically stated.

Reference Synthesis Example 1: Synthesis of Compound M-1-1

(Synthesis of Chloroether Compound)

26.50 g of cyclohexane carbaldehyde was dissolved in 132.5 g of n-hexane, 89.9 g of triisopropyl orthoformate and 2.74 g of 10-camphorsulfonic acid were added thereto, and the mixture was stirred at room temperature for 6 hours. After stopping the reaction by the addition of 100 g of ion exchange water, 200 g of ethyl acetate was added to the mixture, the organic layer was washed five times with 100 g of ion exchange water, and then dried over anhydrous magnesium sulfate, and the solvent was distilled off to obtain 101.2 g of a solution containing a compound (1).

To 33.73 g of the solution containing a compound (1) was added 6.480 g of acetyl chloride, and the mixture was stirred at 50° C. for 2 hours. After returning to room temperature, unreacted acetyl chloride was removed under a condition with reduced pressure to obtain 29.98 g of a solution containing a compound (2) as a chloroether compound.

(Synthesis of Compound M-I-1)

12.44 g of a 50.00%-by-mass cyclohexanone solution of a compound (3) was dissolved in 37.32 g of dehydrated tetrahydrofuran, 6.601 g of triethylamine was added thereto, and the mixture was stirred in a nitrogen atmosphere. The mixture was cooled to 0° C., 18.76 g of the solution containing a compound (2) was added dropwise thereto for 30 minutes, and the mixture was stirred for 2 hours. After returning to room temperature, 200 g of ethyl acetate was added thereto, the organic layer was washed five times with 100 g of ion exchange water, and then dried over anhydrous magnesium sulfate, and the solvent was distilled off. The residue was isolated and purified by column chromatography to obtain 12.07 g of a compound (M-I-1).

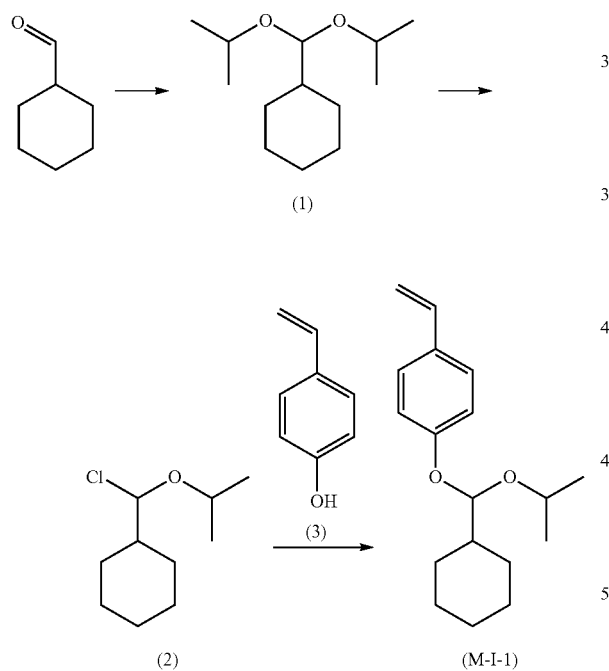

Synthesis Example 1: Synthesis of Resin P-4

29.2 g of the 50.00%-by-mass cyclohexanone solution of a compound (3), 4.39 g of the compound (M-I-1), 1.2 g of a compound (4), and 1.86 g of a polymerization initiator V-601 (manufactured by Wako Pure Chemical Industries, Ltd.) were dissolved in 9.27 g of cyclohexanone. 1.09 g of cyclohexanone was put into a reaction container and added dropwise into a system at 85° C. for 4 hours in a nitrogen gas atmosphere. The reaction solution was heated and stirred for 2 hours, and then left to be cooled to room temperature.

The reaction solution was added dropwise to 2,000 g of heptane/ethyl acetate=9/1 (mass ratio) to precipitate a polymer, which was filtered. Using 400 g of heptane/ethyl acetate=9/1 (mass ratio), the filtered solid was washed. Thereafter, the washed solid was dried under reduced pressure to obtain 16.54 g of a resin (P-4).

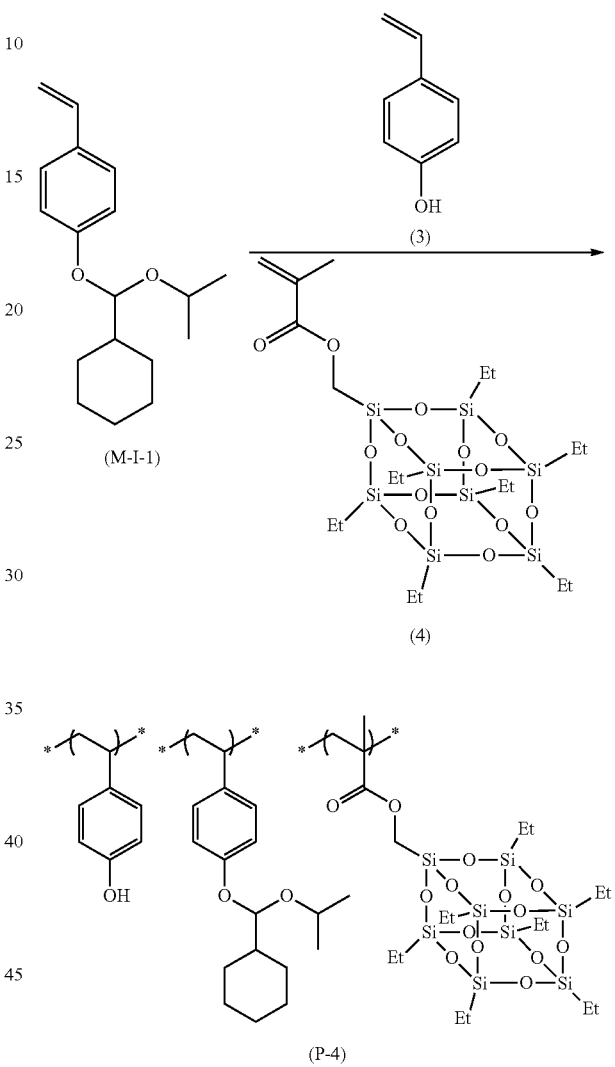

In the same manner as for the resin (P-4), resins (P-1) to (P-3), and (P-5) to (P-122) were synthesized.

For the obtained resins, a weight-average molecular weight (Mw: in terms of polystyrene), a number-average molecular weight (Mn: in terms of polystyrene), and a dispersity (Mw/Mn, hereinafter referred to as "Pd") were calculated by means of GPC (carrier: tetrahydrofuran (THF)) measurement. Further, the compositional ratio (molar ratio) was calculated by $^1$H-NMR (Nuclear Magnetic Resonance) measurement.

The structures of the synthesized resins are shown, together with the compositional ratios (molar ratios), the weight-average molecular weights (Mw), and the dispersities (Mw/Mn) of the repeating units. Et represents an ethyl group. iBu represents an isobutyl group. TMS represents a trimethylsilyl group.

(P-1)
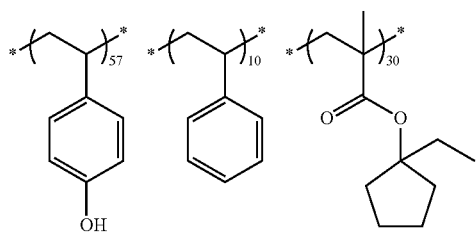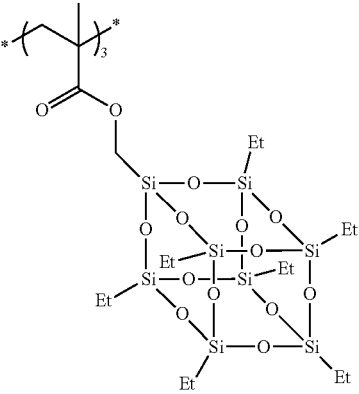
Mw: 4500
Mw/Mn: 1.67
(P-2)
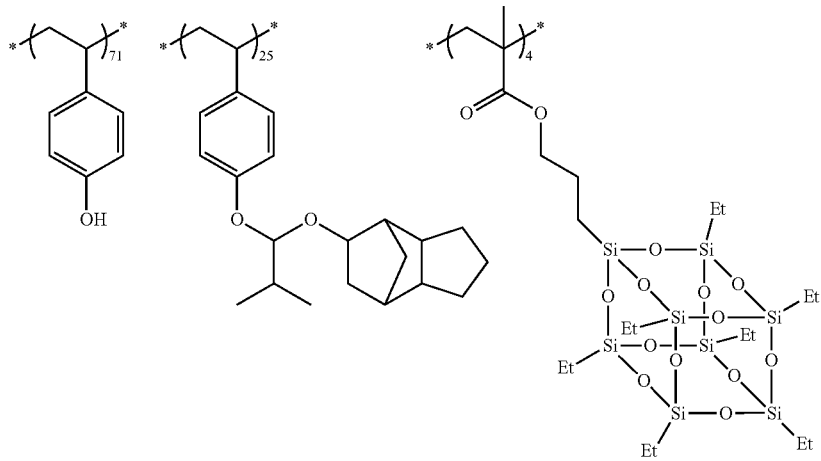
Mw: 9000
Mw/Mn: 1.63
(P-3)
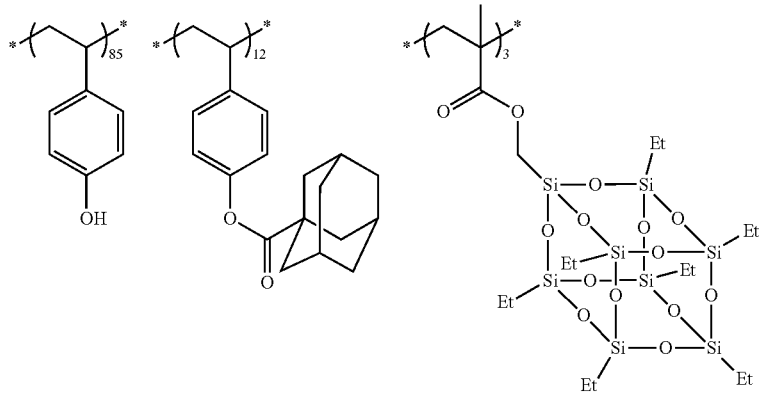
Mw: 5500
Mw/Mn: 1.55

(P-4)
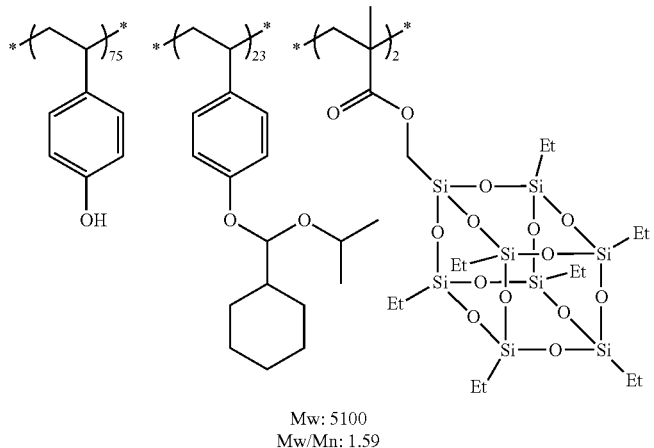
Mw: 5100
Mw/Mn: 1.59
(P-5)
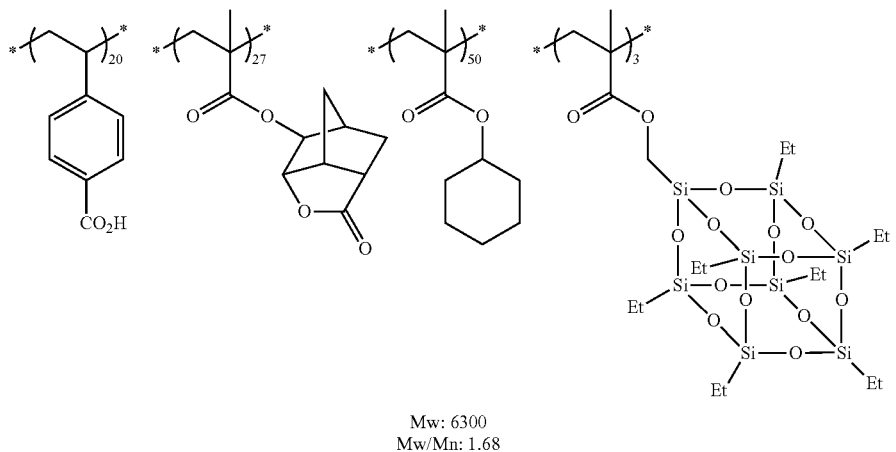
Mw: 6300
Mw/Mn: 1.68
(P-6)
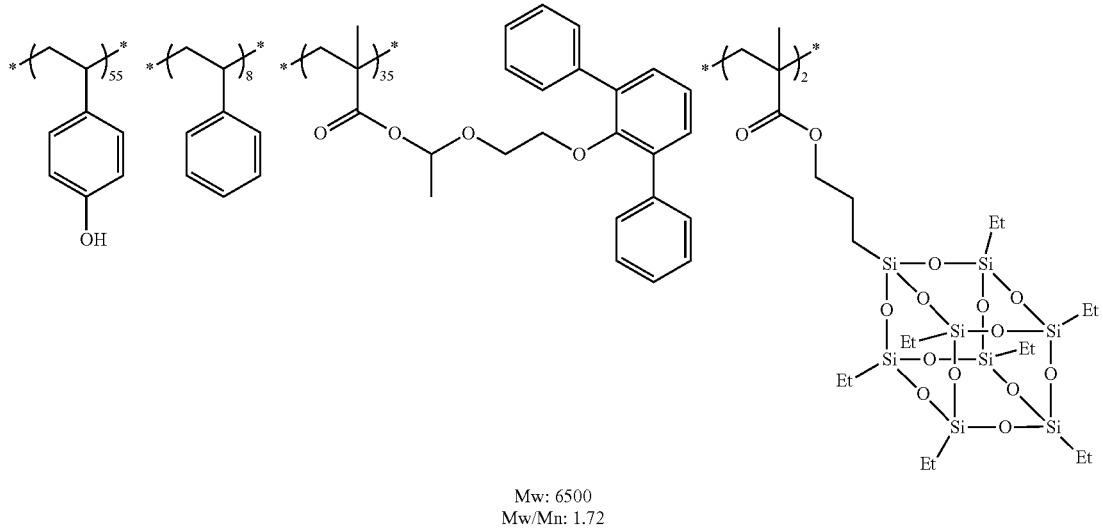
Mw: 6500
Mw/Mn: 1.72

-continued
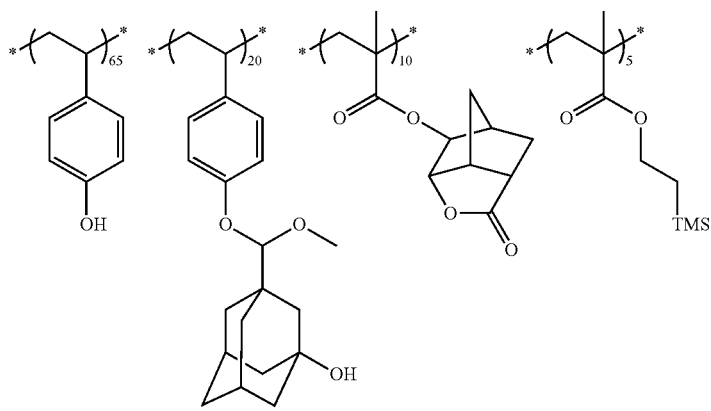
(P-7)
Mw: 12100
Mw/Mn: 1.63
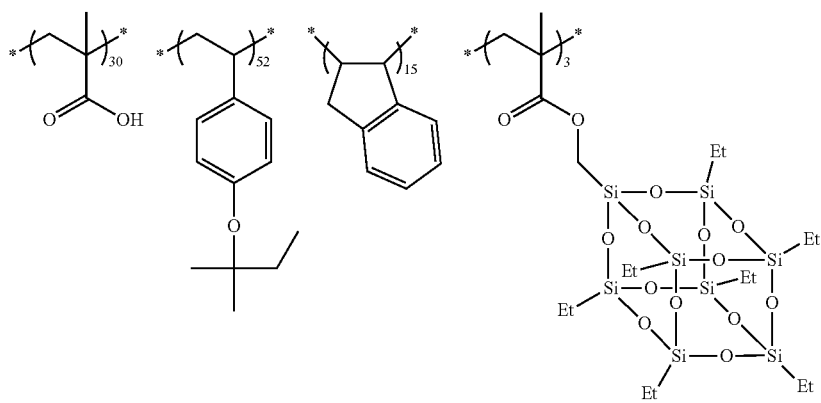
(P-8)
Mw: 15000
Mw/Mn: 1.83
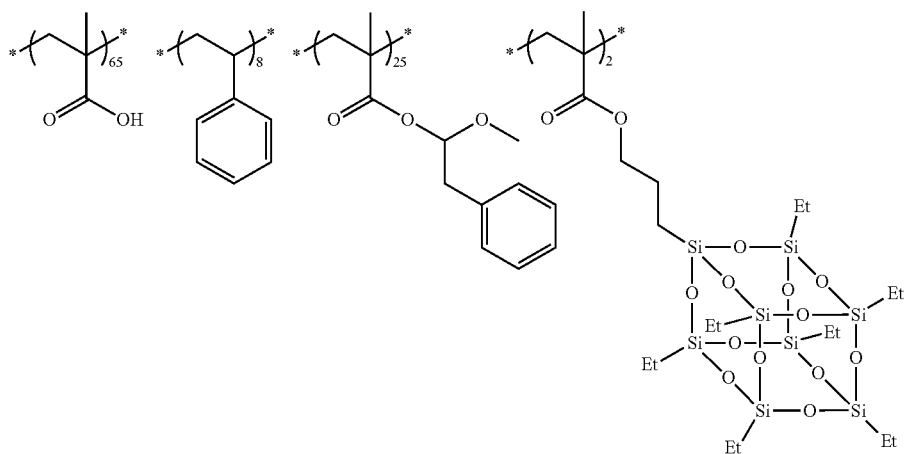
(P-9)
Mw: 14500
Mw/Mn: 1.77

(P-10)
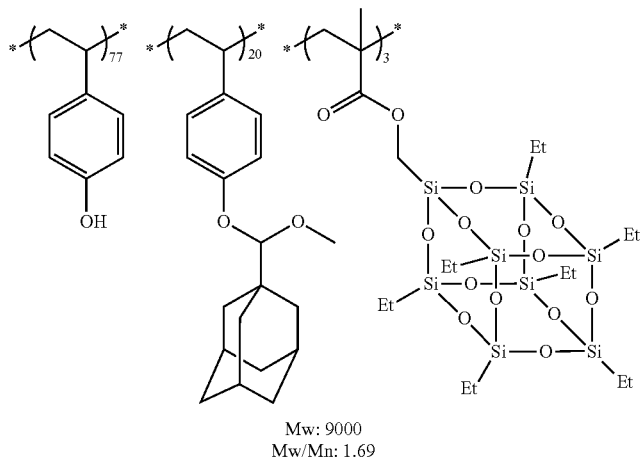
Mw: 9000
Mw/Mn: 1.69
(P-11)
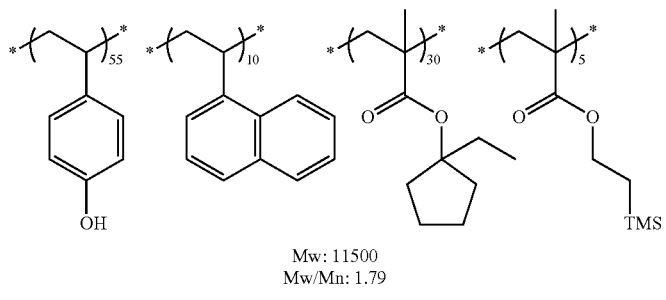
Mw: 11500
Mw/Mn: 1.79
(P-12)
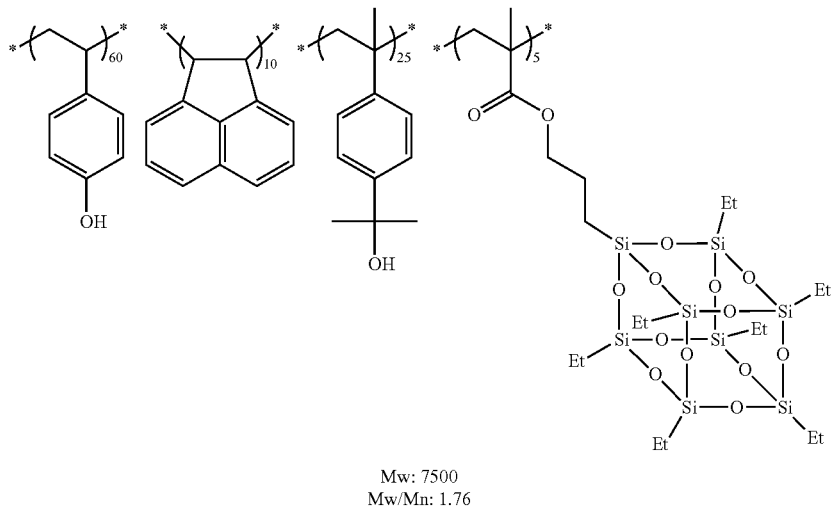
Mw: 7500
Mw/Mn: 1.76

-continued
(P-13)
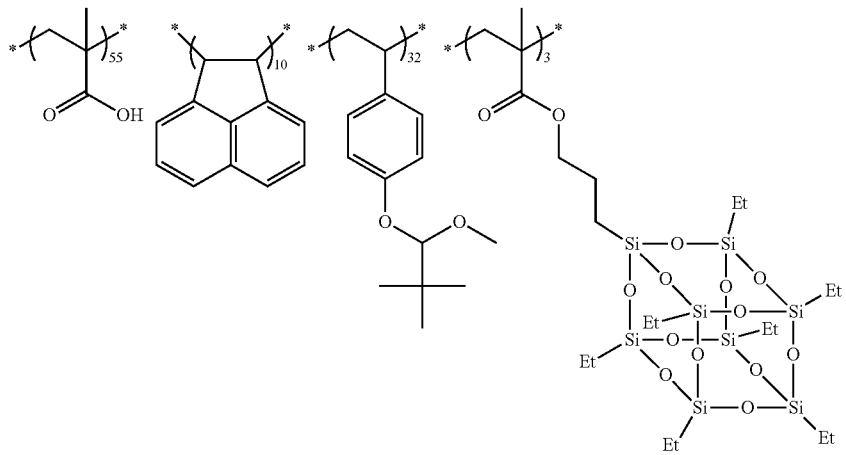
(P-14)
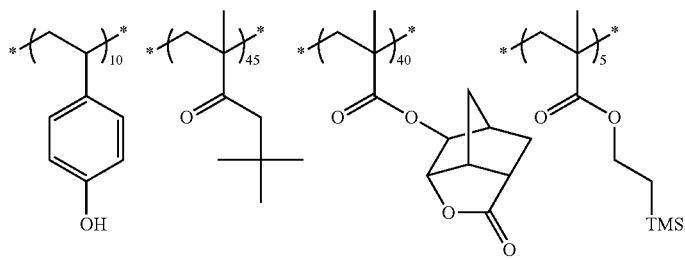
(P-15)
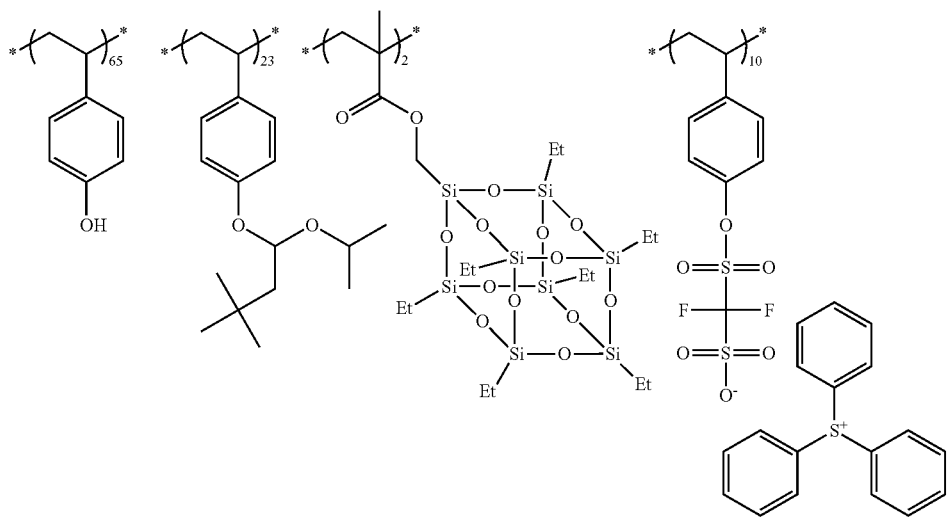

-continued
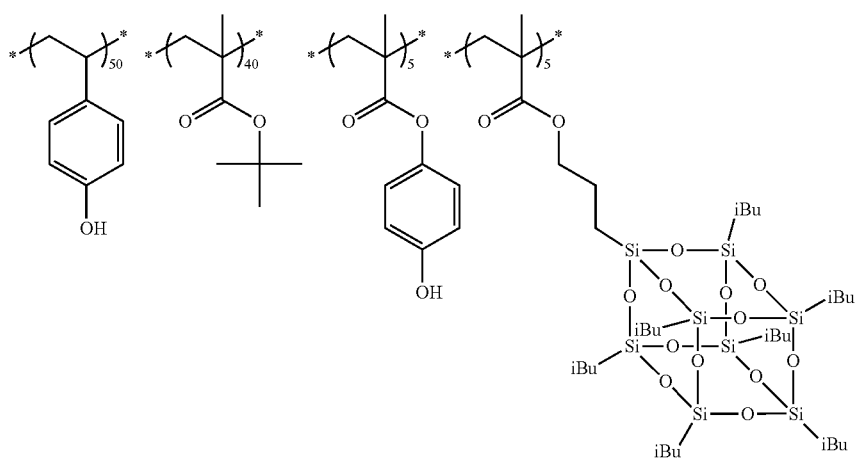
(P-16)
Mw: 10500
Mw/Mn: 1.57
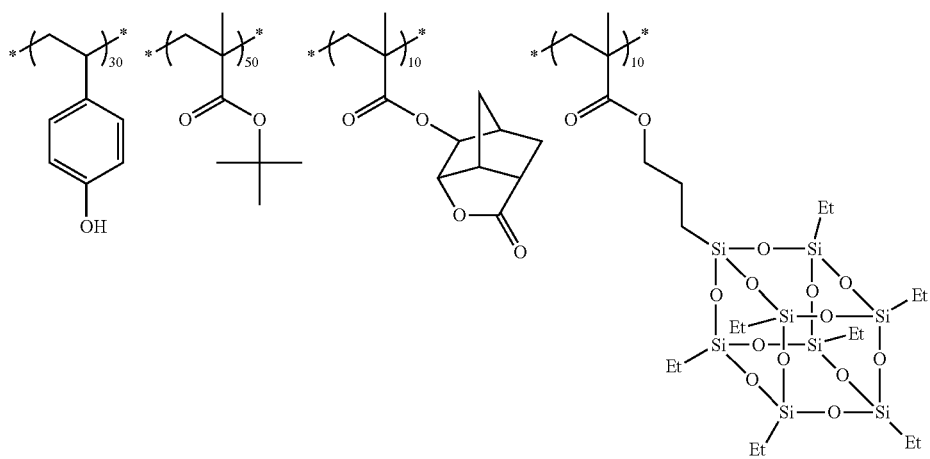
(P-17)
Mw: 11000
Mw/Mn: 1.58
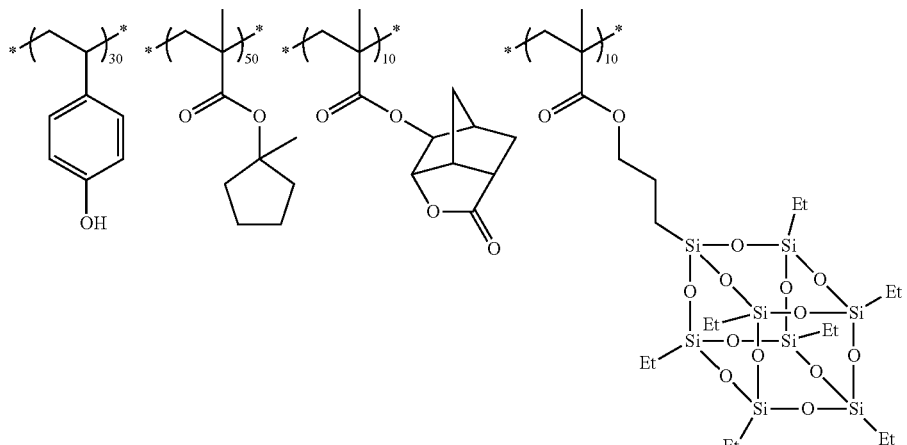
(P-18)
Mw: 12100
Mw/Mn: 1.53

-continued
(P-19)
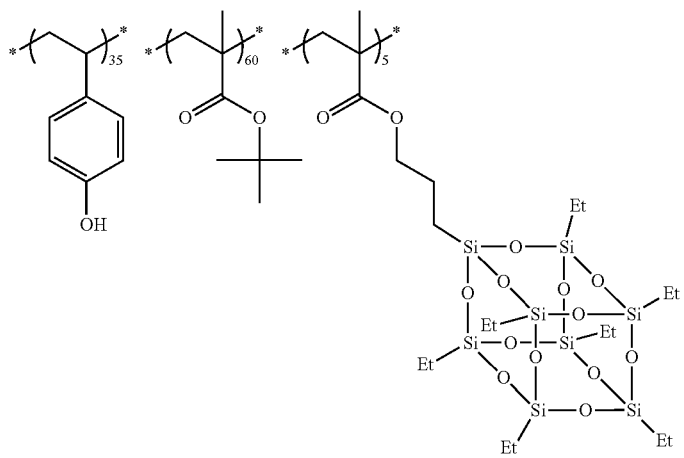
Mw: 9500
Mw/Mn: 1.48
(P-20)
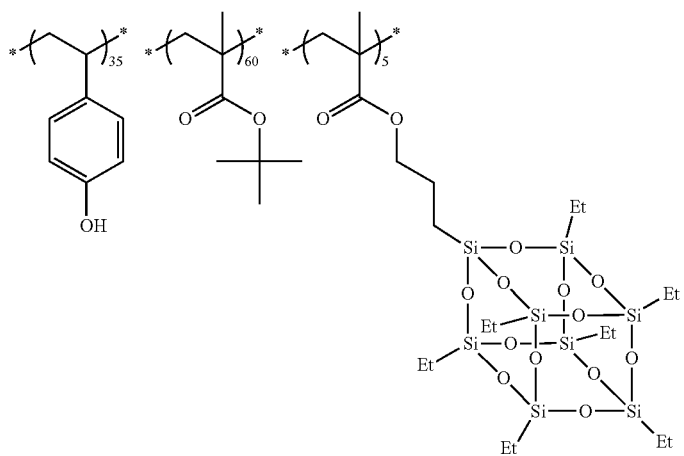
Mw: 11500
Mw/Mn: 1.38
(P-21)
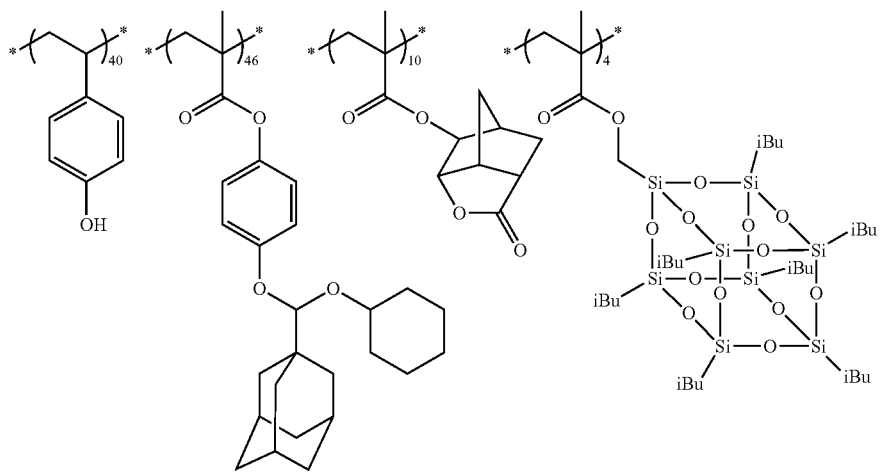
Mw: 11100
Mw/Mn: 1.67

-continued

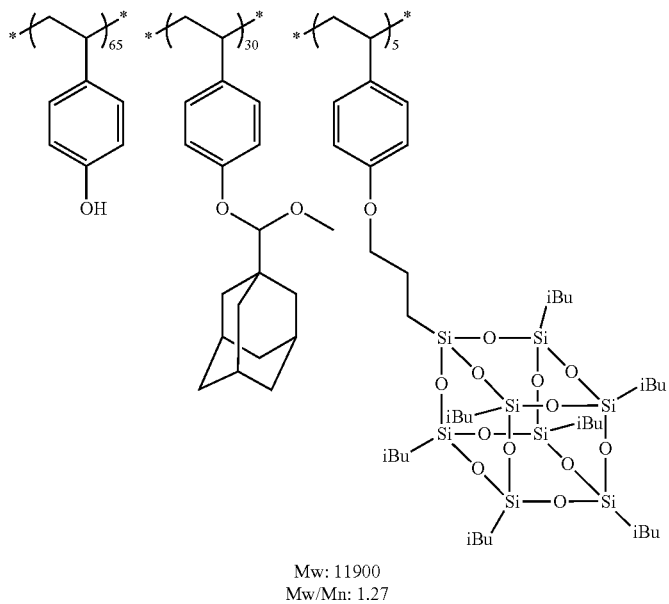

(P-22)

Mw: 11900
Mw/Mn: 1.27

Hereinafter, in the same manner, resins (P'-1) to (P'-4) were synthesized. The structures, the compositional ratios (molar ratios), the weight-average molecular weights, and the dispersities of the respective synthesized resins are shown below.

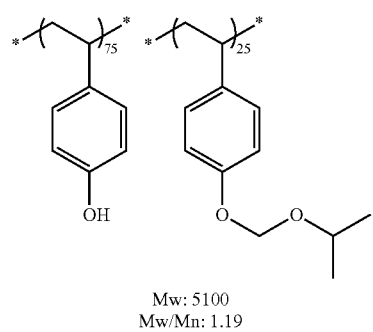

(P'-1)

Mw: 5100
Mw/Mn: 1.19

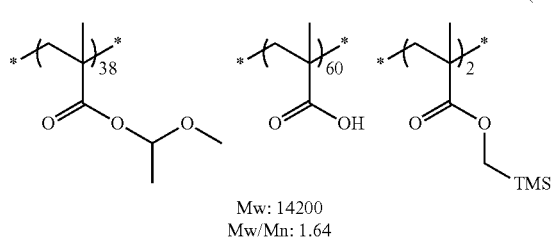

(P'-2)

Mw: 14200
Mw/Mn: 1.64

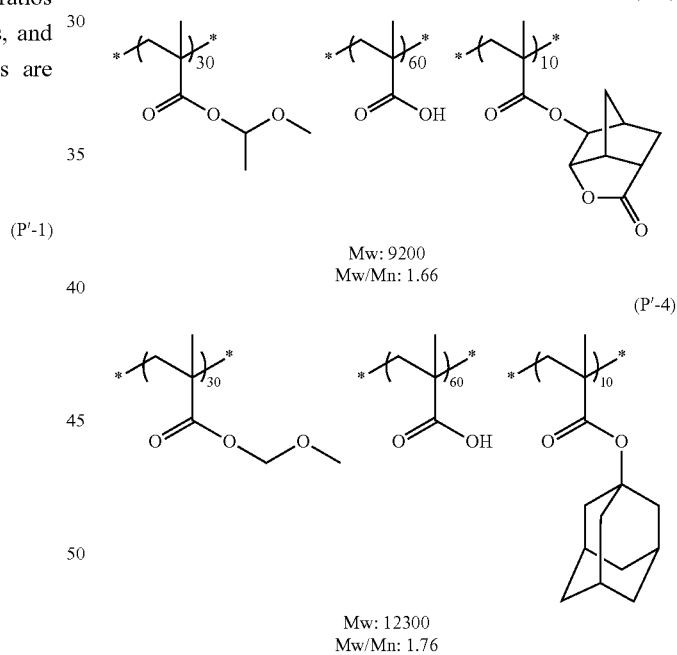

(P'-3)

Mw: 9200
Mw/Mn: 1.66

(P'-4)

Mw: 12300
Mw/Mn: 1.76

Hereinafter, the photoacid generators, the basic compounds, the crosslinking agents, the hydrophobic resins, the surfactants, the solvents, the developers, and the rinsing liquids used in Examples and Comparative Examples are shown below.

[Photoacid Generator]

As the photoacid generator, acid generators z1 to z36 exemplified above were appropriately selected and used.

[Basic Compound]
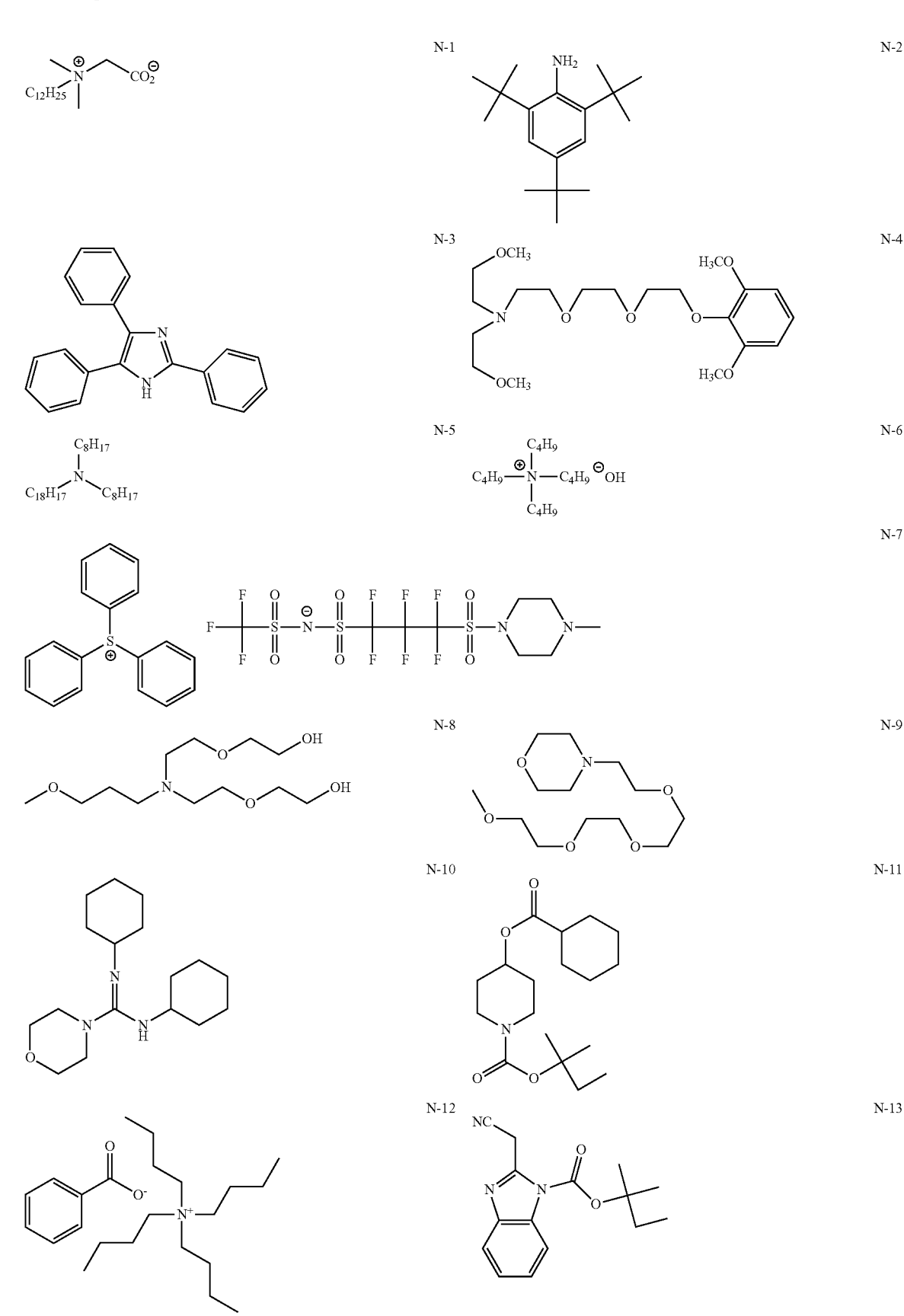

-continued
N-14
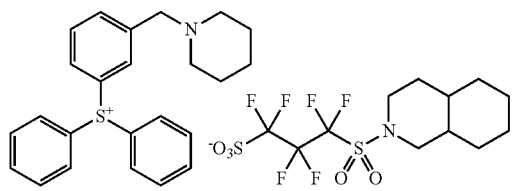
N-15
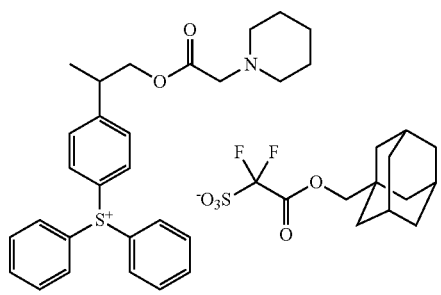
[Crosslinking Agent]
(A-1)
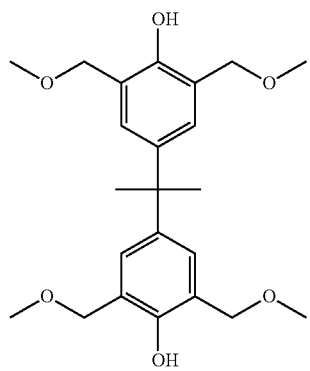
(A-2)
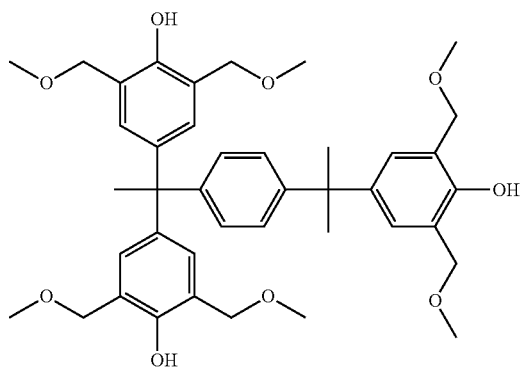
(A-3)
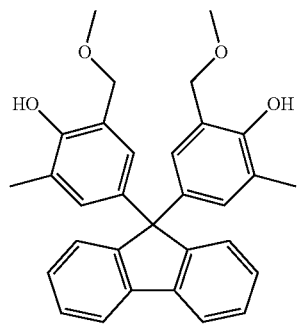
(A-4)
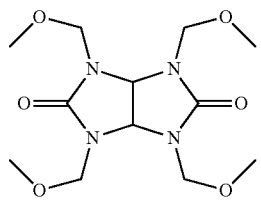
[Hydrophobic Resin]
B-1
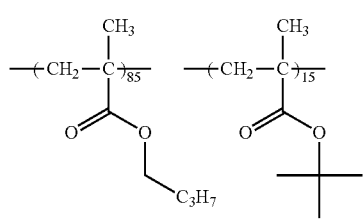
Mw: 10000
Mw/Mn: 1.51
B-2
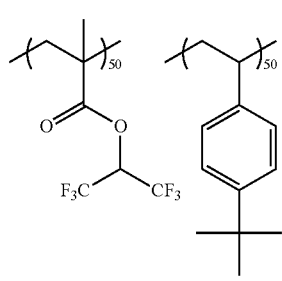
Mw: 5000
Mw/Mn: 1.60

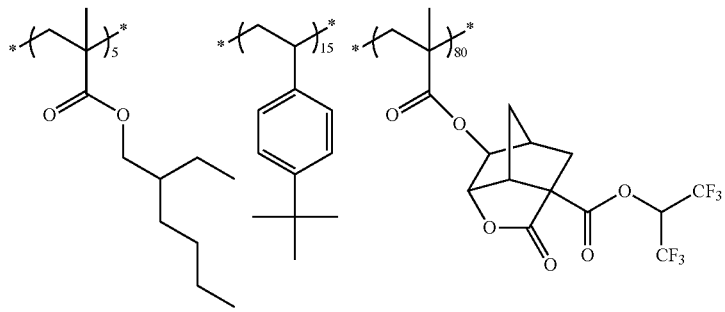

Mw: 18000
Mw/Mn: 1.80

B-3

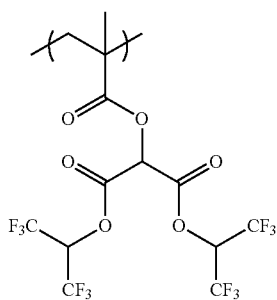

Mw: 11000
Mw/Mn: 1.46

B-4

[Solvent]

S-1: Propylene glycol monomethyl ether acetate (PGMEA) (boiling point of 146° C.)

S-2: Propylene glycol monomethyl ether (PGME) (boiling point of 120° C.)

S-3: Ethyl lactate (boiling point of 151° C.)

S-4: Cyclohexanone (boiling point of 157° C.)

[Surfactant]

W-1: MEGAFAC R08 (manufactured by DIC, Inc.; fluorine- and silicon-based)

W-2: Polysiloxane Polymer KP-341 (manufactured by Shin-Etsu Chemical Co., Ltd.; silicon-based)

W-3: TROYSOL S-366 (manufactured by Troy Chemical Co., Ltd.; fluorine-based)

W-4: PF6320 (manufactured by OMNOVA Solutions Inc.; fluorine-based)

[Developer/Rinsing Liquid]

G-1: 2.38%-by-mass Aqueous tetramethylammonium hydroxide solution

G-2: Butyl acetate

G-3: 3-Methylbutyl acetate

G-4: Pure water

G-5: Undecane

G-6: Diisobutyl ketone

G-7: Isobutyl isobutanoate

G-8: 2,5-Dimethyl-4-hexanone

Examples 1-A to 30-A, and Comparative Examples 1-A' to 4-A' (Exposure with Electron Beams (EB))

(1) Preparation and Coating of Coating Solution of Resist Composition

A coating solution composition with a concentration of the solid content of 2.5% by mass, having the composition shown in Table 1, was micro-filtered through a membrane filter having a pore diameter of 0.1 μm to obtain a resist composition solution. This resist composition solution was applied onto a 6-inch Si wafer which had been subjected to a hexamethyldisilazane (HMDS) treatment in advance, using a spin coater, Mark 8, manufactured by Tokyo Electron Ltd., and dried on a hot plate at 100° C. for 60 seconds to obtain resist films having a film thickness of 50 nm and 100 nm, respectively.

Here, 1 inch is 0.0254 m.

(2) EB Exposure and Development

The wafer having the resist film applied thereon obtained in (1) above was patternwise irradiated, using an electron beam lithography apparatus (HL750, manufactured by Hitachi, Ltd., accelerating voltage: 50 KeV). At this time, the lithography was performed so as to form a 1:1 line-and-space. After the electron beam lithography, the wafer was heated on a hot plate at 100° C. for 60 seconds, and then the developer described in the following table was puddled to perform a development for 30 seconds. With the exception of some of Examples and Comparative Examples, rinsing was performed using the rinsing liquid described in the same table, and then, the wafer was rotated at a rotation speed of 4,000 rpm for 30 seconds, and then heated at 95° C. for 60 seconds to obtain a resist pattern of a 1:1 line-and-space pattern with a line width of 45 nm.

(3) Evaluation of Resist Pattern

Using a scanning electron microscope (S-9220, manufactured by Hitachi Ltd.), the obtained resist pattern was evaluated for pattern collapse performance by the following methods. The results are shown in Table 1.

(Pattern Collapse Performance)

Exposure was performed with irradiation energy for separation and resolution at a ratio of line to space of 1:1 at a line width of 45 nm.

The obtained resist pattern was observed using a scanning electron microscope (S-9380II, manufactured by Hitachi Ltd.).

The resolution status at a line width of 45 nm, obtained by the method, was observed by a scanning electron microscope to determine the number of pattern collapse. While shifting the observation point by 1 μm, photographs of 1,000 sheets was taken, and by taking a case where pattern collapse was observed in one field of view in photography as NG and a case where pattern collapse was not observed as OK, the number of photographs of NG was counted. According to the number of photographs of NG, the results were classified into the following A to D. A smaller NG indicates better pattern collapse performance. The results of cases where resist films having a film thickness of 50 nm were used and the results of cases where resist films having a film thickness of 100 nm were used were shown in the columns of "Aspect ratio≤2" and "Aspect ratio>2", respectively.

A: 0 Sheet
B: 1 to 10 Sheets
C: 11 to 100 Sheets
D: 101 to 1,000 Sheets

TABLE 1

| | Composition of resist | | | | | | | | | Collapse performance | |
|---|---|---|---|---|---|---|---|---|---|---|---|
| | Resin (P1) (% by mass) | Solvent (mass ratio) | Photoacid generator (% by mass) | Basic compound (% by mass) | Crosslinking agent (% by mass) | Hydrophobic resin (% by mass) | Surfactant (% by mass) | Developer (mass ratio) | Rinsing liquid | Aspect ratio ≤2 | Aspect ratio 2< |
| Example 1-A | P-11 77.4 | S-1/S-2 50/50 | z1 20.0 | N-3 2.5 | — | — | W-1 0.1 | G-1 | G-4 | B | B |
| Example 2-A | P-5 75.4 | S-1/S-2/S-3 40/40/20 | z19 12.0 | N-3 2.5 | A-2 10.0 | — | W-2 0.1 | G-3 | G-5 | A | A |
| Example 3-A | P-7 83.4 | S-1/S-2/S-3 40/40/20 | z28 15.0 | N-6 1.5 | — | — | W-2 0.1 | G-1 | G-4 | A | B |
| Example 4-A | P-4 77.5 | S-1/S-2 60/40 | z5 21.0 | N-6 1.5 | — | — | — | G-1 | G-4 | A | A |
| Example 5-A | P-1 82.9 | S-2/S-1 60/40 | z8 15.0 | N-4 2.0 | — | — | W-1 0.1 | G-1 | — | A | A |
| Example 6-A | P-6/P-10 (mass ratio 40/60) 81.4 | S-2/S-3 60/40 | z8 17.0 | N-1 1.5 | — | — | W-2 0.1 | G-1 | — | A | A |
| Example 7-A | P-10 68.5 | S-2/S-1 50/50 | z4 23.0 | N-15 2.0 | — | B-3 6.5 | — | G-1 | — | A | A |
| Example 8-A | P-2 78.0 | S-2/S-1 80/20 | z3 20.0 | N-7 2.0 | — | — | — | G-1 | G-4 | A | A |
| Example 9-A | P-3 65.4 | S-3/S-4 80/20 | z29 15.0 | N-13 2.5 | A-3 10.0 | B-3 7.0 | W-3 0.1 | G-1 | G-4 | A | A |
| Example 10-A | P-2 73.0 | S-2/S-4 70/30 | z4 25.0 | N-1/N-6 (mass ratio 20/80) 2.0 | — | — | — | G-1 | G-4 | A | A |
| Example 11-A | P-12 72.9 | S-1/S-2/S-3 40/40/20 | z11 12.0 | N-14 3.0 | A-4 12.0 | — | W-4 0.1 | G-1 | — | A | A |
| Example 12-A | P-13 81.5 | S-1/S-2/S-3 60/30/10 | z22 18.0 | N-6 0.5 | — | — | — | G-1 | G-4 | A | A |
| Example 13-A | P-4 61.0 | S-1/S-2 90/10 | z5 30.0 | N-7 3.0 | — | B-1 6.0 | — | G-1 | G-4 | A | A |
| Example 14-A | P-8 64.0 | S-1/S-3 50/50 | z17 34.0 | N-8 2.0 | — | — | — | G-1 | G-4 | A | A |
| Example 15-A | P-14 79.9 | S-1/S-2 60/40 | z5 18.0 | N-6 2.0 | — | — | W-2 0.1 | G-3 | G-5 | A | B |
| Example 16-A | P-6 77.9 | S-1/S-2 60/40 | z34 21.0 | N-1 1.0 | — | — | W-2 0.1 | G-1 | G-4 | A | A |
| Example 17-A | P-9 92.9 | S-1/S-3 90/10 | z13 5.0 | N-9 2.0 | — | — | W-1 0.1 | G-1 | G-4 | A | A |
| Example 18-A | P-8 77.4 | S-1/S-2/S-3 70/20/10 | z4 21.0 | N-12 1.5 | — | — | W-2 0.1 | G-1 | G-4 | A | A |
| Example 19-A | P-13 79.9 | S-1/S-3 50/50 | z4/z29 (mass ratio 40/60) 18.0 | N-10 2.0 | — | — | W-3 0.1 | G-1 | G-4 | A | A |
| Example 20-A | P-10 56.0 | S-2/S-1 80/20 | z3 40.0 | N-11 4.0 | — | — | — | G-1 | G-4 | A | A |
| Example 21-A | P-5 57.9 | S-1/S-3/S-4 50/40/10 | z23 32.0 | N-9 2.0 | A-1 8.0 | — | W-1 0.1 | G-2 | G-5 | A | A |
| Example 22-A | P-13 76.4 | S-1/S-2/S-3 50/40/10 | z15 21.0 | N-6 2.5 | — | — | W-3 0.1 | G-1 | G-4 | A | A |
| Example 23-A | P-9 86.5 | S-2/S-4 90/10 | z28 12.0 | N-5 1.5 | — | — | — | G-1 | — | A | A |
| Example 24-A | P-15 97.5 | S-1/S-2/S-3 50/30/20 | — | N-8 2.5 | — | — | — | G-2 | G-4 | A | A |
| Example 25-A | P-17 85.5 | S-1/S-2 80/20 | z5 12.0 | N-8 2.5 | — | — | — | G-3/G-7 50/50 | G-5 | A | A |
| Example 26-A | P-18 73.0 | S-1/S-2/S-3 40/40/20 | z13 25.0 | N-10 2.0 | — | — | — | G-5/G-6 10/90 | G-5 | A | A |

TABLE 1-continued

| | | | Composition of resist | | | | | | | | Collapse performance | |
|---|---|---|---|---|---|---|---|---|---|---|---|---|
| | Resin (P1) (% by mass) | Solvent (mass ratio) | Photoacid generator (% by mass) | Basic compound (% by mass) | Crosslinking agent (% by mass) | Hydrophobic resin (% by mass) | Surfactant (% by mass) | Developer (mass ratio) | Rinsing liquid | Aspect ratio ≤2 | Aspect ratio 2< |
| Example 27-A | P-19 81.5 | S-1/S-2/S-3 40/40/20 | z5 17.0 | N-6 1.5 | — | — | — | G-6 | G-5 | A | A |
| Example 28-A | P-22 75.0 | S-1/S-3/S-4 50/40/10 | z17 22.0 | N-7 3.0 | — | — | — | G-1 | G-4 | A | A |
| Example 29-A | P-20 76.9 | S-1/S-2 50/50 | z5 21.0 | N-9 2.0 | — | — | W-1 0.1 | G-1 | G-4 | A | A |
| Example 30-A | P-21 80.0 | S-1/S-2 50/50 | z23 18.0 | N-10 2.0 | — | — | — | G-1 | G-4 | A | A |
| Comparative Example 1-A' | P'-2 89.9 | S-1/S-2 80/20 | z35 8.0 | N-9 2.0 | — | — | W-1 0.1 | G-1 | G-4 | C | C |
| Comparative Example 2-A' | P'-1 77.4 | S-1/S-2/S-3 60/20/20 | z16 20.0 | N-2 2.5 | — | — | W-3 0.1 | G-1 | — | C | D |
| Comparative Example 3-A' | P'-3 70.5 | S-1/S-2 70/30 | z30 28.0 | N-7 1.5 | — | — | — | G-1 | G-4 | D | D |
| Comparative Example 4-A' | P'-4 95.9 | S-3/S-4 50/50 | z10 2.0 | N-4 2.0 | — | — | W-4 0.1 | G-1 | G-4 | D | D |

Examples 1-B to 33-B, and Comparative Examples 1-B' to 4-B' (Exposure with Extreme Ultraviolet Rays (EUV)

(4) Preparation and Coating of Coating Solution of Resist Composition

A coating solution composition with a concentration of the solid content of 1.5% by mass, having the composition shown in Table 2, was micro-filtered through a membrane filter having a pore diameter of 0.1 m to obtain a resist composition solution. This resist composition solution was applied onto a 6-inch Si wafer which had been subjected to a hexamethyldisilazane (HMDS) treatment in advance, using a spin coater, Mark 8, manufactured by Tokyo Electron Ltd., and dried on a hot plate at 100° C. for 60 seconds to obtain resist films having a film thickness of 50 nm and 100 nm, respectively.

(5) EUV Exposure and Development

The wafer having the resist film applied thereon obtained in (4) above was patternwise irradiated, using an EUV exposure device (manufactured by Exitech, Micro Exposure Tool, NA0.3, Quadrupole, outer sigma of 0.68, and inner sigma of 0.36) with an exposure mask (line/space=1/1). After the exposure, the wafer was heated on a hot plate at 100° C. for 90 seconds, and then the developer described in the following table was puddled to perform a development for 30 seconds. With the exception of some of Examples and Comparative Examples, rinsing was performed using the rinsing liquid described in the same table, and then, the wafer was rotated at a rotation speed of 4,000 rpm for 30 seconds, and then baked at 95° C. for 60 seconds to obtain a resist pattern of a 1:1 line-and-space pattern with a line width of 45 nm.

(6) Evaluation of Resist Pattern

Using a scanning electron microscope (S-9220, manufactured by Hitachi Ltd.), the obtained resist pattern was evaluated for pattern collapse performance by the following methods. The results are shown in Table 2.

(Pattern Collapse Performance)

Exposure was performed with irradiation energy for separation and resolution at a ratio of line to space of 1:1 at a line width of 45 nm.

The obtained resist pattern was observed using a scanning electron microscope (S-9380II, manufactured by Hitachi Ltd.).

The resolution status at a line width of 45 nm, obtained by the method, was observed by a scanning electron microscope to determine the number of pattern collapse. While shifting the observation point by 1 μm, photographs of 1,000 sheets was taken, and by taking a case where pattern collapse was observed in one field of view in photography as NG and a case where pattern collapse was not observed as OK, the number of photographs of NG as counted. According to the number of photographs of NG, the results were classified into the following A to D. A smaller NG indicates better pattern collapse performance. The results of cases where resist films having a film thickness of 50 nm were used and the results of cases where resist films having a film thickness of 100 nm were used are shown in the columns of "Aspect ratio≤2" and "Aspect ratio>2", respectively.

A: 0 Sheet
B: 1 to 10 Sheets
C: 11 to 100 Sheets
D: 101 to 1,000 Sheets

TABLE 2

| | | | Composition of resist | | | | | | | Collapse performance | |
|---|---|---|---|---|---|---|---|---|---|---|---|
| | Resin (P1) (% by mass) | Solvent (mass ratio) | Photoacid generator (% by mass) | Basic compound (% by mass) | Hydrophobic resin (% by mass) | Surfactant (% by mass) | Developer (mass ratio) | Rinsing liquid (mass ratio) | | Aspect ratio ≤2 | Aspect ratio 2< |
| Example 1-B | P-11 77.4 | S-1/S-2 50/50 | z1 20.0 | N-3 2.5 | — | W-1 0.1 | G-1 | G-4 | | B | C |

TABLE 2-continued

| | Composition of resist | | | | | | | | Collapse performance | |
|---|---|---|---|---|---|---|---|---|---|---|
| | Resin (P1) (% by mass) | Solvent (mass ratio) | Photoacid generator (% by mass) | Basic compound (% by mass) | Hydrophobic resin (% by mass) | Surfactant (% by mass) | Developer (mass ratio) | Rinsing liquid (mass ratio) | Aspect ratio ≤2 | Aspect ratio 2< |
| Example 2-B | P-16 85.5 | S-1/S-2/S-3 40/40/20 | z5 12.0 | N-3 2.5 | — | — | G-6 | G-5 | A | A |
| Example 3-B | P-7 83.4 | S-1/S-2/S-3 40/40/20 | z28 15.0 | N-6 1.5 | — | W-2 0.1 | G-1 | G-4 | B | C |
| Example 4-B | P-4 77.5 | S-1/S-2 60/40 | z5 21.0 | N-6 1.5 | — | — | G-1 | G-4 | A | A |
| Example 5-B | P-1 82.9 | S-2/S-1 60/40 | z8 15.0 | N-4 2.0 | — | W-1 0.1 | G-1 | — | A | A |
| Example 6-B | P-6/P-10 (mass ratio 40/60) 81.4 | S-2/S-3 60/40 | z8 17.0 | N-1 1.5 | — | W-2 0.1 | G-1 | — | A | A |
| Example 7-B | P-10 68.5 | S-2/S-1 50/50 | z4 23.0 | N-1 2.0 | B-3 6.5 | — | G-1 | — | A | A |
| Example 8-B | P-2 72.0 | S-2/S-1 80/20 | z3 20.0 | N-7 2.0 | B-4 6.0 | — | G-1 | G-4 | A | A |
| Example 9-B | P-13 81.5 | S-1/S-2/S-3 60/30/10 | z22 18.0 | N-6 0.5 | — | — | G-1 | G-4 | A | A |
| Example 10-B | P-2 73.0 | S-2/S-4 70/30 | z4 25.0 | N-1/N-6 (mass ratio 20/80) 2.0 | — | — | G-1 | G-4 | A | A |
| Example 11-B | P-4 61.0 | S-1/S-2 90/10 | z5 30.0 | N-7 3.0 | B-1 6.0 | — | G-1 | G-4 | A | A |
| Example 12-B | P-8 64.0 | S-1/S-3 50/50 | z17 34.0 | N-8 2.0 | — | — | G-1 | G-4 | A | A |
| Example 13-B | P-14 79.9 | S-1/S-2 60/40 | z5 18.0 | N-6 2.0 | — | W-2 0.1 | G-3 | G-5 | A | B |
| Example 14-B | P-6 77.9 | S-1/S-2 60/40 | z34 21.0 | N-14 1.0 | — | W-2 0.1 | G-1 | G-4 | A | A |
| Example 15-B | P-9 92.9 | S-1/S-3 90/10 | z13 5.0 | N-9 2.0 | — | W-1 0.1 | G-1 | G-4 | A | A |
| Example 16-B | P-8 77.4 | S-1/S-2/S-3 70/20/10 | z4 21.0 | N-12 1.5 | — | W-2 0.1 | G-1 | G-4 | A | A |
| Example 17-B | P-10 56.0 | S-2/S-1 80/20 | z3 40.0 | N-11 4.0 | — | — | G-1 | G-4 | A | A |
| Example 18-B | P-17 66.0 | S-1/S-2/S-3 50/40/10 | z5 32.0 | N-3 2.0 | — | — | G-3/G-6 50/50 | G-5 | A | A |
| Example 19-B | P-13 80.0 | S-1/S-3 50/50 | z4/z29 (mass ratio 40/60) 18.0 | N-10 2.0 | — | — | G-1 | G-4 | A | A |
| Example 20-B | P-13 76.4 | S-1/S-2/S-3 50/40/10 | z15 21.0 | N-6 2.5 | — | W-3 0.1 | G-1 | G-4 | A | A |
| Example 21-B | P-9 86.5 | S-2/S-4 90/10 | z28 12.0 | N-5 1.5 | — | — | G-1 | — | A | A |
| Example 22-B | P-15 97.5 | S-1/S-2/S-3 50/30/20 | — | N-8 2.5 | — | — | G-2 | G-4 | A | A |
| Example 23-B | P-18 86.0 | S-1/S-2 80/20 | z28 12.0 | N-10 2.0 | — | — | G-8 | G-5 | A | A |
| Example 24-B | P-19 77.5 | S-1/S-2 80/20 | z28 21.0 | N-6 1.5 | — | — | G-7 | G-5 | A | A |
| Example 25-B | P-16 77.9 | S-1/S-2 80/20 | z5 15.0 | N-5 1.5 | B-2 5.5 | W-4 0.1 | G-3 | G-5 | A | A |
| Example 26-B | P-17 85.5 | S-1/S-2 80/20 | z5 12.0 | N-8 2.5 | — | — | G-3/G-7 50/50 | G-5 | A | A |
| Example 27-B | P-18 73.0 | S-1/S-2/S-3 40/40/20 | z13 25.0 | N-10 2.0 | — | — | G-5/G-6 10/90 | G-5/G-6 50/50 | A | A |
| Example 28-B | P-19 81.5 | S-1/S-2/S-3 40/40/20 | z5 17.0 | N-6 1.5 | — | — | G-6 | G-5 | A | A |
| Example 29-B | P-19 67.0 | S-1/S-2/S-3 40/40/20 | z5 30.0 | N-5 3.0 | — | — | G-2/G-6 50/80 | G-5 | A | A |

TABLE 2-continued

| | Composition of resist | | | | | | | | Collapse performance | |
|---|---|---|---|---|---|---|---|---|---|---|
| | Resin (P1) (% by mass) | Solvent (mass ratio) | Photoacid generator (% by mass) | Basic compound (% by mass) | Hydrophobic resin (% by mass) | Surfactant (% by mass) | Developer (mass ratio) | Rinsing liquid (mass ratio) | Aspect ratio ≤2 | Aspect ratio 2< |
| Example 30-B | P-19 85.5 | S-1/S-2/S-3 40/40/20 | z5 12.0 | N-8 2.5 | — | — | G-3/G-6 20/80 | G-5 | A | A |
| Example 31-B | P-22 70.5 | S-1/S-3/S-4 50/40/10 | z17 22.0 | N-7 3.0 | B-2 4.5 | — | G-1 | G-4 | A | A |
| Example 32-B | P-16 76.9 | S-1/S-2 50/50 | z5 21.0 | N-9 2.0 | — | W-1 0.1 | G-1 | G-4 | A | A |
| Example 33-B | P-21 80.0 | S-1/S-2 50/50 | z23 18.0 | N-10 2.0 | — | — | G-1 | G-4 | A | A |
| Comparative Example 1-B' | P'-2 89.9 | S-1/S-2 80/20 | z35 8.0 | N-9 2.0 | — | W-1 0.1 | G-1 | G-4 | C | C |
| Comparative Example 2-B' | P'-1 77.4 | S-1/S-2/S-3 60/20/20 | z16 20.0 | N-2 2.5 | — | W-3 0.1 | G-1 | — | D | D |
| Comparative Example 3-B' | P'-3 70.5 | S-1/S-2 70/30 | z30 28.0 | N-7 1.5 | — | — | G-1 | G-4 | D | D |
| Comparative Example 4-B' | P'-4 95.9 | S-3/S-4 50/50 | z10 2.0 | N-4 2.0 | — | W-4 0.1 | G-1 | G-4 | D | D |

As shown in the table above, in Examples 1-A to 30-A, and Examples 1-B to 33-B in which a resin having a silicon atom and an aromatic ring group was used, high pattern collapse performance was obtained. Among those, Examples 2-A, 4-A to 14-A, 16-A to 30-A, 2-B, 4-B to 12-B, and 14-B to 33-B in which the repeating unit having a silicon atom used a resin having a silsesquioxane structure, the collapse performance in the pattern at a high aspect ratio (for example, film thickness:line width=2:1 or more) was superior. This is thought to be due to a fact that the glass transition temperature Tg of the resin having a silsesquioxane structure is high, and the diffusion of an acid generated by the exposure can be suppressed.

On the other hand, in Comparative Examples 1-A' to 4-A', and 1-B' to 4-B' in which a resin not having a silicon atom or an aromatic ring group, or the both, the collapse performance of a pattern thus formed was insufficient. Further, the collapse performance in the pattern at a high aspect ratio (for example, film thickness:line width=2:1 or more) was noticeably deteriorated. Among those, in Comparative Examples 3-A' to 4-A' in which a resin not having a silicon atom and an aromatic ring group, it could be seen that pattern collapse performance was deteriorated, as compared with Comparative Examples 1-A' to 2-A' in which a resin having any one of a silicon atom or an aromatic ring group was used. This proves that the silicon atom and the aromatic ring group contribute to pattern collapse performance, and indicates that the resin of the present invention is not satisfied even when it lacks any one of a silicon atom and an aromatic ring group.

In addition, it is needless to say that these resist compositions in which resins having a silicon atom and an aromatic ring group were used, used in Examples 1-A to 30-A, and Examples 1-B to 33-B, have high dry etching resistance, as known as a general discovery. Improvement of the pattern collapse performance naturally leads to improvement of critical resolution.

According to the present invention, it is possible to provide a resist composition capable of forming a pattern having excellent pattern collapse performance, particularly in the formation of an ultrafine pattern (for example, a pattern with a line width of 50 nm or less), as well as a resist film, a pattern forming method, and a method for manufacturing an electronic device, each using the resist composition.

Although the present invention has been described in detail and with reference to specific embodiments, it is obvious to those skilled in the art that various changes or modifications can be made without departing from the spirit and scope of the present invention.

What is claimed is:

1. A resist composition comprising:
   a resin (A) having a repeating unit (a) having an aromatic ring group, a repeating unit (b) having a silicon atom in a side chain, and a repeating unit (c) having a structure in which a polar group is protected with a leaving group capable of decomposing by an action of an acid to leave,
   wherein the repeating unit (c) is a repeating unit represented by General Formula (AII),

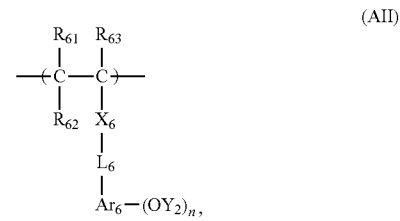

and, in the General Formula (AII),
   $R_{61}$, $R_{62}$, and $R_{63}$ each independently represent a hydrogen atom, an alkyl group, a cycloalkyl group, a halogen atom, a cyano group, or an alkoxycarbonyl group, provided that $R_{62}$ may be bonded to $Ar_6$ to form a ring, and $R_{62}$ in such a case represents a single bond or an alkylene group,
   $X_6$ represents a single bond, —COO—, or —CONR$_{64}$—, and $R_{64}$ represents a hydrogen atom or an alkyl group,
   $L_6$ represents a single bond or an alkylene group, $Ar_6$ represents an (n+1)-valent aromatic ring group, and in a case where $Ar_6$ is bonded with $R_{62}$ to form a ring, it represents an (n+2)-valent aromatic ring group, in a case of n≥2, $Y_2$'s each independently represent a hydrogen atom or a group capable of leaving by the action of an acid, provided that at least one of $Y_2$'s represents a group capable of leaving by the action of an acid, n represents an integer of 1 to 4, and the group capable of leaving by the action of an acid as at least one of $Y_2$'s in General Formula (AII) is a structure represented by General Formula (Y3-1),

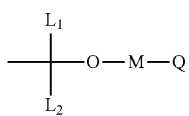

(Y3-1)

in which $L_1$ represents a hydrogen atom, an alkyl group, a cycloalkyl group, an aryl group, or a group obtained by combining an alkylene group and an aryl group, and $L_2$ represents a secondary or tertiary alkyl group, M represents a single bond or a divalent linking group, and Q represents an alkyl group, a cycloalkyl group which may include a heteroatom, an aryl group which may include a heteroatom, an amino group, an ammonium group, a mercapto group, a cyano group, or an aldehyde group.

2. The resist composition according to claim 1, wherein the repeating unit (b) is a repeating unit not having a structure in which a polar group is protected with a leaving group capable of decomposing by an action of an acid to leave.

3. The resist composition according to claim 1, wherein the repeating unit (b) is a repeating unit having a group containing a silsesquioxane structure.

4. The resist composition according to claim 1, further comprising a crosslinking agent (C).

5. A resist film formed by the resist composition according to claim 1.

6. A pattern forming method comprising:
irradiating the resist film according to claim 5 with actinic rays or radiation; and
developing the film irradiated with actinic rays or radiation.

7. The pattern forming method according to claim 6, wherein a positive tone pattern is formed.

8. The pattern forming method according to claim 6, wherein a negative tone pattern is formed.

9. The pattern forming method according to claim 6, wherein the actinic rays or radiation are electron beams or extreme ultraviolet rays.

10. A method for manufacturing an electronic device, comprising the pattern forming method according to claim 6.

* * * * *